(12) United States Patent
Goutain et al.

(10) Patent No.: US 12,152,742 B2
(45) Date of Patent: Nov. 26, 2024

(54) LASER-BASED LIGHT GUIDE-COUPLED WIDE-SPECTRUM LIGHT SYSTEM

(71) Applicant: KYOCERA SLD Laser, Inc., Goleta, CA (US)

(72) Inventors: Eric Goutain, Fremont, CA (US); Terry Towe, Tucson, AZ (US); Naji Barakat, Tucson, AZ (US); Sten Heikman, Goleta, CA (US); Oscar Romero, Goleta, CA (US); Raymond Ong, Goleta, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 0 days.

(21) Appl. No.: 17/839,135

(22) Filed: Jun. 13, 2022

(65) Prior Publication Data

US 2022/0333745 A1    Oct. 20, 2022

Related U.S. Application Data

(63) Continuation-in-part of application No. 16/597,791, filed on Oct. 9, 2019, which is a continuation-in-part
(Continued)

(51) Int. Cl.
*F21K 9/64*    (2016.01)
*F21K 9/61*    (2016.01)
(Continued)

(52) U.S. Cl.
CPC .............. *F21K 9/64* (2016.08); *F21K 9/61* (2016.08); *F21K 9/69* (2016.08); *G02B 6/0006* (2013.01); *G02B 6/0008* (2013.01)

(58) Field of Classification Search
CPC .... G02B 6/0006; G02B 6/0008; G02B 6/001; G02B 6/0028; G02B 6/0031; G02B 6/40;
(Continued)

(56) References Cited

U.S. PATENT DOCUMENTS 3,829,675 A    8/1974 Mariani
4,152,752 A    5/1979 Niemi
(Continued)

FOREIGN PATENT DOCUMENTS

CN    1452254    10/2003
CN    1538534    10/2004
(Continued)

OTHER PUBLICATIONS

Machine translation of WO 2019 086176 A1, retrieved from worldwide. espacenet.com. (Year: 2019).*
(Continued)

*Primary Examiner* — Abdulmajeed Aziz
*Assistant Examiner* — Steven Y Horikoshi
(74) *Attorney, Agent, or Firm* — Kilpatrick Townsend & Stockton LLP

(57) ABSTRACT

A laser-based fiber-coupled wide-spectrum light system is provided. The system includes a laser device and one or more phosphor members configured and arranged to provide wide-spectrum emissions. One or more fibers are configured and arranged to receive the wide-spectrum emissions.

6 Claims, 37 Drawing Sheets

Related U.S. Application Data of application No. 16/380,217, filed on Apr. 10, 2019, now Pat. No. 12,000,552, which is a continuation-in-part of application No. 16/252,570, filed on Jan. 18, 2019, now Pat. No. 11,884,202.

(51) Int. Cl.
*F21K 9/69* (2016.01)
*F21V 8/00* (2006.01)

(58) Field of Classification Search
CPC ....... G02B 6/4206; G02B 6/4298; F21K 9/61; F21S 43/237; F21S 43/245; F21S 41/176; F21S 11/00; F21S 11/007; F21S 2/00; F21S 2/005; F21S 19/005; H01L 33/0045; H01S 5/0087
See application file for complete search history.

(56) References Cited

U.S. PATENT DOCUMENTS

| | | |
|---|---|---|
| 4,234,907 A | 11/1980 | Daniel |
| 4,318,058 A | 3/1982 | Mito et al. |
| 4,341,592 A | 7/1982 | Shortes et al. |
| 4,523,806 A | 6/1985 | Kojima et al. |
| 4,535,394 A | 8/1985 | Dugre |
| 4,747,648 A | 5/1988 | Gilliland, III |
| 4,763,975 A | 8/1988 | Scifres et al. |
| 4,772,093 A | 9/1988 | Abele et al. |
| 4,777,571 A | 10/1988 | Morgan |
| 4,860,687 A | 8/1989 | Frijlink |
| 4,878,161 A | 10/1989 | Nakata |
| 4,911,102 A | 3/1990 | Manabe et al. |
| 4,915,745 A | 4/1990 | Pollock et al. |
| 5,184,882 A | 2/1993 | Davenport et al. |
| 5,208,307 A | 5/1993 | Doi et al. |
| 5,297,227 A | 3/1994 | Brown et al. |
| 5,301,090 A | 4/1994 | Hed |
| 5,331,654 A | 7/1994 | Jewell et al. |
| 5,334,277 A | 8/1994 | Nakamura |
| 5,353,294 A | 10/1994 | Shigeno |
| 5,366,953 A | 11/1994 | Char et al. |
| 5,527,417 A | 6/1996 | Iida et al. |
| 5,535,230 A | 7/1996 | Abe |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,724,464 A | 3/1998 | Kozuka |
| 5,760,484 A | 6/1998 | Lee et al. |
| 5,821,555 A | 10/1998 | Saito et al. |
| 5,888,907 A | 3/1999 | Tomoyasu et al. |
| 5,890,796 A | 4/1999 | Marinelli et al. |
| 5,901,267 A | 5/1999 | Lee |
| 5,926,493 A | 7/1999 | O'Brien et al. |
| 5,951,923 A | 9/1999 | Horie et al. |
| 5,982,969 A | 11/1999 | Sugiyama et al. |
| 6,065,882 A | 5/2000 | Roller et al. |
| 6,069,394 A | 5/2000 | Hashimoto et al. |
| 6,072,197 A | 6/2000 | Horino et al. |
| 6,129,900 A | 10/2000 | Satoh et al. |
| 6,147,953 A | 11/2000 | Duncan |
| 6,153,010 A | 11/2000 | Kiyoku et al. |
| 6,188,495 B1 | 2/2001 | Inoue et al. |
| 6,195,381 B1 | 2/2001 | Botez et al. |
| 6,234,640 B1 * | 5/2001 | Belfer .................. G02B 6/0008 362/308 |
| 6,239,454 B1 | 5/2001 | Glew et al. |
| 6,273,948 B1 | 8/2001 | Porowski et al. |
| 6,283,597 B1 | 9/2001 | Jorke |
| 6,296,383 B1 | 10/2001 | Henningsen |
| 6,303,405 B1 | 10/2001 | Yoshida et al. |
| 6,335,923 B2 | 1/2002 | Kubo et al. |
| 6,379,985 B1 | 4/2002 | Cervantes et al. |
| 6,398,867 B1 | 6/2002 | D'Evelyn et al. |
| 6,406,540 B1 | 6/2002 | Harris et al. |
| 6,451,157 B1 | 9/2002 | Hubacek |
| 6,489,636 B1 | 12/2002 | Goetz et al. |
| 6,547,249 B2 | 4/2003 | Collins, III et al. |
| 6,567,574 B1 | 5/2003 | Ma et al. |
| 6,586,762 B2 | 7/2003 | Kozaki |
| 6,596,079 B1 | 7/2003 | Vaudo et al. |
| 6,631,150 B1 | 10/2003 | Najda |
| 6,635,904 B2 | 10/2003 | Goetz et al. |
| 6,639,925 B2 | 10/2003 | Niwa et al. |
| 6,656,615 B2 | 12/2003 | Dwilinski et al. |
| 6,680,959 B2 | 1/2004 | Tanabe et al. |
| 6,681,064 B2 | 1/2004 | Naniwae |
| 6,686,608 B1 | 2/2004 | Takahira |
| 6,734,461 B1 | 5/2004 | Shiomi et al. |
| 6,755,932 B2 | 6/2004 | Masuda et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,791,103 B2 | 9/2004 | Nakamura et al. |
| 6,809,781 B2 | 10/2004 | Setlur et al. |
| 6,814,811 B2 | 11/2004 | Ose |
| 6,833,564 B2 | 12/2004 | Shen et al. |
| 6,854,869 B1 | 2/2005 | Fernandez |
| 6,858,081 B2 | 2/2005 | Biwa et al. |
| 6,858,882 B2 | 2/2005 | Tsuda et al. |
| 6,861,130 B2 | 3/2005 | D'Evelyn et al. |
| 6,920,166 B2 | 7/2005 | Akasaka et al. |
| 6,969,348 B2 | 11/2005 | Araii |
| 7,001,577 B2 | 2/2006 | Zimmerman et al. |
| 7,009,199 B2 | 3/2006 | Hall |
| 7,019,325 B2 | 3/2006 | Li et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,119,487 B2 | 10/2006 | Ikeda |
| 7,125,453 B2 | 10/2006 | D'Evelyn et al. |
| 7,128,849 B2 | 10/2006 | Setlur et al. |
| 7,135,348 B2 | 11/2006 | Okuyama et al. |
| 7,141,829 B2 | 11/2006 | Takahashi |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,177,069 B2 | 2/2007 | Spath et al. |
| 7,198,671 B2 | 4/2007 | Ueda |
| 7,200,127 B1 | 4/2007 | Lee et al. |
| 7,206,133 B2 | 4/2007 | Cassarly et al. |
| 7,220,324 B2 | 5/2007 | Baker et al. |
| 7,252,712 B2 | 8/2007 | Dwilinski et al. |
| 7,303,630 B2 | 12/2007 | Motoki et al. |
| 7,312,156 B2 | 12/2007 | Granneman et al. |
| 7,316,746 B2 | 1/2008 | D'Evelyn et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,368,015 B2 | 5/2008 | D'Evelyn et al. |
| 7,381,391 B2 | 6/2008 | Spencer et al. |
| 7,390,359 B2 | 6/2008 | Miyanaga et al. |
| 7,420,261 B2 | 9/2008 | Dwilinski et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,569,206 B2 | 8/2009 | Spencer et al. |
| 7,598,104 B2 | 10/2009 | Teng et al. |
| 7,625,446 B2 | 12/2009 | D'Evelyn et al. |
| 7,642,122 B2 | 1/2010 | Tysoe et al. |
| 7,667,238 B2 | 2/2010 | Erchak et al. |
| 7,681,347 B1 | 3/2010 | Welker et al. |
| 7,691,658 B2 | 4/2010 | Kaeding et al. |

(56) References Cited

U.S. PATENT DOCUMENTS

| | | |
|---|---|---|
| 7,702,354 B2 | 4/2010 | Kawasaki |
| 7,704,324 B2 | 4/2010 | D'Evelyn et al. |
| 7,705,276 B2 | 4/2010 | Giddings et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,759,710 B1 | 7/2010 | Chiu et al. |
| 7,806,078 B2 | 10/2010 | Yoshida |
| 7,842,958 B1 | 11/2010 | Sekine et al. |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 7,976,630 B2 | 7/2011 | Poblenz et al. |
| 8,017,932 B2 | 9/2011 | Okamoto et al. |
| 8,021,481 B2 | 9/2011 | D'Evelyn |
| 8,044,412 B2 | 10/2011 | Murphy et al. |
| 8,048,225 B2 | 11/2011 | Poblenz et al. |
| 8,097,081 B2 | 1/2012 | D'Evelyn |
| 8,124,996 B2 | 2/2012 | Raring et al. |
| 8,126,024 B1 | 2/2012 | Raring |
| 8,143,148 B1 | 3/2012 | Raring et al. |
| 8,148,801 B2 | 4/2012 | D'Evelyn |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,278,656 B2 | 10/2012 | Mattmann et al. |
| 8,284,810 B1 | 10/2012 | Sharma et al. |
| 8,294,179 B1 | 10/2012 | Raring |
| 8,303,710 B2 | 11/2012 | D'Evelyn |
| 8,306,081 B1 | 11/2012 | Schmidt et al. |
| 8,314,429 B1 | 11/2012 | Raring et al. |
| 8,316,435 B1 | 11/2012 | Varadhan et al. |
| 8,323,405 B2 | 12/2012 | D'Evelyn |
| 8,329,511 B2 | 12/2012 | D'Evelyn |
| 8,351,478 B2 | 1/2013 | Raring et al. |
| 8,354,679 B1 | 1/2013 | D'Evelyn et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,451,876 B1 | 5/2013 | Raring et al. |
| 8,461,071 B2 | 6/2013 | D'Evelyn |
| 8,465,588 B2 | 6/2013 | Poblenz et al. |
| 8,494,017 B2 | 7/2013 | Sharma et al. |
| 8,509,275 B1 | 8/2013 | Raring et al. |
| 8,510,979 B1 | 8/2013 | Mortimer |
| 8,582,038 B1 | 11/2013 | Raring et al. |
| 8,591,062 B2 | 11/2013 | Hussell et al. |
| 8,593,980 B2 | 11/2013 | Bae et al. |
| 8,634,442 B1 | 1/2014 | Raring et al. |
| D704,881 S | 5/2014 | Johnson |
| 8,717,505 B1 | 5/2014 | Raring et al. |
| 8,728,842 B2 | 5/2014 | Raring et al. |
| 8,729,559 B2 | 5/2014 | Krames et al. |
| 8,730,410 B1 | 5/2014 | Raring et al. |
| 8,749,719 B2 | 6/2014 | Raring et al. |
| 8,773,598 B2 | 7/2014 | Raring et al. |
| 8,837,546 B1 | 9/2014 | Raring et al. |
| 8,847,249 B2 | 9/2014 | Raring et al. |
| 8,869,672 B2 | 10/2014 | Smith |
| 8,878,230 B2 | 11/2014 | D'Evelyn |
| 8,908,731 B1 | 12/2014 | Raring et al. |
| 8,975,615 B2 | 3/2015 | Felker et al. |
| 8,979,999 B2 | 3/2015 | D'Evelyn |
| 9,013,638 B2 | 4/2015 | Raring et al. |
| 9,014,229 B1 | 4/2015 | Raring et al. |
| 9,019,437 B2 | 4/2015 | Raring et al. |
| 9,025,635 B2 | 5/2015 | Goutain et al. |
| 9,048,170 B2 | 6/2015 | Pfister et al. |
| 9,071,772 B2 | 6/2015 | Raring et al. |
| 9,100,590 B2 | 8/2015 | Raring et al. |
| 9,239,427 B1 | 1/2016 | Raring |
| 9,250,044 B1 | 2/2016 | Raring et al. |
| 9,318,875 B1 | 4/2016 | Goutain |
| 9,362,715 B2 | 6/2016 | Sztein et al. |
| 9,531,164 B2 | 12/2016 | Raring et al. |
| 9,543,738 B2 | 1/2017 | Raring et al. |
| 9,595,813 B2 | 3/2017 | Raring et al. |
| 9,714,749 B1 | 7/2017 | Salter et al. |
| 9,800,017 B1 | 10/2017 | Raring et al. |
| 9,829,778 B2 | 11/2017 | Raring et al. |
| 9,829,780 B2 | 11/2017 | Raring et al. |
| 10,084,281 B1 | 9/2018 | Raring et al. |
| 10,108,079 B2 | 10/2018 | Raring et al. |
| 10,205,300 B1 | 2/2019 | Raring et al. |
| 10,222,529 B1* | 3/2019 | Cohoon ................ G02B 6/001 |
| 10,297,977 B1 | 5/2019 | Raring et al. |
| 10,551,542 B1 | 2/2020 | Tan et al. |
| 10,732,340 B2 | 8/2020 | Schubert et al. |
| 10,879,673 B2 | 12/2020 | Raring et al. |
| 10,904,506 B1 | 1/2021 | Raring et al. |
| 10,938,182 B2 | 3/2021 | Raring et al. |
| 11,016,378 B2 | 5/2021 | Raring et al. |
| 11,088,507 B1 | 8/2021 | Raring et al. |
| 11,101,618 B1 | 8/2021 | Raring et al. |
| 11,239,637 B2 | 2/2022 | Romero et al. |
| 11,421,843 B2 | 8/2022 | Harrison et al. |
| 11,437,774 B2 | 9/2022 | Rudy et al. |
| 2001/0011935 A1 | 8/2001 | Lee et al. |
| 2001/0026991 A1 | 10/2001 | Ichikawa et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0050517 A1 | 5/2002 | Olivia |
| 2002/0085603 A1 | 7/2002 | Okumura |
| 2002/0105986 A1 | 8/2002 | Yamasaki |
| 2002/0159741 A1 | 10/2002 | Graves et al. |
| 2002/0171092 A1 | 11/2002 | Goetz et al. |
| 2002/0189532 A1 | 12/2002 | Motoki et al. |
| 2002/0196953 A1 | 12/2002 | Burke |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0027014 A1 | 2/2003 | Johnson et al. |
| 2003/0063476 A1 | 4/2003 | English et al. |
| 2003/0094893 A1 | 5/2003 | Ellens et al. |
| 2003/0129810 A1 | 7/2003 | Barth et al. |
| 2003/0140845 A1 | 7/2003 | D'Evelyn et al. |
| 2003/0140846 A1 | 7/2003 | Biwa et al. |
| 2003/0145784 A1 | 8/2003 | Thompson et al. |
| 2003/0147259 A1 | 8/2003 | Kraft |
| 2003/0147261 A1 | 8/2003 | Babbitt et al. |
| 2003/0178617 A1 | 9/2003 | Appenzeller et al. |
| 2003/0183155 A1 | 10/2003 | D'Evelyn et al. |
| 2003/0200931 A1 | 10/2003 | Goodwin |
| 2003/0209191 A1 | 11/2003 | Purdy |
| 2003/0216011 A1 | 11/2003 | Nakamura et al. |
| 2003/0232512 A1 | 12/2003 | Dickinson et al. |
| 2004/0000266 A1 | 1/2004 | D'Evelyn et al. |
| 2004/0012027 A1 | 1/2004 | Keller et al. |
| 2004/0023427 A1 | 2/2004 | Chua et al. |
| 2004/0025787 A1 | 2/2004 | Selbrede et al. |
| 2004/0031978 A1 | 2/2004 | D'Evelyn et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0105481 A1 | 6/2004 | Ishida et al. |
| 2004/0112866 A1 | 6/2004 | Maleville et al. |
| 2004/0113141 A1 | 6/2004 | Isuda et al. |
| 2004/0137265 A1 | 7/2004 | Shimada et al. |
| 2004/0146264 A1 | 7/2004 | Auner et al. |
| 2004/0149998 A1 | 8/2004 | Henson et al. |
| 2004/0151222 A1 | 8/2004 | Sekine |
| 2004/0179777 A1 | 9/2004 | Buelow et al. |
| 2004/0196877 A1 | 10/2004 | Kawakami et al. |

(56) References Cited

U.S. PATENT DOCUMENTS

| | | |
|---|---|---|
| 2004/0213016 A1 | 10/2004 | Rice |
| 2004/0213317 A1 | 10/2004 | Hashimoto et al. |
| 2004/0222357 A1 | 11/2004 | King et al. |
| 2004/0233950 A1 | 11/2004 | Furukawa et al. |
| 2004/0245535 A1 | 12/2004 | D'Evelyn et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2004/0263074 A1 | 12/2004 | Baroky et al. |
| 2005/0040384 A1 | 2/2005 | Tanaka et al. |
| 2005/0041433 A1 | 2/2005 | Sayers |
| 2005/0072986 A1 | 4/2005 | Sasaoka |
| 2005/0098095 A1 | 5/2005 | D'Evelyn et al. |
| 2005/0105572 A1 | 5/2005 | Simoun-Ou et al. |
| 2005/0128469 A1 | 6/2005 | Hall et al. |
| 2005/0152820 A1 | 7/2005 | D'Evelyn et al. |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0205215 A1 | 9/2005 | Giddings et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0231973 A1 | 10/2005 | Cassarly et al. |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0030738 A1 | 2/2006 | Vanmaele et al. |
| 2006/0032428 A1 | 2/2006 | Dwilinski et al. |
| 2006/0033009 A1 | 2/2006 | Kobayashi et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0049421 A1 | 3/2006 | Suehiro et al. |
| 2006/0056855 A1 | 3/2006 | Nakagawa et al. |
| 2006/0060131 A1 | 3/2006 | Atanackovic |
| 2006/0060833 A1 | 3/2006 | Bruckner et al. |
| 2006/0066319 A1 | 3/2006 | Dallenbach et al. |
| 2006/0077795 A1 | 4/2006 | Kitahara et al. |
| 2006/0078009 A1 | 4/2006 | Katayama et al. |
| 2006/0078022 A1 | 4/2006 | Kozaki et al. |
| 2006/0078024 A1 | 4/2006 | Matsumura et al. |
| 2006/0079082 A1 | 4/2006 | Bruhns et al. |
| 2006/0086319 A1 | 4/2006 | Kasai et al. |
| 2006/0087864 A1 | 4/2006 | Peng et al. |
| 2006/0096521 A1 | 5/2006 | D'Evelyn et al. |
| 2006/0110926 A1 | 5/2006 | Hu et al. |
| 2006/0113553 A1 | 6/2006 | Srivastava et al. |
| 2006/0118799 A1 | 6/2006 | D'Evelyn et al. |
| 2006/0124051 A1 | 6/2006 | Yoshioka et al. |
| 2006/0126688 A1 | 6/2006 | Kneissl |
| 2006/0138431 A1 | 6/2006 | Dwilinski et al. |
| 2006/0139926 A1 | 6/2006 | Morioka et al. |
| 2006/0144334 A1 | 7/2006 | Yim et al. |
| 2006/0175624 A1 | 8/2006 | Sharma et al. |
| 2006/0177362 A1 | 8/2006 | D'Evelyn et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0207497 A1 | 9/2006 | D'Evelyn et al. |
| 2006/0213429 A1 | 9/2006 | Motoki et al. |
| 2006/0215127 A1 | 9/2006 | Peterson |
| 2006/0216416 A1 | 9/2006 | Sumakeris et al. |
| 2006/0221021 A1 | 10/2006 | Hajjar et al. |
| 2006/0256482 A1 | 11/2006 | Araki et al. |
| 2006/0256559 A1 | 11/2006 | Bitar |
| 2006/0262243 A1 | 11/2006 | Lester et al. |
| 2006/0279662 A1 | 12/2006 | Kapellner et al. |
| 2006/0288928 A1 | 12/2006 | Eom et al. |
| 2007/0012940 A1 | 1/2007 | Suh et al. |
| 2007/0029571 A1 | 2/2007 | Hanaoka et al. |
| 2007/0036186 A1 | 2/2007 | Corzine et al. |
| 2007/0039226 A1 | 2/2007 | Stokes |
| 2007/0057337 A1 | 3/2007 | Kano et al. |
| 2007/0081857 A1 | 4/2007 | Yoon |
| 2007/0086916 A1 | 4/2007 | LeBoeuf et al. |
| 2007/0091634 A1 | 4/2007 | Sakurada |
| 2007/0093073 A1 | 4/2007 | Farrell, Jr. et al. |
| 2007/0101932 A1 | 5/2007 | Schowalter et al. |
| 2007/0105351 A1 | 5/2007 | Motoki et al. |
| 2007/0109463 A1 | 5/2007 | Hutchins |
| 2007/0109504 A1 | 5/2007 | Miyazawa |
| 2007/0110112 A1 | 5/2007 | Sugiura |
| 2007/0120141 A1 | 5/2007 | Moustakas et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0153866 A1 | 7/2007 | Shchegrov et al. |
| 2007/0158785 A1 | 7/2007 | D'Evelyn et al. |
| 2007/0163490 A1 | 7/2007 | Habel et al. |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0184637 A1 | 8/2007 | Haskell et al. |
| 2007/0190758 A1 | 8/2007 | Kaeding et al. |
| 2007/0197004 A1 | 8/2007 | Dadgar et al. |
| 2007/0201234 A1 | 8/2007 | Ottermann |
| 2007/0210074 A1 | 9/2007 | Maurer et al. |
| 2007/0210324 A1 | 9/2007 | Kawaguchi et al. |
| 2007/0215033 A1 | 9/2007 | Imaeda et al. |
| 2007/0215887 A1 | 9/2007 | D'Evelyn et al. |
| 2007/0217462 A1 | 9/2007 | Yamasaki |
| 2007/0218703 A1 | 9/2007 | Kaeding et al. |
| 2007/0228262 A1 | 10/2007 | Cantin et al. |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0274359 A1 | 11/2007 | Takeuchi et al. |
| 2007/0280320 A1 | 12/2007 | Feezell et al. |
| 2008/0006831 A1 | 1/2008 | Ng |
| 2008/0025360 A1 | 1/2008 | Eichler et al. |
| 2008/0029152 A1 | 2/2008 | Milshtein et al. |
| 2008/0049440 A1 | 2/2008 | Gaydoul |
| 2008/0054280 A1 | 3/2008 | Reginelli et al. |
| 2008/0068845 A1 | 3/2008 | Aida et al. |
| 2008/0083741 A1 | 4/2008 | Giddings |
| 2008/0083970 A1 | 4/2008 | Kamber et al. |
| 2008/0087919 A1 | 4/2008 | Tysoe et al. |
| 2008/0089089 A1 | 4/2008 | Hama et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0142779 A1 | 6/2008 | Yang et al. |
| 2008/0143970 A1 | 6/2008 | Harbers et al. |
| 2008/0149949 A1 | 6/2008 | Nakamura et al. |
| 2008/0149959 A1 | 6/2008 | Nakamura et al. |
| 2008/0156254 A1 | 7/2008 | Dwilinski et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0192458 A1 | 8/2008 | Li |
| 2008/0193363 A1 | 8/2008 | Tsuji |
| 2008/0198881 A1 | 8/2008 | Farrell et al. |
| 2008/0205477 A1 | 8/2008 | Hama et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0251020 A1 | 10/2008 | Franken et al. |
| 2008/0259431 A1 | 10/2008 | Weichmann et al. |
| 2008/0262316 A1* | 10/2008 | Ajima ............... A61B 1/0669 359/326 |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |

(56) References Cited

U.S. PATENT DOCUMENTS

| | | |
|---|---|---|
| 2008/0308815 A1 | 12/2008 | Kasai et al. |
| 2008/0310182 A1 | 12/2008 | Meinl |
| 2008/0315179 A1 | 12/2008 | Kim et al. |
| 2009/0003400 A1 | 1/2009 | Nagahama et al. |
| 2009/0021723 A1 | 1/2009 | De Lega |
| 2009/0028204 A1 | 1/2009 | Hiroyama et al. |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0086170 A1 | 4/2009 | El-Ghoroury et al. |
| 2009/0086475 A1 | 4/2009 | Caruso et al. |
| 2009/0092536 A1 | 4/2009 | Kawabata et al. |
| 2009/0095973 A1 | 4/2009 | Tanaka et al. |
| 2009/0103581 A1 | 4/2009 | Bessho |
| 2009/0141242 A1 | 6/2009 | Silverstein et al. |
| 2009/0141765 A1 | 6/2009 | Kohda et al. |
| 2009/0153752 A1 | 6/2009 | Silverstein |
| 2009/0157229 A1 | 6/2009 | Rulkens et al. |
| 2009/0159869 A1 | 6/2009 | Ponce et al. |
| 2009/0166668 A1 | 7/2009 | Shakuda |
| 2009/0170224 A1 | 7/2009 | Urashima |
| 2009/0173957 A1 | 7/2009 | Brunner et al. |
| 2009/0218593 A1 | 9/2009 | Kamikawa et al. |
| 2009/0229519 A1 | 9/2009 | Saitoh |
| 2009/0238227 A1 | 9/2009 | Kubota et al. |
| 2009/0250686 A1 | 10/2009 | Sato et al. |
| 2009/0252191 A1 | 10/2009 | Kubota et al. |
| 2009/0267100 A1 | 10/2009 | Miyake et al. |
| 2009/0273005 A1 | 11/2009 | Lin |
| 2009/0296018 A1 | 12/2009 | Harle et al. |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0320745 A1 | 12/2009 | D'Evelyn et al. |
| 2009/0321771 A1 | 12/2009 | Hattori et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0006546 A1 | 1/2010 | Young et al. |
| 2010/0006873 A1 | 1/2010 | Raring et al. |
| 2010/0006875 A1 | 1/2010 | Naum et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0044718 A1 | 2/2010 | Hanser et al. |
| 2010/0046234 A1 | 2/2010 | Abu-Ageel |
| 2010/0075175 A1 | 3/2010 | Poblenz et al. |
| 2010/0080001 A1 | 4/2010 | Kunoh et al. |
| 2010/0091515 A1 | 4/2010 | Goto et al. |
| 2010/0096615 A1 | 4/2010 | Okamoto et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0140745 A1 | 6/2010 | Khan et al. |
| 2010/0147210 A1 | 6/2010 | D'Evelyn |
| 2010/0149222 A1 | 6/2010 | Welford et al. |
| 2010/0151194 A1 | 6/2010 | D'Evelyn |
| 2010/0165306 A1 | 7/2010 | McGettigan et al. |
| 2010/0187550 A1 | 7/2010 | Reed et al. |
| 2010/0189981 A1 | 7/2010 | Poblenz et al. |
| 2010/0195687 A1 | 8/2010 | Okamoto et al. |
| 2010/0220262 A1 | 9/2010 | DeMille et al. |
| 2010/0246159 A1 | 9/2010 | Wada |
| 2010/0246628 A1 | 9/2010 | Hattori et al. |
| 2010/0276663 A1 | 11/2010 | Enya et al. |
| 2010/0290498 A1 | 11/2010 | Hata et al. |
| 2010/0295054 A1 | 11/2010 | Okamoto et al. |
| 2010/0295438 A1 | 11/2010 | Ott et al. |
| 2010/0302464 A1 | 12/2010 | Raring et al. |
| 2010/0304874 A1 | 12/2010 | Abatemarco |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0001431 A1 | 1/2011 | Brukilacchio |
| 2011/0031508 A1 | 2/2011 | Hamaguchi et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0062415 A1 | 3/2011 | Ohta et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0122627 A1 | 5/2011 | Hikmet al. |
| 2011/0122646 A1 | 5/2011 | Bickham |
| 2011/0122927 A1 | 5/2011 | Wang |
| 2011/0129669 A1 | 6/2011 | Fujito et al. |
| 2011/0133489 A1 | 6/2011 | Hemeury et al. |
| 2011/0148280 A1 | 6/2011 | Kishimoto et al. |
| 2011/0150020 A1 | 6/2011 | Haase et al. |
| 2011/0164637 A1 | 7/2011 | Yoshizumi et al. |
| 2011/0164646 A1 | 7/2011 | Maeda et al. |
| 2011/0170569 A1 | 7/2011 | Tyagi et al. |
| 2011/0180781 A1 | 7/2011 | Raring et al. |
| 2011/0182056 A1 | 7/2011 | Trottier et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0204408 A1 | 8/2011 | McKenzie et al. |
| 2011/0215700 A1 | 9/2011 | Tong et al. |
| 2011/0216795 A1 | 9/2011 | Hsu et al. |
| 2011/0220912 A1 | 9/2011 | D'Evelyn |
| 2011/0220926 A1 | 9/2011 | Kim |
| 2011/0247556 A1 | 10/2011 | Raring et al. |
| 2011/0256693 A1 | 10/2011 | D'Evelyn et al. |
| 2011/0262773 A1 | 10/2011 | Poblenz et al. |
| 2011/0273889 A1 | 11/2011 | Boomgaarden et al. |
| 2011/0280032 A1 | 11/2011 | Kishimoto |
| 2011/0281422 A1 | 11/2011 | Wang et al. |
| 2011/0286200 A1 | 11/2011 | Iimura et al. |
| 2011/0286484 A1 | 11/2011 | Raring et al. |
| 2011/0305000 A1 | 12/2011 | Bukesov et al. |
| 2012/0000415 A1 | 1/2012 | D'Evelyn et al. |
| 2012/0039072 A1 | 2/2012 | Lell et al. |
| 2012/0051377 A1 | 3/2012 | Liang et al. |
| 2012/0073494 A1 | 3/2012 | D'Evelyn |
| 2012/0091465 A1 | 4/2012 | Krames et al. |
| 2012/0104359 A1 | 5/2012 | Felker et al. |
| 2012/0106178 A1 | 5/2012 | Takahashi et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0170602 A1 | 7/2012 | Hikmet et al. |
| 2012/0178198 A1 | 7/2012 | Raring et al. |
| 2012/0187371 A1 | 7/2012 | Raring et al. |
| 2012/0199952 A1 | 8/2012 | D'Evelyn et al. |
| 2012/0205825 A1 | 8/2012 | Nagafuji et al. |
| 2012/0224374 A1 | 9/2012 | Aliberti |
| 2012/0224384 A1 | 9/2012 | Takahira et al. |
| 2012/0230007 A1 | 9/2012 | Kawakami |
| 2012/0242912 A1 | 9/2012 | Kitano |
| 2012/0243203 A1 | 9/2012 | Koike et al. |
| 2012/0248483 A1 | 10/2012 | Beppu et al. |
| 2012/0275178 A1 | 11/2012 | Logunov |
| 2012/0314398 A1 | 12/2012 | Raring et al. |
| 2013/0001627 A1 | 1/2013 | Kinoshita et al. |
| 2013/0003403 A1 | 1/2013 | Takahira et al. |
| 2013/0010456 A1 | 1/2013 | Ishii et al. |

(56) References Cited

U.S. PATENT DOCUMENTS

| | | |
|---|---|---|
| 2013/0016750 A1 | 1/2013 | Raring et al. |
| 2013/0019277 A1 | 1/2013 | Chang et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2013/0088888 A1 | 4/2013 | Fewkes et al. |
| 2013/0119401 A1 | 5/2013 | D'Evelyn et al. |
| 2013/0131331 A1 | 5/2013 | Takagi et al. |
| 2013/0155418 A1 | 6/2013 | Shaw et al. |
| 2013/0176705 A1 | 7/2013 | Ohta |
| 2013/0194821 A1 | 8/2013 | Maxik et al. |
| 2013/0201670 A1 | 8/2013 | Pickard et al. |
| 2013/0207148 A1 | 8/2013 | Krauter et al. |
| 2013/0208442 A1 | 8/2013 | Reiherzer |
| 2013/0229820 A1 | 9/2013 | Jutila et al. |
| 2013/0234111 A1 | 9/2013 | Pfister et al. |
| 2013/0301288 A1 | 11/2013 | Kishimoto et al. |
| 2013/0314613 A1 | 11/2013 | Raring et al. |
| 2013/0314614 A1 | 11/2013 | Raring et al. |
| 2013/0314937 A1 | 11/2013 | Takahashi et al. |
| 2014/0050244 A1 | 2/2014 | Ohno et al. |
| 2014/0063837 A1 | 3/2014 | Rowletter, Jr. |
| 2014/0063848 A1 | 3/2014 | Zheng et al. |
| 2014/0078764 A1 | 3/2014 | Aizawa |
| 2014/0079088 A1 | 3/2014 | Joseph |
| 2014/0086539 A1 | 3/2014 | Goutain et al. |
| 2014/0168942 A1 | 6/2014 | Kishimoto et al. |
| 2014/0226079 A1 | 8/2014 | Raring et al. |
| 2014/0247619 A1 | 9/2014 | Bennett et al. |
| 2014/0253697 A1 | 9/2014 | Raring et al. |
| 2014/0267937 A1 | 9/2014 | Raring et al. |
| 2014/0268815 A1 | 9/2014 | Li et al. |
| 2014/0293139 A1 | 10/2014 | Raring et al. |
| 2014/0376246 A1* | 12/2014 | Yatsuda ............. F21S 41/25 362/511 |
| 2015/0055915 A1 | 2/2015 | Logunov et al. |
| 2015/0062953 A1 | 3/2015 | Woelfing et al. |
| 2015/0078022 A1 | 3/2015 | Bauer |
| 2015/0131306 A1 | 5/2015 | Genier et al. |
| 2015/0138511 A1 | 5/2015 | Domm |
| 2015/0222091 A1 | 8/2015 | Futami et al. |
| 2015/0229107 A1 | 8/2015 | McLaurin et al. |
| 2015/0267880 A1 | 9/2015 | Hadrath et al. |
| 2015/0274066 A1 | 10/2015 | Del Pozo Gonzalez et al. |
| 2015/0286122 A1 | 10/2015 | Raring et al. |
| 2015/0323143 A1 | 11/2015 | Raring et al. |
| 2015/0346411 A1 | 12/2015 | Bauco et al. |
| 2015/0377430 A1 | 12/2015 | Bhakta |
| 2016/0061514 A1 | 3/2016 | Seo et al. |
| 2016/0077415 A1 | 3/2016 | Motoya et al. |
| 2016/0084451 A1 | 3/2016 | Annen et al. |
| 2016/0088804 A1 | 3/2016 | Ooi et al. |
| 2016/0131334 A1 | 5/2016 | Rousseau et al. |
| 2016/0159273 A1 | 6/2016 | Nakazato |
| 2016/0236613 A1 | 8/2016 | Trier |
| 2016/0245471 A1 | 8/2016 | Nakazato et al. |
| 2016/0268770 A1 | 9/2016 | Tazawa et al. |
| 2016/0281954 A1 | 9/2016 | Moisy et al. |
| 2016/0290584 A1 | 10/2016 | Nomura et al. |
| 2016/0327721 A1 | 11/2016 | Bauco et al. |
| 2016/0341384 A1 | 11/2016 | Hoshino |
| 2017/0005077 A1 | 1/2017 | Kim et al. |
| 2017/0051883 A1* | 2/2017 | Raring ............. H01S 5/2201 |
| 2017/0051884 A1 | 2/2017 | Raring et al. |
| 2017/0051885 A1 | 2/2017 | Hirasawa et al. |
| 2017/0059763 A1 | 3/2017 | Lucrecio et al. |
| 2017/0071037 A1 | 3/2017 | Wu et al. |
| 2017/0072841 A1 | 3/2017 | Schabacker et al. |
| 2017/0093123 A1 | 3/2017 | Takizawa et al. |
| 2017/0153319 A1 | 6/2017 | Villeneuve et al. |
| 2017/0314848 A1 | 11/2017 | Ammerman et al. |
| 2017/0327032 A1 | 11/2017 | Fimeri et al. |
| 2018/0017220 A1 | 1/2018 | Kitano |
| 2018/0026421 A1 | 1/2018 | Seidenfaden et al. |
| 2018/0083422 A1 | 3/2018 | Castiglia et al. |
| 2018/0086028 A1 | 3/2018 | Berard et al. |
| 2018/0180789 A1 | 6/2018 | Russert et al. |
| 2018/0188437 A1 | 7/2018 | Hagen et al. |
| 2018/0235040 A1* | 8/2018 | Yamanaka ......... H01S 5/02476 |
| 2018/0266658 A1 | 9/2018 | Rousseau et al. |
| 2018/0297515 A1* | 10/2018 | Laluet ................... B60J 1/001 |
| 2018/0316160 A1 | 11/2018 | Raring et al. |
| 2018/0345631 A1* | 12/2018 | Klein ............... B32B 17/10761 |
| 2019/0025687 A1 | 1/2019 | Raring et al. |
| 2019/0235182 A1 | 8/2019 | Cheng |
| 2019/0242535 A1 | 8/2019 | Hikmet et al. |
| 2019/0305503 A1 | 10/2019 | Osawa et al. |
| 2020/0200363 A1 | 6/2020 | Harrison et al. |
| 2020/0232610 A1 | 7/2020 | Raring et al. |
| 2020/0232611 A1 | 7/2020 | Raring et al. |
| 2020/0232618 A1 | 7/2020 | Rudy et al. |
| 2020/0233292 A1 | 7/2020 | Rudy et al. |
| 2020/0241189 A1 | 7/2020 | Schabacker et al. |
| 2021/0151956 A1 | 5/2021 | Raring et al. |
| 2022/0231479 A1 | 7/2022 | Raring et al. |
| 2022/0320819 A1 | 10/2022 | Rudy et al. |
| 2022/0333745 A1 | 10/2022 | Goutain et al. |
| 2022/0364699 A1 | 11/2022 | Harrison et al. |
| 2022/0376462 A1 | 11/2022 | Heikman |

FOREIGN PATENT DOCUMENTS

| | | |
|---|---|---|
| CN | 1655371 | 8/2005 |
| CN | 1668947 | 9/2005 |
| CN | 1702836 | 11/2005 |
| CN | 1953197 | 4/2007 |
| CN | 101009347 | 8/2007 |
| CN | 101079463 | 11/2007 |
| CN | 101099245 | 1/2008 |
| CN | 101171692 | 4/2008 |
| CN | 101308896 | 11/2008 |
| CN | 102449550 | 5/2012 |
| CN | 102144924 A | 9/2012 |
| CN | 102804432 A | 11/2012 |
| CN | 103797597 A | 5/2014 |
| CN | 104566108 A | 4/2015 |
| CN | 104798203 A | 7/2015 |
| CN | 108139054 | 6/2018 |
| CN | 108266696 A | 7/2018 |
| DE | 112010002177 | 10/2012 |
| EP | 1571715 | 9/2005 |
| EP | 1 995 834 | 11/2008 |
| EP | 2 796 771 | 10/2014 |
| EP | 3 045 947 | 7/2016 |
| EP | 3 093 556 | 11/2016 |
| EP | 3338023 | 6/2018 |
| IN | 9733/DELNP/2011 | 1/2013 |
| JP | 03287770 | 12/1991 |
| JP | 07162081 | 6/1995 |
| JP | 11-142652 A | 5/1999 |
| JP | 2001230497 | 8/2001 |
| JP | 2002009402 | 1/2002 |
| JP | 2002185082 | 6/2002 |
| JP | 2004503923 | 2/2004 |
| JP | 2004071885 | 3/2004 |
| JP | 2004152841 | 5/2004 |
| JP | 2004186527 | 7/2004 |
| JP | 2004304111 | 10/2004 |
| JP | 2005289797 | 10/2005 |
| JP | 2006091285 | 4/2006 |
| JP | 2006-126731 A | 5/2006 |
| JP | 2006120923 | 5/2006 |
| JP | 2007068398 | 3/2007 |
| JP | 2007173467 | 7/2007 |
| JP | 2007529910 | 10/2007 |
| JP | 2008-003125 A | 1/2008 |
| JP | 2008130591 | 6/2008 |
| JP | 2008193057 | 8/2008 |
| JP | 2008198952 | 8/2008 |
| JP | 2008533723 | 8/2008 |
| JP | 2008288527 | 11/2008 |
| JP | 2008543089 | 11/2008 |
| JP | 2008311640 | 12/2008 |
| JP | 2009021506 | 1/2009 |

(56) References Cited

FOREIGN PATENT DOCUMENTS

| | | |
|---|---|---|
| JP | 2009158893 | 7/2009 |
| JP | 2009170708 | 7/2009 |
| JP | 2009-224397 | 10/2009 |
| JP | 2009227685 | 10/2009 |
| JP | 2010067952 | 3/2010 |
| JP | 2010093236 | 4/2010 |
| JP | 2010103487 | 5/2010 |
| JP | 2010109147 | 5/2010 |
| JP | 2010109331 | 5/2010 |
| JP | 2010109332 | 5/2010 |
| JP | 2010-129300 A | 6/2010 |
| JP | 2010225917 | 10/2010 |
| JP | 2010238784 | 10/2010 |
| JP | 2010-251686 | 11/2010 |
| JP | 2011077326 | 4/2011 |
| JP | 2011-129374 A | 6/2011 |
| JP | 2012054272 | 3/2012 |
| JP | 2012512508 | 5/2012 |
| JP | 2013-187145 A | 9/2013 |
| JP | 2014007093 A | 1/2014 |
| JP | 2014-534565 A | 12/2014 |
| JP | 2015-001709 A | 1/2015 |
| JP | 2015022954 | 2/2015 |
| JP | 2017-040905 A | 2/2017 |
| JP | 2018085500 | 5/2018 |
| JP | 2018525836 | 9/2018 |
| KR | 20180044327 | 5/2018 |
| WO | 2006/057463 | 1/2006 |
| WO | 2006/038502 A1 | 4/2006 |
| WO | 2006/099138 | 9/2006 |
| WO | 2007/004495 | 1/2007 |
| WO | 2007/119723 | 10/2007 |
| WO | 2008/041521 | 4/2008 |
| WO | 2008/109296 | 9/2008 |
| WO | 2008/143276 | 11/2008 |
| WO | 2008/147415 A1 | 12/2008 |
| WO | 2009/124317 | 10/2009 |
| WO | 2010/138923 | 2/2010 |
| WO | 2010/068916 | 6/2010 |
| WO | 2010/069282 | 6/2010 |
| WO | 2010/120819 | 10/2010 |
| WO | 2011/149977 | 12/2011 |
| WO | 2012/016033 | 2/2012 |
| WO | 2012/053245 | 4/2012 |
| WO | 2014/087047 A1 | 6/2014 |
| WO | 2015/090556 A1 | 6/2015 |
| WO | 2017/031446 A1 | 2/2017 |
| WO | 2018/078404 A1 | 5/2018 |
| WO | 2019/086176 A1 | 5/2019 |

OTHER PUBLICATIONS

Data Table for: Non-Ferrous Metals: Other Metals, Molybdenum, Available online at: http://www.matbase.com/material/non-ferrous-metals/other/molybdenum/properties, Mar. 28, 2011, 1 page.
U.S. Appl. No. 12/133,364, Final Office Action mailed on Jun. 1, 2011, 7 pages.
U.S. Appl. No. 12/133,364, Non-Final Office Action mailed on Nov. 26, 2010, 6 pages.
U.S. Appl. No. 12/133,364, Notice of Allowance mailed on Oct. 11, 2011, 5 pages.
U.S. Appl. No. 12/133,365, Final Office Action mailed on Oct. 18, 2011, 22 pages.
U.S. Appl. No. 12/133,365, Non-Final Office Action mailed on Jun. 9, 2011, 17 pages.
U.S. Appl. No. 12/133,365, Non-Final Office Action mailed on May 13, 2013, 23 pages.
U.S. Appl. No. 12/334,418, Final Office Action mailed on Oct. 19, 2011, 24 pages.
U.S. Appl. No. 12/334,418, Non-Final Office Action mailed on Apr. 5, 2011, 20 pages.
U.S. Appl. No. 12/478,736, Corrected Notice of Allowability mailed on Oct. 9, 2012, 4 pages.
U.S. Appl. No. 12/478,736, Final Office Action mailed on Feb. 7, 2012, 6 pages.
U.S. Appl. No. 12/478,736, Non-Final Office Action mailed on Sep. 27, 2011, 11 pages.
U.S. Appl. No. 12/478,736, Notice of Allowance mailed on Apr. 23, 2012, 8 pages.
U.S. Appl. No. 12/481,543, Non-Final Office Action mailed on Jun. 27, 2011, 10 pages.
U.S. Appl. No. 12/482,440, Final Office Action mailed on Aug. 12, 2011, 7 pages.
U.S. Appl. No. 12/482,440, Non-Final Office Action mailed on Feb. 23, 2011, 6 pages.
U.S. Appl. No. 12/484,095, Final Office Action mailed on Jul. 8, 2011, 12 pages.
U.S. Appl. No. 12/484,095, Non-Final Office Action mailed on Nov. 10, 2010, 9 pages.
U.S. Appl. No. 12/484,924, Final Office Action mailed on Oct. 31, 2011, 11 pages.
U.S. Appl. No. 12/484,924, Non-Final Office Action mailed on Apr. 14, 2011, 12 pages.
U.S. Appl. No. 12/484,924, Non-Final Office Action mailed on Dec. 18, 2013, 15 pages.
U.S. Appl. No. 12/484,924, Notice of Allowance mailed on May 29, 2014, 10 pages.
U.S. Appl. No. 12/491,169, Final Office Action mailed on May 11, 2011, 10 pages.
U.S. Appl. No. 12/491,169, Non-Final Office Action mailed on Oct. 22, 2010, 10 pages.
U.S. Appl. No. 12/497,289, Non-Final Office Action mailed on Feb. 2, 2012, 7 pages.
U.S. Appl. No. 12/497,289, Notice of Allowance mailed on May 22, 2012, 7 pages.
U.S. Appl. No. 12/497,969, Final Office Action mailed on Jul. 5, 2012, 18 pages.
U.S. Appl. No. 12/497,969, Non-Final Office Action mailed on Feb. 2, 2012, 20 pages.
U.S. Appl. No. 12/497,969, Non-Final Office Action mailed on May 16, 2013, 22 pages.
U.S. Appl. No. 12/502,058, Non-Final Office Action mailed on Dec. 8, 2010, 15 pages.
U.S. Appl. No. 12/502,058, Final Office Action mailed on Aug. 19, 2011, 13 pages.
U.S. Appl. No. 12/502,058, Notice of Allowance mailed on Apr. 16, 2012, 10 pages.
U.S. Appl. No. 12/502,058, Notice of Allowance mailed on Jul. 19, 2012, 8 pages.
U.S. Appl. No. 12/534,829, Non-Final Office Action mailed on Apr. 19, 2011, 9 pages.
U.S. Appl. No. 12/534,829, Notice of Allowability mailed on Dec. 21, 2011, 4 pages.
U.S. Appl. No. 12/534,829, Notice of Allowance mailed on Dec. 5, 2011, 7 pages.
U.S. Appl. No. 12/534,829, Notice of Allowance mailed on Oct. 28, 2011, 8 pages.
U.S. Appl. No. 12/534,838, Final Office Action mailed on Jan. 13, 2012, 12 pages.
U.S. Appl. No. 12/534,838, Non-Final Office Action mailed on May 3, 2011, 12 pages.
U.S. Appl. No. 12/534,838, Non-Final Office Action mailed on Mar. 20, 2012, 13 pages.
U.S. Appl. No. 12/534,838, Notice of Allowance mailed on Jun. 8, 2012, 8 pages.
U.S. Appl. No. 12/534,843, Non-Final Office Action mailed on Sep. 10, 2012, 10 pages.
U.S. Appl. No. 12/534,843, Notice of Allowance mailed on Jan. 24, 2013, 9 pages.
U.S. Appl. No. 12/534,844, Final Office Action mailed on Feb. 4, 2011, 9 pages.
U.S. Appl. No. 12/534,844, Non-Final Office Action mailed on Sep. 16, 2010, 8 pages.
U.S. Appl. No. 12/534,844, Non-Final Office Action mailed on Apr. 25, 2014, 7 pages.

(56) References Cited

OTHER PUBLICATIONS

U.S. Appl. No. 12/534,844, Notice of Allowance mailed on Nov. 17, 2014, 5 pages.
U.S. Appl. No. 12/534,849, Notice of Allowance mailed on Jul. 31, 2012, 12 pages.
U.S. Appl. No. 12/534,857, Non-Final Office Action mailed on Sep. 1, 2010, 13 pages.
U.S. Appl. No. 12/534,857, Notice of Allowance mailed on May 27, 2011, 5 pages.
U.S. Appl. No. 12/546,458, Non-Final Office Action mailed on Jul. 20, 2011, 5 pages.
U.S. Appl. No. 12/546,458, Notice of Allowance mailed on Nov. 28, 2011, 5 pages.
U.S. Appl. No. 12/556,558, Non-Final Office Action mailed on Sep. 16, 2010, 8 pages.
U.S. Appl. No. 12/556,558, Notice of Allowance mailed on Mar. 22, 2011, 5 pages.
U.S. Appl. No. 12/556,562, Final Office Action mailed on Mar. 21, 2011, 5 pages.
U.S. Appl. No. 12/556,562, Non-Final Office Action mailed on Sep. 15, 2010, 7 pages.
U.S. Appl. No. 12/556,562, Notice of Allowance mailed on Jul. 27, 2011, 5 pages.
U.S. Appl. No. 12/569,337, Non-Final Office Action mailed on May 9, 2012, 19 pages.
U.S. Appl. No. 12/569,337, Notice of Allowance mailed on Nov. 15, 2012, 5 pages.
U.S. Appl. No. 12/573,820, Final Office Action mailed on Oct. 11, 2011, 23 pages.
U.S. Appl. No. 12/573,820, Non-Final Office Action mailed on Mar. 2, 2011, 19 pages.
U.S. Appl. No. 12/573,820, Non-Final Office Action mailed on Oct. 9, 2013, 29 pages.
U.S. Appl. No. 12/634,665, Final Office Action mailed on Oct. 1, 2012, 10 pages.
U.S. Appl. No. 12/634,665, Non-Final Office Action mailed on Apr. 25, 2012, 11 pages.
U.S. Appl. No. 12/634,665, Notice of Allowance mailed on Feb. 15, 2013, 9 pages.
U.S. Appl. No. 12/636,683, Non-Final Office Action mailed on Jun. 12, 2013, 15 pages.
U.S. Appl. No. 12/724,983, Non-Final Office Action mailed on Mar. 5, 2012, 21 pages.
U.S. Appl. No. 12/727,148, Final Office Action mailed on Nov. 21, 2013, 10 pages.
U.S. Appl. No. 12/727,148, Non-Final Office Action mailed on Sep. 11, 2014, 12 pages.
U.S. Appl. No. 12/727,148, Non-Final Office Action mailed on May 15, 2013, 10 pages.
U.S. Appl. No. 12/749,466, Final Office Action mailed on Feb. 3, 2012, 16 pages.
U.S. Appl. No. 12/749,466, Non-Final Office Action mailed on Jul. 3, 2012, 18 pages.
U.S. Appl. No. 12/749,466, Non-Final Office Action mailed on Jun. 29, 2011, 20 pages.
U.S. Appl. No. 12/749,466, Notice of Allowance mailed on Jan. 2, 2013, 8 pages.
U.S. Appl. No. 12/749,476, Final Office Action mailed on Nov. 8, 2011, 11 pages.
U.S. Appl. No. 12/749,476, Non-Final Office Action mailed on Apr. 11, 2011, 15 pages.
U.S. Appl. No. 12/749,476, Notice of Allowance mailed on Jun. 26, 2012, 8 pages.
U.S. Appl. No. 12/749,476, Notice of Allowance mailed on May 4, 2012, 8 pages.
U.S. Appl. No. 12/759,273, Final Office Action mailed on Jun. 26, 2012, 10 pages.
U.S. Appl. No. 12/759,273, Non-Final Office Action mailed on Nov. 21, 2011, 10 pages.
U.S. Appl. No. 12/759,273, Non-Final Office Action mailed on Apr. 3, 2014, 16 pages.
U.S. Appl. No. 12/759,273, Final Office Action mailed on Oct. 24, 2014, 16 pages.
U.S. Appl. No. 12/759,273, Non-Final Office Action mailed on Jan. 29, 2015, 16 pages.
U.S. Appl. No. 12/759,273, Final Office Action mailed on Jun. 8, 2015, 17 pages.
U.S. Appl. No. 12/759,273, Non-Final Office Action mailed on Sep. 23, 2015, 18 pages.
U.S. Appl. No. 12/759,273, Final Office Action mailed on Mar. 29, 2016, 12 pages.
U.S. Appl. No. 12/759,273, Notice of Allowance mailed on Aug. 19, 2016, 8 pages.
U.S. Appl. No. 12/762,269, Non-Final Office Action mailed on Oct. 12, 2011, 12 pages.
U.S. Appl. No. 12/762,269, Notice of Allowance mailed on Apr. 23, 2012, 8 pages.
U.S. Appl. No. 12/762,271, Final Office Action mailed on Jun. 6, 2012, 13 pages.
U.S. Appl. No. 12/762,271, Non-Final Office Action mailed on Dec. 23, 2011, 12 pages.
U.S. Appl. No. 12/762,271, Notice of Allowance mailed on Aug. 8, 2012, 9 pages.
U.S. Appl. No. 12/762,278, Notice of Allowance mailed on Nov. 7, 2011, 11 pages.
U.S. Appl. No. 12/778,718, Non-Final Office Action mailed on Nov. 25, 2011, 12 pages.
U.S. Appl. No. 12/778,718, Notice of Allowance mailed on Apr. 3, 2012, 14 pages.
U.S. Appl. No. 12/778,718, Notice of Allowance mailed on Jun. 13, 2012, 7 pages.
U.S. Appl. No. 12/785,404, Non-Final Office Action mailed on Mar. 6, 2012, 10 pages.
U.S. Appl. No. 12/785,404, Notice of Allowance mailed on Jul. 16, 2012, 5 pages.
U.S. Appl. No. 12/787,343, Non-Final Office Action mailed on Dec. 17, 2012, 6 pages.
U.S. Appl. No. 12/787,343, Notice of Allowance mailed on Jun. 10, 2013, 10 pages.
U.S. Appl. No. 12/789,303, Non-Final Office Action mailed on Sep. 24, 2012, 20 pages.
U.S. Appl. No. 12/789,303, Notice of Allowance mailed on Dec. 21, 2012, 5 pages.
U.S. Appl. No. 12/859,153, Final Office Action mailed on Feb. 26, 2013, 24 pages.
U.S. Appl. No. 12/859,153, Non-Final Office Action mailed on Sep. 25, 2012, 22 pages.
U.S. Appl. No. 12/859,153, Non-Final Office Action mailed on Jun. 21, 2013, 24 pages.
U.S. Appl. No. 12/868,441, Non-Final Office Action mailed on Apr. 30, 2012, 12 pages.
U.S. Appl. No. 12/868,441, Final Office Action mailed on Dec. 18, 2012, 34 pages.
U.S. Appl. No. 12/868,441, Notice of Allowance mailed on Sep. 18, 2013, 13 pages.
U.S. Appl. No. 12/873,820, Non-Final Office Action mailed on Oct. 4, 2012, 10 pages.
U.S. Appl. No. 12/873,820, Final Office Action mailed on Apr. 11, 2013, 7 pages.
U.S. Appl. No. 12/873,820, Notice of Allowance mailed Jul. 26, 2013, 6 pages.
U.S. Appl. No. 12/880,803, Non-Final Office Action mailed on Feb. 22, 2012, 9 pages.
U.S. Appl. No. 12/880,803, Notice of Allowance mailed on Jul. 18, 2012, 5 pages.
U.S. Appl. No. 12/880,889, Non-Final Office Action mailed on Feb. 27, 2012, 13 pages.
U.S. Appl. No. 12/880,889, Final Office Action mailed on Sep. 19, 2012, 13 pages.
U.S. Appl. No. 12/880,889, Non-Final Office Action mailed on Oct. 1, 2013, 19 pages.

(56) References Cited

OTHER PUBLICATIONS

U.S. Appl. No. 12/883,093, Final Office Action mailed on Aug. 3, 2012, 13 pages.
U.S. Appl. No. 12/883,093, Non-Final Office Action mailed on Mar. 13, 2012, 12 pages.
U.S. Appl. No. 12/883,093, Notice of Allowance mailed on Nov. 21, 2012, 12 pages.
U.S. Appl. No. 12/883,652, Non-Final Office Action mailed on Apr. 17, 2012, 8 pages.
U.S. Appl. No. 12/883,652, Non-Final Office Action mailed on May 14, 2014, 14 pages.
U.S. Appl. No. 12/883,652, Final Office Action mailed on Dec. 19, 2014, 16 pages.
U.S. Appl. No. 12/883,652, Non-Final Office Action mailed on Jun. 3, 2015, 16 pages.
U.S. Appl. No. 12/883,652, Final Office Action mailed on Oct. 26, 2015, 11 pages.
U.S. Appl. No. 12/883,652, Non-Final Office Action mailed on Apr. 5, 2016, 12 pages.
U.S. Appl. No. 12/883,652, Notice of Allowance mailed on Aug. 30, 2016, 7 pages.
U.S. Appl. No. 12/884,993, Final Office Action mailed on Aug. 2, 2012, 15 pages.
U.S. Appl. No. 12/884,993, Non-Final Office Action mailed on Mar. 16, 2012, 15 pages.
U.S. Appl. No. 12/884,993, Notice of Allowance mailed on Nov. 26, 2012, 11 pages.
U.S. Appl. No. 12/891,668, Final Office Action mailed on Jan. 10, 2013, 31 pages.
U.S. Appl. No. 12/891,668, Non-Final Office Action mailed on Sep. 25, 2012, 21 pages.
U.S. Appl. No. 12/891,668, Notice of Allowance mailed on Mar. 20, 2013, 14 pages.
U.S. Appl. No. 12/942,817, Non-Final Office Action mailed on Feb. 20, 2013, 12 pages.
U.S. Appl. No. 12/942,817, Final Office Action mailed on Jan. 2, 2014, 15 pages.
U.S. Appl. No. 12/942,817, Non-Final Office Action mailed on Jul. 31, 2014, 11 pages.
U.S. Appl. No. 12/942,817, Final Office Action mailed on Oct. 22, 2014, 12 pages.
U.S. Appl. No. 12/942,817, Notice of Allowance mailed on Jan. 30, 2015, 8 pages.
U.S. Appl. No. 12/995,946, Non-Final Office Action mailed on Mar. 28, 2012, 18 pages.
U.S. Appl. No. 12/995,946, Non-Final Office Action, mailed on Jan. 29, 2013, 25 pages.
U.S. Appl. No. 12/995,946, Final Office Action, mailed on Aug. 2, 2013, 16 pages.
U.S. Appl. No. 13/014,622, Final Office Action mailed on Apr. 30, 2012, 14 pages.
U.S. Appl. No. 13/014,622, Non-Final Office Action mailed on Nov. 28, 2011, 14 pages.
U.S. Appl. No. 13/014,622, Non-Final Office Action mailed on Jun. 20, 2014, 15 pages.
U.S. Appl. No. 13/014,622, Final Office Action mailed on May 11, 2015, 14 pages.
U.S. Appl. No. 13/041,199, Final Office Action mailed on Mar. 12, 2013, 10 pages.
U.S. Appl. No. 13/041,199, Non-Final Office Action mailed on Nov. 30, 2012, 14 pages.
U.S. Appl. No. 13/041,199, Non-Final Office Action mailed on Apr. 29, 2014, 13 pages.
U.S. Appl. No. 13/041,199, Notice of Allowance mailed on Sep. 9, 2014, 10 pages.
U.S. Appl. No. 13/046,565, Final Office Action mailed on Feb. 2, 2012, 17 pages.
U.S. Appl. No. 13/046,565, Final Office Action mailed on Jul. 19, 2012, 24 pages.
U.S. Appl. No. 13/046,565, Non-Final Office Action mailed on Nov. 7, 2011, 17 pages.
U.S. Appl. No. 13/046,565, Non-Final Office Action mailed on Apr. 13, 2012, 40 pages.
U.S. Appl. No. 13/108,645, Notice of Allowance mailed on Jan. 28, 2013, 9 pages.
U.S. Appl. No. 13/114,806, Final Office Action mailed on Mar. 10, 2016, 14 pages.
U.S. Appl. No. 13/114,806, Final Office Action mailed on May 8, 2015, 20 pages.
U.S. Appl. No. 13/114,806, Final Office Action mailed on Aug. 26, 2013, 22 pages.
U.S. Appl. No. 13/114,806, Final Office Action mailed on Aug. 27, 2014, 22 pages.
U.S. Appl. No. 13/114,806, Non-Final Office Action mailed on Oct. 5, 2015, 15 pages.
U.S. Appl. No. 13/114,806, Non-Final Office Action mailed on Jan. 14, 2015, 21 pages.
U.S. Appl. No. 13/114,806, Non-Final Office Action mailed on Apr. 12, 2013, 22 pages.
U.S. Appl. No. 13/114,806, Non-Final Office Action mailed on Feb. 13, 2014, 23 pages.
U.S. Appl. No. 13/175,739, Non-Final Office Action mailed on Dec. 7, 2012, 6 pages.
U.S. Appl. No. 13/175,739, Notice of Allowance mailed on Mar. 21, 2013, 6 pages.
U.S. Appl. No. 13/226,249, Non-Final Office Action mailed on Oct. 10, 2012, 7 pages.
U.S. Appl. No. 13/226,249, Notice of Allowance mailed on Feb. 21, 2013, 5 pages.
U.S. Appl. No. 13/272,981, Non-Final Office Action mailed on Mar. 20, 2013, 19 pages.
U.S. Appl. No. 13/272,981, Final Office Action mailed on Aug. 15, 2013, 13 pages.
U.S. Appl. No. 13/272,981, Notice of Allowance mailed on Mar. 13, 2014, 10 pages.
U.S. Appl. No. 13/291,922, Non-Final Office Action mailed on Feb. 20, 2013, 10 pages.
U.S. Appl. No. 13/291,922, Final Office Action mailed on Jun. 18, 2013, 9 pages.
U.S. Appl. No. 13/291,922, Non-Final Office Action mailed on Dec. 20, 2013, 12 pages.
U.S. Appl. No. 13/291,922, Final Office Action mailed on Jun. 19, 2014, 13 pages.
U.S. Appl. No. 13/291,922, Notice of Allowance mailed on Nov. 7, 2014, 9 pages.
U.S. Appl. No. 13/346,507, Non-Final Office Action mailed on Dec. 21, 2012, 9 pages.
U.S. Appl. No. 13/346,507, Notice of Allowance mailed on Apr. 22, 2013, 8 pages.
U.S. Appl. No. 13/354,639, Non-Final Office Action mailed on Nov. 7, 2012, 12 pages.
U.S. Appl. No. 13/354,639, Notice of Allowance mailed on Dec. 14, 2012, 8 pages.
U.S. Appl. No. 13/425,304, Notice of Allowance mailed on Aug. 22, 2012, 9 pages.
U.S. Appl. No. 13/425,354, Non-Final Office Action mailed on Feb. 14, 2013, 13 pages.
U.S. Appl. No. 13/425,354, Final Office Action mailed on Aug. 2, 2013, 16 pages.
U.S. Appl. No. 13/425,354, Notice of Allowance mailed on Feb. 17, 2014, 8 pages.
U.S. Appl. No. 13/548,312, Final Office Action mailed on Mar. 13, 2014, 5 pages.
U.S. Appl. No. 13/548,312, Notice of Allowance mailed on Jun. 23, 2014, 7 pages.
U.S. Appl. No. 13/548,931, Notice of Allowance mailed on Jun. 3, 2013, 11 pages.
U.S. Appl. No. 13/606,894, Non-Final Office Action mailed on Feb. 5, 2013, 8 pages.
U.S. Appl. No. 13/606,894, Notice of Allowance mailed on May 24, 2013, 9 pages.

(56) References Cited

OTHER PUBLICATIONS

U.S. Appl. No. 13/678,101, Notice of Allowance, mailed on Jan. 24, 2014, 10 pages.
U.S. Appl. No. 13/678,122, Notice of Allowance mailed on Mar. 4, 2014, 18 pages.
U.S. Appl. No. 13/739,961, Notice of Allowance mailed on Dec. 10, 2013, 13 pages.
U.S. Appl. No. 13/752,158, Final Office Action mailed on Apr. 1, 2014, 15 pages.
U.S. Appl. No. 13/752,158, Non-Final Office Action mailed on Oct. 7, 2013, 14 pages.
U.S. Appl. No. 13/752,158, Notice of Allowance mailed on Sep. 16, 2014, 9 Pages.
U.S. Appl. No. 13/853,694, Notice of Allowance mailed on Sep. 3, 2013, 8 pages.
U.S. Appl. No. 13/937,981, Notice of Allowance mailed on Nov. 27, 2013, 11 pages.
U.S. Appl. No. 13/937,981, Notice of Allowance mailed on Mar. 28, 2014, 9 pages.
U.S. Appl. No. 13/938,048, Final Office Action mailed on Jul. 27, 2015, 5 pages.
U.S. Appl. No. 13/938,048, Non-Final Office Action mailed on Apr. 9, 2015, 10 pages.
U.S. Appl. No. 13/938,048, Notice of Allowance mailed on Sep. 30, 2015, 5 pages.
U.S. Appl. No. 14/035,045, Notice of Allowance mailed on Jan. 13, 2014, 9 pages.
U.S. Appl. No. 14/176,403, Non-Final Office Action mailed on Sep. 11, 2015, 13 pages.
U.S. Appl. No. 14/176,403, Notice of Allowance mailed on Feb. 12, 2016, 8 pages.
U.S. Appl. No. 14/199,672, Non-Final Office Action mailed on Oct. 8, 2014, 7 pages.
U.S. Appl. No. 14/199,672, Notice of Allowance mailed on Feb. 2, 2015, 5 pages.
U.S. Appl. No. 14/262,208, Non-Final Office Action mailed on Dec. 22, 2014, 10 pages.
U.S. Appl. No. 14/262,208, Notice of Allowance mailed on Apr. 23, 2015, 5 pages.
U.S. Appl. No. 14/307,214, Notice of Allowance, mailed on Feb. 27, 2015, 10 pages.
U.S. Appl. No. 14/509,596, Notice of Allowance, mailed on Jan. 22, 2015, 9 pages.
U.S. Appl. No. 14/534,636, Non-Final Office Action, mailed on Jun. 3, 2015, 9 pages.
U.S. Appl. No. 14/534,636, Notice of Allowance mailed on Sep. 15, 2015, 11 pages.
U.S. Appl. No. 14/743,971, Final Office Action mailed on Nov. 30, 2016, 23 pages.
U.S. Appl. No. 14/743,971, Non-Final Office Action mailed on May 12, 2017, 20 pages.
U.S. Appl. No. 14/743,971, Non-Final Office Action mailed on Apr. 21, 2016, 23 pages.
U.S. Appl. No. 14/743,971, Notice of Allowance mailed on Jul. 28, 2017, 5 pages.
U.S. Appl. No. 14/802,960, Final Office Action mailed on Nov. 30, 2016, 23 pages.
U.S. Appl. No. 14/802,960, Non-Final Office Action mailed on May 8, 2017, 19 pages.
U.S. Appl. No. 14/802,960, Non-Final Office Action mailed on Apr. 15, 2016, 23 pages.
U.S. Appl. No. 14/802,960, Notice of Allowance mailed on Jul. 31, 2017, 5 pages.
U.S. Appl. No. 14/822,845, Final Office Action mailed on May 4, 2017, 15 pages.
U.S. Appl. No. 14/822,845, Non-Final Office Action, mailed on Jan. 6, 2017, 17 pages.
U.S. Appl. No. 14/822,845, Notice of Allowance mailed on Jun. 21, 2017, 7 pages.
U.S. Appl. No. 14/829,927, Advisory Action mailed on Nov. 1, 2018, 7 pages.
U.S. Appl. No. 14/829,927, Final Office Action mailed on Jul. 26, 2018, 39 pages.
U.S. Appl. No. 14/829,927, Non-Final Office Action mailed on Mar. 21, 2019, 26 pages.
U.S. Appl. No. 14/829,927, Non-Final Office Action mailed on Sep. 26, 2017, 44 pages.
U.S. Appl. No. 14/829,927 Non-Final Office Action mailed May 12, 2020, 28 pages.
U.S. Appl. No. 14/829,927 Notice of Allowance mailed Oct. 28, 2020, 16 pages.
U.S. Appl. No. 14/984,108, Advisory Action mailed on Apr. 26, 2018, 2 pages.
U.S. Appl. No. 14/984,108, Final Office Action mailed on Jan. 18, 2018, 12 pages.
U.S. Appl. No. 14/984,108, Non-Final Office Action mailed on Sep. 6, 2017, 10 pages.
U.S. Appl. No. 14/984,108, Notice of Allowance mailed on Oct. 1, 2018, 5 pages.
U.S. Appl. No. 15/160,873, Final Office Action mailed on Nov. 19, 2018, 37 pages.
U.S. Appl. No. 15/160,873, Non-Final Office Action mailed on Apr. 4, 2019, 31 pages.
U.S. Appl. No. 15/160,873, Non-Final Office Action, mailed on Apr. 5, 2018, 45 pages.
U.S. Appl. No. 15/710,715, Notice of Allowance mailed on May 25, 2018, 17 pages.
U.S. Appl. No. 15/796,568, First Action Interview Pilot Program Pre-Interview Communication mailed on Apr. 17, 2018, 5 pages.
U.S. Appl. No. 15/796,568, Notice of Allowance mailed on Jun. 22, 2018, 6 pages.
U.S. Appl. No. 16/000,802, Notice of Allowance mailed on Dec. 19, 2018, 14 pages.
U.S. Appl. No. 16/014,010 Non-Final Office Action mailed Apr. 30, 2020, 43 pages.
U.S. Appl. No. 16/014,010 Notice of Allowance mailed Aug. 18, 2020, 13 pages.
U.S. Appl. No. 16/230,158 Notice of Allowance mailed Sep. 21, 2021, 12 pages.
U.S. Appl. No. 16/230,365 Notice of Allowance mailed Apr. 18, 2022, 10 pages.
U.S. Appl. No. 16/252,570 Non-Final Office Action mailed Apr. 30, 2020, 73 pages.
U.S. Appl. No. 16/252,570 Final Office Action mailed Aug. 27, 2020, 68 pages.
U.S. Appl. No. 16/252,570 Non-Final Office Action mailed Feb. 23, 2021, 73 pages.
U.S. Appl. No. 16/252,570 Non-Final Office Action mailed Aug. 17, 2021, 64 pages.
U.S. Appl. No. 16/252,570 Final Office Action mailed Feb. 2, 2022, 77 pages.
U.S. Appl. No. 16/252,570 Advisory Action mailed Jul. 19, 2022, 11 pages.
U.S. Appl. No. 16/252,570 Non-Final Office Action mailed Aug. 26, 2022, 64 pages.
U.S. Appl. No. 16/353,657 Non-Final Office Action mailed May 19, 2020, 12 pages.
U.S. Appl. No. 16/353,657 Non-Final Office Action mailed Nov. 18, 2020, 17 pages.
U.S. Appl. No. 16/353,657 Notice of Allowance mailed Apr. 8, 2021, 7 pages.
U.S. Appl. No. 16/380,217 Non-Final Office Action mailed May 13, 2020, 56 pages.
U.S. Appl. No. 16/380,217 Final Office Action mailed Aug. 27, 2020, 58 pages.
U.S. Appl. No. 16/380,217 Non-Final Office Action mailed Feb. 17, 2021, 66 pages.
U.S. Appl. No. 16/380,217 Non-Final Office Action mailed Aug. 17, 2021, 53 pages.
U.S. Appl. No. 16/380,217 Final Office Action mailed Feb. 2, 2022, 57 pages.

(56) References Cited

OTHER PUBLICATIONS

U.S. Appl. No. 16/380,217 Non-Final Office Action mailed Jul. 19, 2022, 57 pages.
U.S. Appl. No. 16/449,126 Non-Final Office Action mailed Dec. 31, 2019, 19 pages.
U.S. Appl. No. 16/449,126 Final Office Action mailed Aug. 21, 2020, 22 pages.
U.S. Appl. No. 16/449,126 Non-Final Office Action mailed Dec. 21, 2020, 28 pages.
U.S. Appl. No. 16/449,126 Final Office Action mailed Jun. 8, 2021, 28 pages.
U.S. Appl. No. 16/449,126 Notice of Allowance mailed Nov. 10, 2021, 10 pages.
U.S. Appl. No. 16/597,791 Non-Final Office Action mailed Nov. 24, 2020, 35 pages.
U.S. Appl. No. 16/597,791 Final Office Action mailed Apr. 13, 2021, 49 pages.
U.S. Appl. No. 16/597,791 Non-Final Office Action mailed Aug. 9, 2021, 42 pages.
U.S. Appl. No. 16/597,791 Final Office Action mailed Feb. 2, 2022, 46 pages.
U.S. Appl. No. 16/597,791 Advisory Action mailed Jul. 19, 2022, 8 pages.
U.S. Appl. No. 16/597,795 Non-Final Office Action mailed Dec. 7, 2020, 46 pages.
U.S. Appl. No. 16/597,795 Final Office Action mailed Apr. 13, 2021, 39 pages.
U.S. Appl. No. 16/597,795 Non-Final Office Action mailed Aug. 9, 2021, 50 pages.
U.S. Appl. No. 16/597,795 Final Office Action mailed Feb. 2, 2022, 52 pages.
U.S. Appl. No. 16/597,795 Non-Final Office Action mailed Jul. 19, 2022, 47 pages.
U.S. Appl. No. 16/796,272 Non-Final Office Action mailed Jun. 22, 2020, 21 pages.
U.S. Appl. No. 16/796,272 Notice of Allowance mailed Sep. 25, 2020, 10 pages.
U.S. Appl. No. 16/796,368 Non-Final Office Action mailed Jun. 22, 2020, 19 pages.
U.S. Appl. No. 16/796,368 Non-Final Office Action mailed Nov. 18, 2020, 17 pages.
U.S. Appl. No. 16/796,368 Notice of Allowance mailed Apr. 13, 2021, 8 pages.
U.S. Appl. No. 17/318,976 Non-Final Office Action mailed Nov. 30, 2022, 29 pages.
U.S. Appl. No. 17/563,986 Notice of Allowance mailed Sep. 28, 2022, 9 pages.
Machine Translation of WO2019086176A1, retrieved from espacenet on Nov. 9, 2020, 6 pages.
Abare et al., Cleaved and Etched Facet Nitride Laser Diodes, IEEE Journal of Selected Topics in Quantum Electronics, vol. 4, No. 3, May-Jun. 1998, pp. 505-509.
Adesida et al., Characteristics of Chemically Assisted Ion Beam Etching of Gallium Nitride, Applied Physics Letters, vol. 65, Issue 7, Aug. 15, 1994, pp. 889-891.
Altoukhov et al., High Reflectivity Airgap Distributed Bragg Reflectors Realized by Wet Etching of AlInN Sacrificial Layers, Applied Physics Letters, vol. 95, 2009, pp. 191102-1-191102-3.
Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, No. 6, Jun. 1993, pp. 2088-2096.
Asano et al., 100-mW Kink-Free Blue-Violet Laser Diodes with Low Aspect Ratio, IEEE Journal of Quantum Electronics, vol. 39, No. 1, Jan. 2003, pp. 135-140.
Bernardini et al., Spontaneous Polarization and Piezoelectric Constants of III-V Nitrides, Physical Review B, vol. 56, No. 16, Oct. 15, 1997, pp. R10024-R10027.
Callahan et al., Synthesis and Growth of Gallium Nitride by the Chemical Vapor Reaction Process (CVRP), MRS Internet Journal Nitride Semiconductor Research, vol. 4, No. 10, 1999, pp. 1-6.
Caneau et al., Studies on the Selective OMVPE of (Ga,In)/(As,P), Journal of Crystal Growth, vol. 124, Nov. 1992, pp. 243-248.
Chen et al., Growth and Optical Properties of Highly Uniform and Periodic InGaN Nanostructures, Advanced Materials, vol. 19, No. 13, Jul. 2007, pp. 1707-1710.
Choi et al., 2.5$\lambda$ Microcavity InGaN Light-Emitting Diodes Fabricated by a Selective Dry-Etch Thinning Process, Applied Physics Letters, vol. 91, No. 6, 2007, pp. 061120-1-061120-3.
Extended European Search Report for Application No. EP 16 83 7921 issued May 16, 2019, 14 pages.
Examination Report for Application No. 16 837 921.2, mailed Feb. 2, 2021, 8 pages.
Extended European Search Report for Application No. EP 19899609, mailed Jul. 15, 2022, 13 pages.
Extended European Search Report for Application No. EP 22180266. 3-1212, mailed Sep. 15, 2022, 15 pages.
D'Evelyn et al., Bulk GaN Crystal Growth by the High-Pressure Ammonothermal Method, Journal of Crystal Growth, vol. 300, No. 1, Jan. 26, 2007, pp. 11-16.
Dorsaz et al., Selective Oxidation of AlInN Layers for Current Confinement III-Nitride Devices, Applied Physics Letters, vol. 87, 2005, pp. 072102-1-072102-3.
Ehrentraut et al., The Ammonothermal Crystal Growth of Gallium Nitride—a Technique on the up Rise, Proceedings IEEE, vol. 98, No. 7, 2010, pp. 1316-1323.
Fang et al., Deep Centers in Semi-insulating Fe-doped Native GaN Substrates Grown by Hydride Vapour Phase Epitaxy, Physica Status Solidi, vol. 5, No. 6, 2008, pp. 1508-1511.
Founta et al., Anisotropic Morphology of Nonpolar a-Plane GaN Quantum Dots and Quantum Wells, Journal of Applied Physics, vol. 102, No. 7, Oct. 2, 2007, pp. 074304-1-074304-6.
Franssila, Tools for CVD and Epitaxy, Introduction to Microfabrication, 2004, pp. 329-336.
Fujii et al., Increase in the Extraction Efficiency of GaN-Based Light-Emitting Diodes via Surface Roughening, Applied Physics Letters, vol. 84, No. 6, Feb. 9, 2004, pp. 855-857.
Fujito et al., Development of Bulk GaN Crystals and Nonpolar/Semipolar Substrates by HVPE, MRS Bulletin, vol. 34, No. 5, May 2009, pp. 313-317.
Fukuda et al., Prospects for the Ammonothermal Growth of Large GaN Crystal, Journal of Crystal Growth vol. 305, Jul. 2007, pp. 304-310.
Funato et al., Blue, Green, and Amber InGaN/GaN Light-Emitting Diodes on Semipolar (1122) GaN Bulk Substrates, Journal of Japanese Applied Physics, vol. 45, No. 26, Jun. 30, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, 2008, pp. 011106-1-011106-3.
Gardner et al., Blue-Emitting InGaN—GaN Double-Heterostructure Light-Emitting Diodes Reaching Maximum Quantum Efficiency Above 200A/cm2, Applied Physics Letters, vol. 91, No. 24, Dec. 12, 2007, pp. 243506-1-243506-3.
Gladkov et al., Effect of Fe Doping on Optical Properties of Freestanding Semi-Insulating HVPE GaN:Fe, Journal of Crystal Growth, vol. 312, 2010, pp. 1205-1209.
Grzegory et al., High Pressure Growth of Bulk GaN from Solutions in Gallium, Journal of Physics Condensed Matter, vol. 13, 2001, pp. 6875-6892.
Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, Nos. 1-3, May 6, 1999, pp. 104-111.
Iso et al., High Brightness Blue InGaN/GaN Light Emitting Diode on Nonpolar m-Plane Bulk GaN Substrate, Japanese Journal of Applied Physics, vol. 46, No. 40, Oct. 12, 2007, pp. L960-L962.
Kendall et al., Energy Savings Potential of Solid State Lighting in General Lighting Applications, Report for the Department of Energy, Apr. 2001, 35 pages.

(56) References Cited

OTHER PUBLICATIONS

Khan et al., Cleaved Cavity Optically Pumped InGaN—GaN Laser Grown on Spinel Substrates, Applied Physics Letters, vol. 69, No. 16, Oct. 14, 1996, pp. 2418-2420.
Kim et al., Improved Electroluminescence on Nonpolar m-Plane InGaN/GaN Qantum Wells LEDs, Physica Status Solidi (RRL), vol. 1, No. 3, Apr. 12, 2007, pp. 125-127.
Kuramoto et al., Novel Ridge-Type InGaN Multiple-Quantum-Well Laser Diodes Fabricated by Selective Area Re-Growth on n—GaN Substrates, Journal of Japanese Applied Physics, vol. 40, Sep. 15, 2001, pp. L925-L927.
Lide et al., Thermal Conductivity of Ceramics and Other Insulating Materials, CRC Handbook of Chemistry and Physics, 91st Edition, 2010-2011, pp. 12-203-12-204.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, Oct. 8, 2004, pp. 7032-7035.
Masui et al., Electrical Characteristics of Nonpolar InGaN-Based Light-Emitting Diodes Evaluated at Low Temperature, Japanese Journal of Applied Physics, vol. 46, No. 11, Nov. 6, 2007, pp. 7309-7310.
Michiue et al., Recent Development of Nitride LEDs and LDs, Proceedings of SPIE, vol. 7216, Feb. 16, 2009, pp. 7216Z-1-7216Z-6.
Moutanabbir et al., Bulk GaN Ion Cleaving, Journal of Electronic Materials, vol. 39, Nov. 5, 2010, pp. 482-488.
Nakamura et al., InGaN/GaN/AlGaN-Based Laser Diodes with Modulation-Doped Strained-Layer Superlattices Grown on an Epitaxially Laterally Overgrown GaN Substrate, Applied Physics Letters, vol. 72, No. 2, Jan. 12, 1998, pp. 211-213.
Nam et al., Lateral Epitaxial Overgrowth of GaN Films on SiO2 Areas via Metalorganic Vapor Phase Epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, The Japan Society of Applied Physics, JJAP Express Letter, vol. 46, No. 9, Feb. 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, No. 7, Jun. 20, 2008, pp. 072201-1-072201-3.
Okamoto et al., Pure Blue Laser Diodes Based on Nonpolar m-Plane Gallium Nitride with InGaN Waveguiding Layers, Journal of Japanese Applied Physics, vol. 46, No. 35, Sep. 7, 2007, pp. L820-L822.
Okubo, Nichia Develops Blue-Green Semiconductor Laser w/ 488nm Wavelength, Nikkei Technology Online, Available Online at: http://techon.nikkeibp.co.jp/english/NEWS_EN/20080122/146009/, Jan. 22, 2008, pp. 1-3.
Oshima et al., Thermal and Optical Properties of Bulk GaN Crystals Fabricated Through Hydride Vapor Phase Epitaxy with Void-Assisted Separation, Journal of Applied Physics, vol. 98, No. 10, 2005, pp. 103509-1-103509-4.
Park, Crystal Orientation Effects on Electronic Properties of Wurtzite InGaN/GaN Quantum Wells, Journal of Applied Physics, vol. 91, No. 12, Jun. 15, 2002, pp. 9904-9908.
Pattison et al., Gallium Nitride Based Microcavity Light Emitting Diodes With 2? Effective Cavity Thickness, Applied Physics Letters, vol. 90, No. 3, 2007, pp. 031111-1-031111-3.
International Application No. PCT/US2009/046786, International Search Report and Written Opinion mailed on May 13, 2010, 8 pages.
International Application No. PCT/US2009/047107, International Search Report and Written Opinion, mailed on Sep. 29, 2009, 10 pages.
International Application No. PCT/US2009/052611, International Search Report and Written Opinion mailed on Sep. 29, 2009, 11 pages.
International Application No. PCT/US2009/067745, International Search Report and Written Opinion mailed on Feb. 5, 2010, 9 pages.
International Application No. PCT/US2010/030939, International Search Report and Written Opinion mailed on Jun. 16, 2010, 9 pages.
International Application No. PCT/US2010/036739, International Search Report and Written Opinion mailed on Nov. 8, 2010, 10 pages.
International Application No. PCT/US2010/049172, International Search Report and Written Opinion mailed on Nov. 17, 2010, 7 pages.
International Application No. PCT/US2011/037792, International Search Report and Written Opinion mailed on Sep. 8, 2011, 9 pages.
International Application No. PCT/US2011/060030, International Search Report and Written Opinion mailed on Mar. 21, 2012, 8 pages.
International Application No. PCT/US2015/014567, International Search Report and Written Opinion mailed on Jul. 8, 2015, 19 pages.
International Application No. PCT/US2016/047834, International Search Report and Written Opinion mailed on Oct. 28, 2016, 13 pages.
International Preliminary Report on Patentability for Application No. PCT/US2020/038504, mailed Dec. 30, 2021, 11 pages.
International Preliminary Report on Patentability for Application No. PCT/US2020/014479, mailed Jul. 29, 2021, 22 pages.
International Preliminary Report on Patentability for Application No. PCT/US2020/014476, mailed Jul. 29, 2021, 13 pages.
International Search Report and Written Opinion for Application No. PCT/US2019/068428, mailed Apr. 16, 2020, 13 pages.
International Search Report and Written Opinion for Application No. PCT/US2019/068091, mailed Apr. 16, 2020, 16 pages.
International Preliminary Report on Patentability for Application No. PCT/US2019/068091, mailed on Jul. 1, 2021, 13 pages.
International Preliminary Report on Patentability for Application No. PCT/US2019/068428, mailed on Jul. 1, 2021, 10 pages.
Porowski et al., High Resistivity GaN Single Crystalline Substrates, Acta Physica Polonica A, vol. 92, No. 5, 1997, pp. 958-962.
Porowski, Near Defect Free GaN Substrates, Journal of Nitride Semiconductor, 1999, pp. 1-11.
Purvis, Changing the Crystal Face of Gallium Nitride, The Advance Semiconductor Magazine, vol. 18, No. 8, Nov. 2005, 3 pages.
Romanov et al., Strain-Induced Polarization in Wurtzite III-Nitride Semipolar Layers, Journal of Applied Physics, vol. 100, No. 2, Jul. 25, 2006, pp. 023522-1-023522-10.
Sarva et al., Dynamic Compressive Strength of Silicon Carbide Under Uniaxial Compression, Material Sciences and Engineering, vol. A317, 2001, pp. 140-144.
Sato et al., High Power and High Efficiency Green Light Emitting Diode on Free-Standing Semipolar (1122) Bulk GaN Substrate, Physica Status Solidi (RRL), vol. 1, No. 4, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, Jun. 2008, pp. 221110-1-221110-3.
Schmidt et al., Demonstration of Nonpolar m-Plane InGaN/GaN Laser Diodes, Japanese Journal of Applied Physics, vol. 46, No. 9, Feb. 23, 2007, pp. L190-L191.
Schmidt et al., High Power and High External Efficiency m-Plane InGaN Light Emitting Diodes, Japanese Journal of Applied Physics, vol. 46, No. 7, Feb. 2007, pp. L126-L128.
Schoedl et al., Facet Degradation of GaN Heterostructure Laser Diodes, Journal of Applied Physics, vol. 97, No. 12, Jun. 16, 2005, pp. 123102-1-123102-8.
Schremer et al., Progress in Etched Facet Technology for GaN and Blue Lasers, Proceedings of SPIE, vol. 6473, 2007, pp. 64731F-1-64731F-8.
Sharma et al., Vertically Oriented GaN-based Air-Gap Distributed Bragg Reflector Structure Fabricated Using Band-Gap-Selective Photoelectrochemical Etching, Applied Physics Letters, vol. 87, 2005, pp. 051107-1-051107-3.
Shchekin et al., High Performance Thin-Film Flip-Chip InGaN—GaN Light-Emitting Diodes, Applied Physics Letters, vol. 89, No. 7, Aug. 16, 2006, pp. 071109-1-071109-3.

(56) References Cited

OTHER PUBLICATIONS

Shen et al., Auger Recombination in InGaN Measured by Photoluminescence, Applied Physics Letters, vol. 91, No. 14, Oct. 1, 2007, pp. 141101-1-141101-3.
Sizov et al., 500-nm Optical Gain Anisotropy of Semipolar (1122) InGaN Quantum Wells, Applied Physics Express, vol. 2, No. 7, Jun. 19, 2009, pp. 071001-1-071001-3.
Tomiya et al., Dislocation Related Issues in the Degradation of GaN-Based Laser Diodes, IEEE Journal of Selected Topics in Quantum Electronics, vol. 10, No. 6, Nov.-Dec. 2004, pp. 1277-1286.
Tyagi et al., High Brightness Violet InGan/Gan Light EMitting Diodes on Semipolar (1011) Bulk GaN Substrates, Japanese Journal of Applied Physics, vol. 46, No. 7, Feb. 9, 2007, pp. L129-L131.
Tyagi et al., Partial Strain Relaxation via Misfit Dislocation Generation at Heterointerfaces in (Al,In)GaN Epitaxial Layers Grown on Semipolar (1122) GaN Free Standing Substrates, Applied Physics Letter, vol. 95, No. 25, Dec. 2009, pp. 251905-1-251905-3.
Tyagi et al., Semipolar (1011) InGaN/GaN Laser Diodes on Bulk GaN Substrates, Japanese Journal of Applied Physics, vol. 46, No. 19, May 11, 2007, pp. L444-L445.
Uchida et al., Recent Progress in High-Power Blue-Violet Lasers, IEEE Journal of Selected Topics in Quantum Electronics, vol. 9, No. 5, Sep.-Oct. 2003, pp. 1252-1259.
Waltereit et al., Nitride Semiconductors Free of Electrostatic Fields for Efficient White Light-Emitting Diodes, Nature, vol. 406, Aug. 24, 2000, pp. 865-868.
Wang et al., Ammonothermal Growth of GaN Crystals in Alkaline Solutions, Journal of Crystal Growth, vol. 287, 2006, pp. 376-380.
Weisbuch et al., Recent Results and Latest Views on Microactivity LEDs, Light Emitting Diodes: Research, Manufacturing, and Applications, SPIE, vol. 5366, 2004, pp. 1-19.
Wierer et al., High-Power AlGaInN Flip-Chip Light-Emitting Diodes, Applied Physics Letters, vol. 78, No. 22, May 28, 2001, pp. 3379-3381.
Yamaguchi, Anisotropic Optical Matrix Elements in Strained GaN-Quantum Wells with Various Substrate Orientations, Physica Status Solidi (PSS), vol. 5, No. 6, May 2008, pp. 2329-2332.
Yibing, Phenomenon Analysis and Solution Measure for Blue GaN-Based LEDs Peak Wavelength Blue Moves, Journal of Human University of Technology, vol. 22 No. 3, May 2008, pp. 87-90.
Yoshizumi et al., Continuous-Wave Operation of 520 nm Green InGaN-Based Laser Diodes on Semi-Polar (2021) GaN Substrates, Applied Physics Express, vol. 2, No. 9, Aug. 2009, pp. 092101-1-092101-3.
Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, May 2007, 2 pages.
Zhong et al., Demonstration of High Power Blue-Green Light Emitting Diode on Semipolar (1122) Bulk GaN Substrate, Electronics Letters, vol. 43, No. 15, Jul. 19, 2007, pp. 825-826.
Zhong et al., High Power and High Efficiency Blue Light Emitting Diode on Freestanding Semipolar (1011) Bulk GaN Substrate, Applied Physics Letter, vol. 90, No. 23, Jun. 5, 2007, pp. 233504-1-233504-3.
DE 10 2019 102 181.2, priority document of Schabaker et al. U.S. Publication No. 2020/0241189, (year: 2019).
Machine translation of DE 10 2019 102 181.2, retrieved Nov. 22, 2022 from Google Translate, (year: 2022).
U.S. Appl. No. 16/252,570 Final Office Action mailed May 10, 2023, 64 pages.
U.S. Appl. No. 16/380,217 Non-Final Office Action mailed May 10, 2023, 34 pages.
Merriam Webster, "Collimate," retrieved from https://www.merriam-webster.com/dictionary/collimate on Feb. 10, 2021, 1 page.
Technical Note: Focusing and Collimating, retrieved from https://web.archive.org/web/20171224214042/https://www.newport.com/n/focusing-and-collimating, captured on Jan. 9, 2023, 3 pages.
U.S. Appl. No. 16/252,570 Notice of Allowance mailed Aug. 22, 2023, 12 pages.
International Search Report and Written Opinion for Application No. PCT/US2020/014476, mailed Jun. 9, 2020, 24 pages.
International Search Report and Written Opinion for Application No. PCT/US2020/014479, mailed Apr. 8, 2020, 44 pages.
International Search Report and Written Opinion for Application No. PCT/US2020/038504, mailed Jul. 14, 2020, 11 pages.
International Search Report and Written Opinion for Application No. PCT/US2019/060910, mailed Mar. 12, 2020, 11 pages.
U.S. Appl. No. 16/597,795 Final Office Action mailed Jan. 19, 2023, 47 pages.
U.S. Appl. No. 16/380,217 Final Office Action mailed Jan. 19, 2023, 57 pages.
U.S. Appl. No. 16/380,217 Final Office Action mailed Nov. 6, 2023, 39 pages.
U.S. Appl. No. 16/252,570 Corrected Notice of Allowability mailed Dec. 26, 2023, 7 pages.
U.S. Appl. No. 16/380,217 Notice of Allowance mailed Jan. 25, 2024, 11 pages.
Xu et al., "White Light Emission From Fiber Pigtailed Laser Module", Laser Physics, vol. 19, No. 3, Mar. 31, 2009, pp. 407-409.

* cited by examiner

LASER-BASED LIGHT GUIDE-COUPLED WIDE-SPECTRUM LIGHT SYSTEM

CROSS-REFERENCE TO RELATED APPLICATIONS

This application is a continuation-in-part of U.S. application Ser. No. 16/597,791, filed Oct. 9, 2019, which is a continuation-in-part of U.S. application Ser. No. 16/380,217, filed Apr. 10, 2019, which is a continuation-in-part of U.S. application Ser. No. 16/252,570, filed Jan. 18, 2019, the entire contents of each of which are incorporated herein by reference in their entirety for all purposes.

BACKGROUND

The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb.

SUMMARY

The present invention provides a laser-based light guide-coupled wide-spectrum light system or apparatus configured with a gallium and nitrogen containing laser diode, a wavelength converter member such as a phosphor, and a light guide (e.g., cable or fiber member) to transport the laser-based light to a desired illumination location to provide illumination. In some embodiments the wide-spectrum light is transported with an optical transport fiber from the laser-based source to a remote illumination location. The high luminance provided by laser-based wide-spectrum light sources can enable substantially higher optical coupling efficiencies of the wide-spectrum light into an optical transport cable versus other solid-state lighting technologies such as LED technology. For example, laser-based wide-spectrum light sources can provide a luminance in the 500-1,000 cd/mm$^2$ range, in the 1,000 to 2,000 cd/mm$^2$ range, or in the 2,000 to 20,000 cd/mm$^2$ range, or in a higher range. These high luminance values range from about 2.5 times to about 100 times greater than LED sources. This drastically higher brightness or luminance can enable a substantially superior optical coupling efficiency in fiber optic cable. For example, for a 1 mm diameter core fiber optical cable, the coupling efficiency for the laser-based wide-spectrum light source may be in the range of 50% to about 90%. For the LED based wide-spectrum light source, the optical coupling efficiency may be in the range of 2% to about 10% for the same fiber optic cable. In short, the high brightness of the laser-based wide-spectrum light source provides an enabling superiority of the wide-spectrum light coupling efficiency into a transport fiber versus the LED source. Therefore, the laser-based wide-spectrum light source provides novel and unique opportunities to generate wide-spectrum light systems and devices that provide strong benefits over LED.

The benefits of the present invention include but are not limited to an improved efficiency wide-spectrum light system such as wide-spectrum light systems in residential or commercial applications, cost reductions of lighting system, improved wide-spectrum lighting performance, adjustability and tune ability of the of the light characteristics such as the brightness or the color qualities. Additional benefits of the present invention include an improved styling and lighting aesthetics that result from the high luminance laser-based wide-spectrum light sources enabling highly efficient coupling of the wide-spectrum light into a fiber optic cable for transport to novel emitting configurations not possible with other wide-spectrum lighting technologies.

Specific embodiments of this invention employ a transferred gallium and nitrogen containing material process for fabricating laser diodes or other gallium and nitrogen containing devices (as shown in U.S. Pat. Nos. 9,666,677 and 9,379,525, the entire contents of which are incorporated herein by reference in their entirety for all purposes) enabling benefits over conventional fabrication technologies.

The present invention provides a device and method for an integrated wide-spectrum colored electromagnetic radiation source using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials, such as yellow phosphors configured with designated scattering centers on an excitation surface or inside a bulk, to form a compact, high-brightness, and highly-efficient, wide-spectrum light source. In an example, the source can be provided for specialized applications, among general applications, and the like.

In all embodiments, the term "wide-spectrum" includes all possible color spectrum in the visible (400 nm to 700 nm) and invisible (infrared, >700 nm or ultra violet, <400 nm) and could be as wide as 0.5 nanometers or multiple hundreds of nanometers. The spectrum could be white by means of using a light convertor, yellow by means of filtering of white light or specific color convertor, blue using direct light from laser diode, green using green phosphor convertor, doubling wavelength crystal or using light directly emitted by a green laser diode, direct or converted violet to be used for disinfection for example, red using either the direct light from a red laser diode or using a red phosphor convertor. The spectrum could be infrared (IR) using laser for IR illumination for applications such as night vision, machine vision, sensing, and communication.

In various embodiments, the laser device and phosphor device are mounted on a common support member with or without intermediate submounts and the phosphor materials are operated in a transmissive mode, a reflective mode, or a side-pumped mode to result in a wide-spectrum emitting laser-based light source. Merely by way of example, the invention can be applied to applications such as white or infrared lighting, white or infrared spot lighting, general lighting, specialty lighting, dynamic lighting, smart lighting, flash lights, automobile headlights, automobile interior lighting, automobile position lighting and any lighting function, mobile machine lighting such as autonomous machine lighting and drone lighting, all-terrain vehicle lighting, flash sources such as camera flashes, light, sensing, or communication sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, frequency doubling systems such as second harmonic generation (SHG) systems, SHG systems combined with nonlinear crystals for producing wavelengths in the 200 nm to 400 nm range, wearable displays, augmented reality systems, mixed reality systems, virtual reality systems, high intensity lamps, spectroscopy, entertainment, theater, music, and concerts, analysis fraud detection and/or authenticating, tools, purification, sterilization, anti-virus, anti-bacterial, water treatment, security systems, laser dazzlers, targeting, communications, LiFi, visible light communications (VLC), sensing, detecting, distance detecting, Light Detection And Ranging (LIDAR), smart infrastructure such as smart factories or smart homes, transformations, transportations, leveling, curing and other chemical treatments, heating, cutting and/or ablating, welding, marking, laser direct imaging, pumping other optical devices, other optoelectronic devices and related applications, storage systems, quantum computing, quantum cryptography, quantum storage, and source lighting and the like.

The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In alternative embodiments laser diodes with multiple parallel adjacent emitter stripes can be configured to result in a wider and/or more powerful excitation spot on the phosphor. By making the spot wider in the lateral direction the spot could become more circular to the faster divergence angle of the laser emission in the vertical direction. For example, two or more laser stripes may be spaced by 10-30 µm, 30-60 µm, 60-100 µm, or 100-300 µm. In some embodiments the parallel stripes have slightly detuned wavelengths for an improved color quality. In other embodiments free space optics such as collimating lenses can be used to shape the beam prior to incidence on the phosphor. In one example, a re-imaging optic is used to reflect and reshape the beam onto the phosphor member. In an alternative example, the otherwise wasted reflected incident light from the phosphor is recycled with a re-imaging optic by being reflected back to the phosphor.

The phosphor material can be operated in a transmissive mode, a reflective mode, or a combination of a transmissive mode and reflective mode, or a side-pumped mode, or other modes. The phosphor material is characterized by a conversion efficiency, a resistance to thermal damage, a resistance to optical damage, a thermal quenching characteristic, a porosity to scatter excitation light, and a thermal conductivity. The phosphor may have an intentionally roughened surface to increase the light extraction from the phosphor. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The wide-spectrum light apparatus also has an electrical input interface configured to couple electrical input power to the laser diode device to generate the laser beam and excite the phosphor material. The wide-spectrum light source configured to produce greater than 1 lumen, 10 lumens, 100 lumens, 250 lumens, 500 lumens, 1000 lumens, 3000 lumens, or 10000 lumens of wide-spectrum light output. The support member is configured to transport thermal energy from the at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, alumina, SiC, sapphire, AlN, diamond, or other metals, ceramics, or semiconductors.

In accordance with an embodiment, a laser-based fiber-coupled wide-spectrum light system includes a wide-spectrum light source module located at a source position. The wide-spectrum light source module includes laser devices each comprising a gallium and nitrogen containing material and configured as an excitation source, each of the laser devices comprising an output facet configured to output a laser electromagnetic radiation with a first wavelength ranging from 385 nm to 495 nm; one or more phosphor members each configured as a wavelength converter and an emitter and disposed to allow a primary surface of the one or more phosphor members to receive the laser electromagnetic radiation from the laser devices; an angle of incidence configured between the laser electromagnetic radiation from each of the laser devices and the primary surface of the one or more phosphor members, the one or more phosphor members configured to convert at least a fraction of the laser electromagnetic radiation with the first wavelength to a phosphor emission with a second wavelength that is longer than the first wavelength; and a light-emission mode characterizing the one or more phosphor members with wide-spectrum emissions being generated from at least an interaction of the laser electromagnetic radiation with the phosphor emission, the wide-spectrum emissions comprising of a mixture of wavelengths characterized by at least the second wavelength from the one or more phosphor members. The laser-based fiber-coupled wide-spectrum light system also includes multiple fibers each configured to have a first end to couple with one of the wide-spectrum emissions to output the respective wide-spectrum emission to a second end.

In an embodiment, the wide-spectrum light source module comprises a surface-mount device (SMD) type package.

In another embodiment, the wide-spectrum light source module comprises a package selected from a flat package, TO9 Can, TO56 Can, TO-5 can, TO-46 can, CS-Mount, G-Mount, C-Mount, and micro-channel cooled package.

In another embodiment, the wide-spectrum light source module is configured to generate the wide-spectrum emissions each from a source diameter of about 0.10 mm to about 3 mm and a luminous flux of about 100 lumens to about 2000 lumens or greater.

In another embodiment, the multiple fibers comprise waveguides laid on a 2-dimensional substrate or optical fiber cables disposed in a one-dimensional configuration.

In another embodiment, the multiple fibers comprise a glass fiber or a plastic fiber with core diameter of about 100 um to about 2 mm or greater, and the fiber core can be configured from a solid core fiber, a fiber bundle core, or a combination of solid core and fiber bundle type fibers.

In another embodiment, the multiple fibers are directly coupled to the wide-spectrum light source modules, or the multiple fibers comprise leaky fibers coupled to respective second ends of the multiple fibers to deliver the wide-spectrum emissions.

In yet another embodiment, the laser-based fiber-coupled wide-spectrum light system also includes an optics member arranged to receive the wide-spectrum emissions from the wide-spectrum light source module and focus the wide-spectrum emissions onto respective first ends of the multiple fibers.

In accordance with another embodiment, a laser-based fiber-coupled wide-spectrum light system includes a wide-spectrum light source disposed at a source position. The wide-spectrum light source includes a laser device comprising a gallium and nitrogen containing material and configured as an excitation source, the laser device comprising an output facet configured to output a laser electromagnetic emission with a first wavelength ranging from 385 nm to 495 nm; a phosphor member configured as a wavelength converter and an emitter and disposed to convert the laser electromagnetic emission to emit a second electromagnetic radiation with a second wavelength longer than the first wavelength; and a light-emission mode characterizing the phosphor member with a wide-spectrum light emission being generated from at least an interaction of the laser electromagnetic radiation with the second electromagnetic emission as a mixture of wavelengths characterized by at least the second wavelength from the phosphor member. The laser-based fiber-coupled wide-spectrum light system also includes an optics member configured to split the wide-spectrum light emission into multiple wide-spectrum light emissions, and multiple transport fibers each arranged to couple with one of the multiple wide-spectrum light emissions.

In an embodiment, the light-emission mode characterizing the phosphor member with the wide-spectrum light emission comprises one of a reflection mode or a transmission mode, wherein in the reflection mode the wide-spectrum light emission is emitted from the same surface of the phosphor member that the laser electromagnetic emission is incident upon, and in the transmission mode the wide-spectrum light emission is emitted from at least a different surface of the phosphor member than the laser electromagnetic emission is incident upon.

In another embodiment, the optics member comprises one or more mirrors or one or more prisms configured to split the wide-spectrum light emission into the multiple wide-spectrum light emissions.

In another embodiment, the optics member is configured to split the wide-spectrum light emission into the multiple wide-spectrum light emissions and image each of the wide-spectrum light emissions onto an input end of a respective one of the multiple transport fibers.

In another embodiment, the laser-based fiber-coupled wide-spectrum light system also includes a housing configured to provide alignment between the wide-spectrum light source, the optics member, and the multiple transport fibers.

In yet another embodiment, the optics member comprises one or more lenses to image the wide-spectrum light emission.

In accordance with another embodiment, a laser-based fiber-coupled wide-spectrum light system includes a wide-spectrum light source disposed at a source position. The wide-spectrum light source includes a laser device comprising a gallium and nitrogen containing material and configured as an excitation source, the laser device comprising an output facet configured to output a laser electromagnetic emission with a first wavelength ranging from 385 nm to 495 nm; a phosphor member configured as a wavelength converter and an emitter and disposed to convert the laser electromagnetic emission to emit a second electromagnetic radiation with a second wavelength longer than the first wavelength; and a light-emission mode characterizing the phosphor member with a wide-spectrum light emission being generated from at least an interaction of the laser electromagnetic radiation with the second electromagnetic emission as a mixture of wavelengths characterized by at least the second wavelength from the phosphor member. The laser-based fiber-coupled wide-spectrum light system also includes a non-imaging optics member configured to focus the wide-spectrum light emission by reflecting the wide-spectrum light emission a single time, and a transport fiber configured with a first end to receive the focused wide-spectrum light emission.

In an embodiment, the non-imaging optics member comprises an ellipsoidal total internal reflection lens.

In another embodiment, the non-imaging optics member comprises a total internal reflection lens having an aperture, and the wide-spectrum light source is arranged so that the wide-spectrum light emission passes through the aperture.

A further understanding of the nature and advantages of the present invention may be realized by reference to the latter portions of the specification and attached drawings.

BRIEF DESCRIPTION OF THE DRAWINGS

The following drawings are merely examples for illustrative purposes according to various disclosed embodiments and are not intended to limit the scope of the present invention.

DETAILED DESCRIPTION

Figure 1:
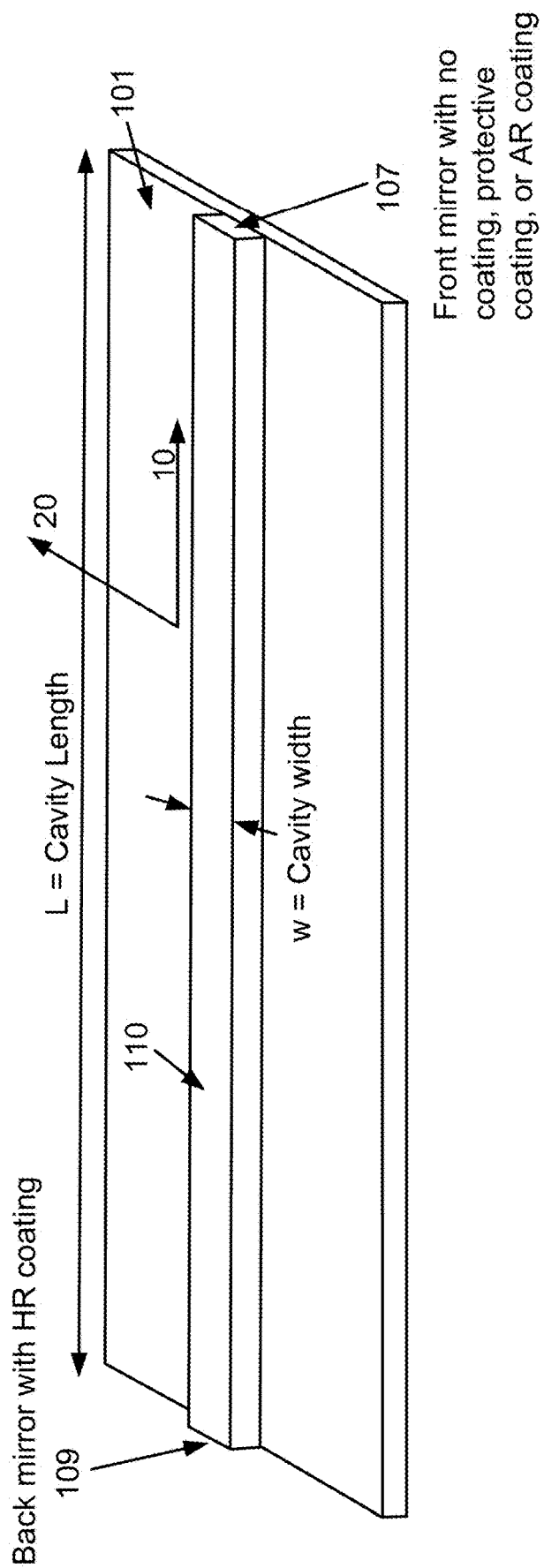
FIG. 1 is a simplified schematic diagram of a laser diode formed on a gallium and nitrogen containing substrate with the cavity aligned in a direction ended with cleaved or etched mirrors according to some embodiments of the present invention.

The present invention provides a method and device for emitting wide-spectrum colored electromagnetic radiation using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials to form a compact, high-brightness, and highly-efficient, wide-spectrum light source. As used herein a wide-spectrum light source may include white light or a combination of white light and infrared (IR), ultraviolet (UV), and/or other wavelengths.

Additional benefits are achieved over pre-existing techniques using the present invention. In particular, the present invention enables a cost-effective laser-based remotely delivered wide-spectrum light source. In a specific embodiment, the present optical device can be manufactured in a relatively simple and cost-effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the wide-spectrum source is configured from a laser chip on submount (CoS) with the laser light being delivered by a light guide to a phosphor supported on a remotely disposed submount and/or a remote support member to form a remotely-delivered wide-spectrum light source. In some embodiments, the light guide is a semiconductor light guide integrated on an intermediate submount coupled with the CoS. In some embodiments the light guide includes an optical fiber disposed substantially free in space or in custom layout, making the wide-spectrum light source a fiber-delivered wide-spectrum light source. In some embodiments the wide-spectrum light source includes beam collimation and focus elements to couple the laser light into the light guide or fiber. In some embodiments, the wide-spectrum light source includes multiple laser chips either independently or co-packaged in a same package case and the phosphor member are supported in a separate submount heatsink packaged in a remote case. In some embodiments there could be additional beam shaping optical elements included for shaping or controlling the wide-spectrum light out of the phosphor.

In various embodiments, the laser device and phosphor device are separately packaged or mounted on respective support member and the phosphor materials are operated in a reflective mode to result in a wide-spectrum emitting laser-based light source. In additional various embodiments, the electromagnetic radiation from the laser device is remotely coupled to the phosphor device through means such as free space coupling or coupling with a light guide such as a fiber optic cable or other solid light guide material, and wherein the phosphor materials are operated in a reflective mode to result in a wide-spectrum emitting laser-based light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, autonomous vehicles, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) greater than 10,000 times higher than conventional LEDs and the extreme directionality of the laser emission, laser diodes enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 µm in diameter, less than 100 µm in diameter, or even less than 50 µm in diameter, power densities of over 1 W/mm², 100 W/mm², or even over 2,500 W/mm² can be achieved. When this very small and powerful beam of laser excitation light is incident on a phosphor material the ultimate point source of wide-spectrum light can be achieved. Assuming a phosphor conversion ratio of 200 lumens of emitted wide-spectrum light per optical watt of excitation light, a 5 W excitation power could generate 1000 lumens in a beam diameter of 100 µm, or 50 µm, or less. Such a point source is game changing in applications such as spotlighting or range finding where parabolic reflectors or lensing optics can be combined with the point source to create highly collimated wide-spectrum light spots that can travel drastically higher distances than ever possible before using LEDs or bulb technology.

FIG. 1 is a simplified schematic diagram of a laser diode formed on a gallium and nitrogen containing substrate with the cavity aligned in a direction ended with cleaved or etched mirrors according to some embodiments of the present invention. In an example, the substrate surface 101 is a polar c-plane and the laser stripe region 110 is characterized by a cavity orientation substantially in an m-direction 10, which is substantially normal to an a-direction 20, but can be others such as cavity alignment substantially in the a-direction. The laser strip region 110 has a first end 107 and a second end 109 and is formed on an m-direction on a {0001} gallium and nitrogen containing substrate having a pair of cleaved or etched mirror structures, which face each other. In another example, the substrate surface 101 is a semipolar plane and the laser stripe region 110 is characterized by a cavity orientation substantially in a projection of a c-direction 10, which is substantially normal to an a-direction 20, but can be others such as cavity alignment substantially in the a-direction. The laser strip region 110 has a first end 107 and a second end 109 and is formed on a semipolar substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing substrate. Optionally, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In some embodiments, the GaN substrate has threading dislocations, at a concentration between about $10^5$ cm$^{-2}$ and about $10^8$ cm$^{-2}$, in a direction that is substantially orthogonal or oblique with respect to the surface.

The exemplary laser diode devices in FIG. 1 have a pair of cleaved or etched mirror structures 109 and 107, which face each other. The first cleaved or etched facet 109 comprises a reflective coating and the second cleaved or etched facet 107 comprises no coating, an antireflective coating, or exposes gallium and nitrogen containing material. The first cleaved or etched facet 109 is substantially parallel with the second cleaved or etched facet 107. The first and second cleaved facets 109 and 107 are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The reflective coating is selected from silicon dioxide, hafnia, and titania, tantalum pentoxide, zirconia, aluminum oxide, aluminum nitride, and aluminum oxynitride including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for a ridge laser. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in a different patterns and profiles. In some embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 µm deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as non-radiative recombination centers and hence reduce the catastrophic optical mirror damage (COMD) threshold. CAIBE is known to provide very smooth and low damage sidewalls due to the chemical nature of the etch, while it can provide highly vertical etches due to the ability to tilt the wafer stage to compensate for any inherent angle in etch.

The laser stripe 110 is characterized by a length and width. The length ranges from about 50 µm to about 3000 µm, but is preferably between about 10 µm and about 400 µm, between about 400 µm and about 800 µm, or about 800 µm and about 1600 µm, but could be others. The stripe also has a width ranging from about 0.5 µm to about 50 µm, but is preferably between about 0.8 µm and about 2.5 µm for single lateral mode operation or between about 2.5 µm and about 50 µm for multi-lateral mode operation, but can be other dimensions. In a specific embodiment, the present device has a width ranging from about 0.5 µm to about 1.5 µm, a width ranging from about 1.5 µm to about 3.0 µm, a width ranging from about 3.0 µm to about 50 µm, and others. In a specific embodiment, the width is substantially constant in dimension, although there may be slight variations. The width and length are often formed using a masking and etching process, which are commonly used in the art.

The laser stripe region 110 is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

In a specific embodiment, the laser device may emit red light with a center wavelength between 600 nm and 750 nm. Such a device may comprise layers of varying compositions of $Al_xIn_yGa_{1-x-y}As_zP_{1-z}$, where $x+y \leq 1$ and $z \leq 1$. The red laser device comprises at least an n-type and p-type cladding layer, an n-type SCH of higher refractive index than the n-type cladding, a p-type SCH of higher refractive index than the p-type cladding and an active region where light is emitted. In a specific embodiment, the laser stripe is provided by an etching process selected from dry etching or wet etching. In a preferred embodiment, the etching process is dry, but can be others. The device also has an overlying dielectric region, which exposes the contact region. In a specific embodiment, the dielectric region is an oxide such as silicon dioxide, but can be others. Of course, there can be other variations, modifications, and alternatives. The laser stripe is characterized by a length and width. The length ranges from about 50 µm to about 3000 µm, but is preferably between 10 µm and 400 µm, between about 400 µm and 800 µm, or about 800 µm and 1600 µm, but could be others such as greater than 1600 µm. The stripe also has a width ranging from about 0.5 µm to about 80 µm, but is preferably between 0.8 µm and 2.5 µm for single lateral mode operation or between 2.5 µm and 60 µm for multi-lateral mode operation, but can be other dimensions. The laser strip region has a first end and a second end having a pair of cleaved or etched mirror structures, which face each other. The first facet comprises a reflective coating and the second facet comprises no coating, an antireflective coating, or exposes gallium and nitrogen containing material. The first facet is substantially parallel with the second cleaved or etched facet.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 420 to 470 nm); green (e.g., 500 to 540 nm), or others. In a preferred embodiment, the spontaneously emitted light is highly polarized and is characterized by a polarization ratio of greater than 0.4. In another specific embodiment on a semipolar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 501 nm and greater light in a ridge laser embodiment. The device is provided with a of the following epitaxially grown elements:

an n-GaN or n-AlGaN cladding layer with a thickness from 100 nm to 3000 nm with Si doping level of $5 \times 10^{17}$ $cm^{-3}$ to $3 \times 10^{18}$ $cm^{-3}$;

an n-side SCH layer comprised of InGaN with molar fraction of indium of between 2% and 15% and thickness from 20 nm to 250 nm;

a single quantum well or a multiple quantum well active region comprised of at least two 2.0 nm to 8.5 nm InGaN quantum wells separated by 1.5 nm and greater, and optionally up to about 12 nm, GaN or InGaN barriers;

a p-side SCH layer comprised of InGaN with molar a fraction of indium of between 1% and 10% and a thickness from 15 nm to 250 nm or an upper GaN-guide layer;

an electron blocking layer comprised of AlGaN with molar fraction of aluminum of between 0% and 22% and thickness from 5 nm to 20 nm and doped with Mg;

a p-GaN or p-AlGaN cladding layer with a thickness from 400 nm to 1500 nm with Mg doping level of $2 \times 10^{17}$ $cm^{-3}$ to $2 \times 10^{19}$ cm-3; and a $p^{++}$-GaN contact layer with a thickness from 20 nm to 40 nm with Mg doping level of $1 \times 10^{19}$ $cm^{-3}$ to $1 \times 10^{21}$ $cm^{-3}$.

A gallium and nitrogen containing laser diode laser device may also include other structures, such as a surface ridge architecture, a buried heterostructure architecture, and/or a plurality of metal electrodes for selectively exciting the active region. For example, the active region may comprise first and second gallium and nitrogen containing cladding layers and an indium and gallium containing emitting layer positioned between the first and second cladding layers. A laser device may further include an n-type gallium and nitrogen containing material and an n-type cladding material overlying the n-type gallium and nitrogen containing material. In a specific embodiment, the device also has an overlying n-type gallium nitride layer, an active region, and an overlying p-type gallium nitride layer structured as a laser stripe region. Additionally, the device may also include an n-side separate confinement heterostructure (SCH), p-side guiding layer or SCH, p-AlGaN EBL, among other features. In a specific embodiment, the device also has a p++ type gallium nitride material to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about $10^{19}$ to $10^{21}$ Mg/am³, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high-quality epitaxial layer overlying the n-type gallium nitride layer. In some embodiments the high-quality layer is doped, for example, with Si or O to form n-type material, with a dopant concentration between about $10^{16}$ $cm^{-3}$ and $10^{20}$ $cm^{-3}$.

Figure 2:
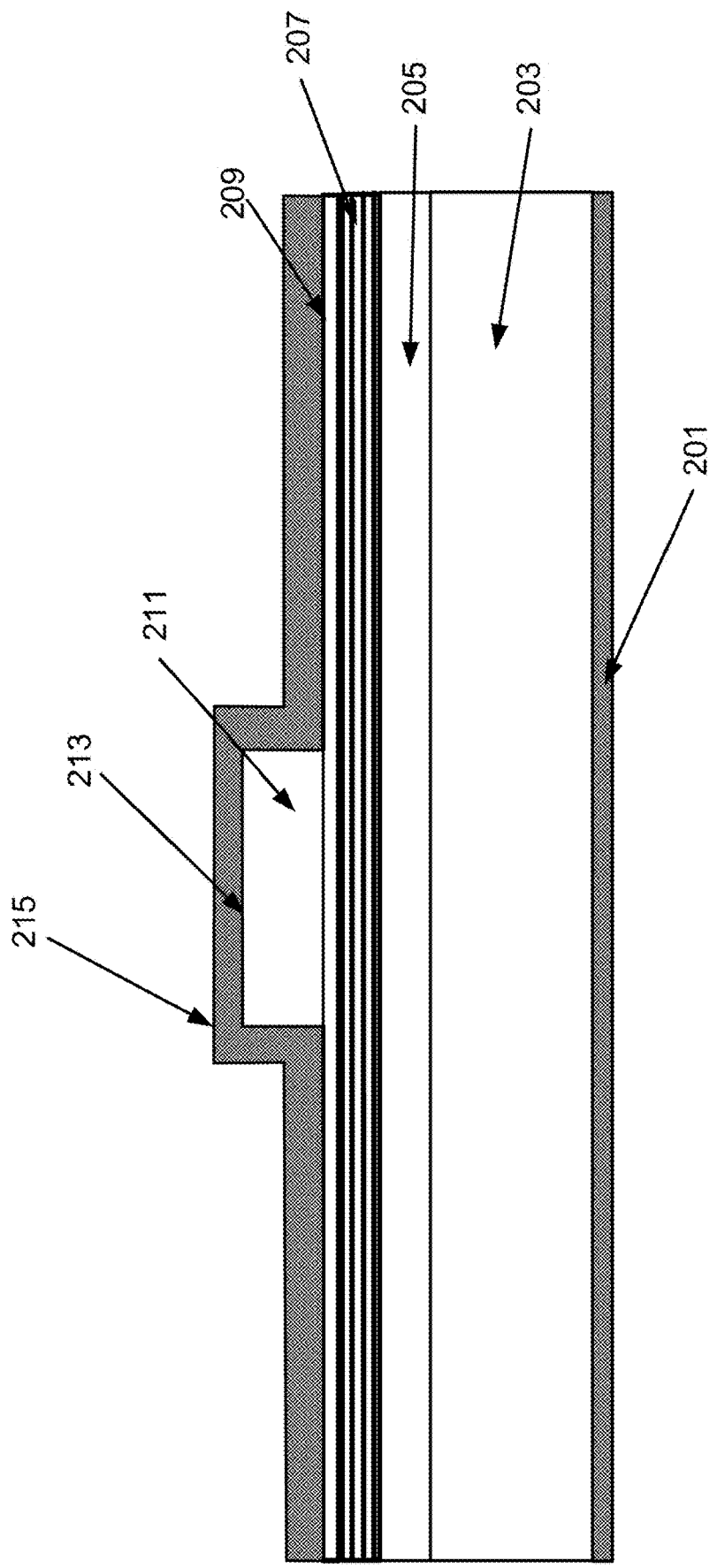
FIG. 2 is a cross-sectional view of a laser device according to an embodiment of the present invention.

FIG. 2 is a cross-sectional view of a laser device 200 according to some embodiments of the present disclosure. As shown, the laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high-quality epitaxial layer overlying the n-type gallium nitride layer. In some embodiments the high-quality layer is doped, for example, with Si or O to form n-type material, with a dopant concentration between about $10^{16}$ cm$^{-3}$ and $10^{20}$ cm$^{-3}$.

An n-type $Al_uIn_vGa_{1-u-v}N$ layer, where $0 \le u, v, u+v \le 1$, is deposited on the substrate. The carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes a contact region 213. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au), or a combination thereof. In some embodiments, barrier layers and more complex metal stacks are included.

Active region 207 preferably includes one to ten quantum-well regions or a double heterostructure region for light emission. Following deposition of the n-type layer to achieve a desired thickness, an active layer is deposited. The quantum wells are preferably InGaN with GaN, AlGaN, InAlGaN, or InGaN barrier layers separating them. In other embodiments, the well layers and barrier layers comprise $Al_wIn_xGa_{1-w-x}N$ and $Al_yIn_zGa_{1-y-z}N$, respectively, where $0 \le w, x, y, z, w+x, y+z \le 1$, where w<x, y and/or x>v, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise $Al_sIn_tGa_{1-s-t}N$, where $0 \le s, t, s+t \le 1$, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes the contact region 213.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIG. 1 and FIG. 2 and described above are typically suitable for low-power applications.

In various embodiments, the present invention realizes high output power from a diode laser is by widening a portion of the laser cavity member from the single lateral mode regime of 1.0-3.0 μm to the multi-lateral mode range 5.0-20 μm. In some cases, laser diodes having cavities at a width of 50 μm or greater are employed.

The laser stripe length, or cavity length ranges from 100 to 3000 μm and employs growth and fabrication techniques such as those described in U.S. patent application Ser. No. 12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

Optionally, FIG. 2 illustrates an example cross-sectional diagram of a gallium and nitrogen based laser diode device. The epitaxial device structure is formed on top of the gallium and nitrogen containing substrate member 203. The substrate member may be n-type doped with O and/or Si doping. The epitaxial structures will contain n-side layers 205 such as an n-type buffer layer comprised of GaN, AlGaN, AlINGaN, or InGaN and n-type cladding layers comprised of GaN, AlGaN, or AlInGaN. The n-typed layers may have thickness in the range of 0.3 μm to about 3 μm or to about 5 μm and may be doped with an n-type carrier such as Si or O to concentrations between $1 \times 10^{16}$ cm$^{-3}$ to $1 \times 10^{19}$ cm$^{-3}$. Overlying the n-type layers is the active region and waveguide layers 207. This region could contain an n-side waveguide layer or separate confinement heterostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double heterostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlINGaN, or a combination thereof. The thickness of the p-type cladding layers is in the range of 0.3 µm to about 2 µm and is doped with Mg to a concentration of between $1 \times 10^{16}$ cm$^{-3}$ to $1 \times 10^{19}$ cm$^{-3}$. A ridge 211 is formed in the p-cladding region for lateral confinement in the waveguide using an etching process selected from a dry etching or a wet etching process. A dielectric material 213 such as silicon dioxide or silicon nitride or deposited on the surface region of the device and an opening is created on top of the ridge to expose a portion of the p++ GaN layer. A p-contact 215 is deposited on the top of the device to contact the exposed p++ contact region. The p-type contact may be comprised of a metal stack containing a of Au, Pd, Pt, Ni, Ti, or Ag and may be deposited with electron beam deposition, sputter deposition, or thermal evaporation. A n-contact 201 is formed to the bottom of the substrate member. The n-type contact may be comprised of a metal stack containing Au, Al, Pd, Pt, Ni, Ti, or Ag and may be deposited with electron beam deposition, sputter deposition, or thermal evaporation.

In multiple embodiments according to the present invention, the device layers comprise a super-luminescent light emitting diode or SLED. In all applicable embodiments a SLED device can be interchanged with or combined with laser diode devices according to the methods and architectures described in this invention. A SLED is in many ways similar to an edge emitting laser diode; however, the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode.

In an embodiment, the LD or SLED device is characterized by a ridge with non-uniform width. The ridge is comprised by a first section of uniform width and a second section of varying width. The first section has a length between 100 and 500 µm long, though it may be longer. The first section has a width of between 1 and 2.5 µm, with a width preferably between 1 and 1.5 µm. The second section of the ridge has a first end and a second end. The first end connects with the first section of the ridge and has the same width as the first section of the ridge. The second end of the second section of the ridge is wider than the first section of the ridge, with a width between 5 and 50 µm and more preferably with a width between 15 and 35 µm. The second section of the ridge waveguide varies in width between its first and second end smoothly. In some embodiments the second derivative of the ridge width versus length is zero such that the taper of the ridge is linear. In some embodiments, the second derivative is chosen to be positive or negative. In general, the rate of width increase is chosen such that the ridge does not expand in width significantly faster than the optical mode. In specific embodiments, the electrically injected area is patterned such that only a part of the tapered portion of the waveguide is electrically injected.

In an embodiment, multiple laser dice emitting at different wavelengths are transferred to the same carrier wafer in close proximity to one another; preferably within one millimeter of each other, more preferably within about 200 micrometers of each other and most preferably within about 50 µm of each other. The laser die wavelengths are chosen to be separated in wavelength by at least twice the full width at half maximum of their spectra. For example, three dice, emitting at 440 nm, 450 nm and 460 nm, respectively, are transferred to a single carrier chip with a separation between die of less than 50 µm and die widths of less than 50 µm such that the total lateral separation, center to center, of the laser light emitted by the die is less than 200 µm. The closeness of the laser die allows for their emission to be easily coupled into the same optical train or fiber optic light guide or projected in the far field into overlapping spots. In a sense, the lasers can be operated effectively as a single laser light source.

Such a configuration offers an advantage in that each individual laser light source could be operated independently to convey information using for example frequency and phase modulation of an RF signal superimposed on DC offset. The time-averaged proportion of light from the different sources could be adjusted by adjusting the DC offset of each signal. At a receiver, the signals from the individual laser sources would be demultiplexed by use of notch filters over individual photodetectors that filter out both the phosphor derived component of the wide-spectrum light spectra as well as the pump light from all but one of the laser sources. Such a configuration would offer an advantage over an LED based visible light communication (VLC) source in that bandwidth would scale easily with the number of laser emitters. Of course, a similar embodiment with similar advantages could be constructed from SLED emitters.

After the laser diode chip fabrication as described above, the laser diode can be mounted to a submount. In some examples the submount is comprised of AlN, SiC, BeO, diamond, or other materials such as metals, ceramics, or composites. Alternatively, the submount can be an intermediate submount intended to be mounted to the common support member wherein the phosphor material is attached. The submount member may be characterized by a width, length, and thickness. In an example wherein the submount is the common support member for the phosphor and the laser diode chip the submount would have a width and length ranging in dimension from about 0.5 mm to about 5 mm or to about 15 mm and a thickness ranging from about 150 μm to about 2 mm. In the example wherein the submount is an intermediate submount between the laser diode chip and the common support member it could be characterized by width and length ranging in dimension from about 0.5 mm to about 5 mm and the thickness may range from about 50 μm to about 500 μm. The laser diode is attached to the submount using a bonding process, a soldering process, a gluing process, or a combination thereof. In one embodiment the submount is electrically isolating and has metal bond pads deposited on top. The laser chip is mounted to at least one of those metal pads. The laser chip can be mounted in a p-side down or a p-side up configuration. After bonding the laser chip, wire bonds are formed from the chip to the submount such that the final chip on submount (CoS) is completed and ready for integration.

Figure 3:
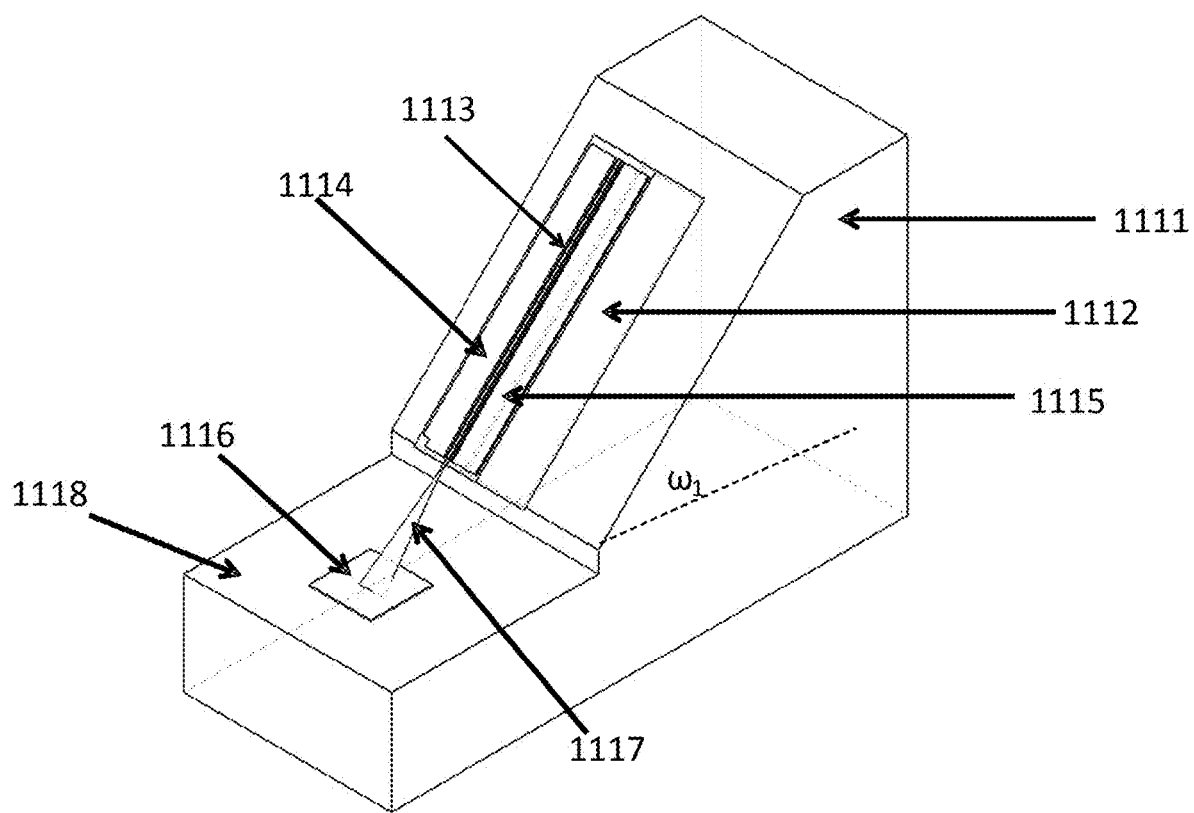
FIG. 3 is a simplified diagram illustrating an integrated laser-based wide-spectrum light source with a laser diode and a phosphor member integrated onto a common support member wherein the phosphor member is configured for reflective operation and the laser beam has an off-normal incidence to the phosphor member according to an embodiment of the present invention.

FIG. 3 presents a schematic diagram illustrating an off-axis reflective mode embodiment of a CPoS integrated wide-spectrum light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser-based CPoS wide-spectrum light device is comprised of a common support member 1111 that serves as the common support member configured to act as an intermediate material between a laser diode or laser diode CoS 1112 formed in transferred gallium and nitrogen containing epitaxial layers 1113 and a final mounting surface and as an intermediate material between the phosphor plate material 1116 and a final mounting surface. The laser diode or CoS 1112 is configured with electrodes 1114 and 1115 that may be formed with deposited metal layers and combination of metal layers including, but not limited to Au, Pd, Pt, Ni, Al, titanium, or others. A laser beam 1117 excites a phosphor plate 1116 positioned in front of the output laser facet. The phosphor plate 1116 is attached to the common support member on a flat surface 1118. The electrodes 1114 and 1115 are configured for an electrical connection to an external power source such as a laser driver, a current source, or a voltage source. Wirebonds can be formed on the electrodes to couple electrical power to the laser diode device 1112 to generate the laser beam 1117 output from the laser diode and incident on the phosphor 1116. Of course, this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

Figure 4:
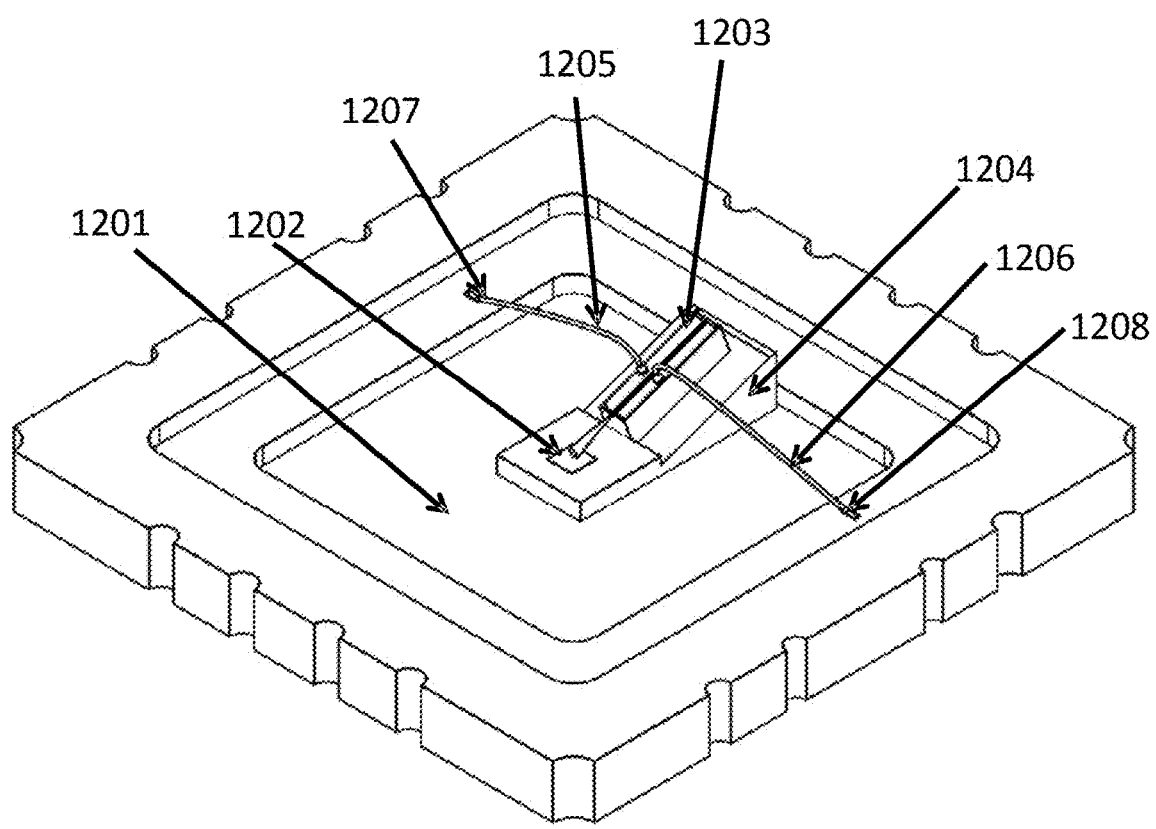
FIG. 4 is a simplified diagram illustrating a reflective mode phosphor member integrated laser-based wide-spectrum light source mounted in a surface mount package according to an embodiment of the present invention.

An example of a packaged CPoS wide-spectrum light source according to the present invention is provided in a reflective mode wide-spectrum light source configured in a surface mount device (SMD) type package. FIG. 4 is a simplified diagram illustrating a reflective mode phosphor integrated laser-based wide-spectrum light source mounted in a surface mount package according to an embodiment of the present invention. In this example, a reflective mode wide-spectrum light source is configured in a surface mount device (SMD) type package. The example SMD package has a base member 1201 with the reflective mode phosphor member 1202 mounted on a support member or on a base member. The laser diode device 1203 may be mounted on a support member 1204 or a base member. The support member and base members are configured to conduct heat away from the phosphor member and laser diode members. The base member is comprised of a thermally conductive material such as copper, copper tungsten, aluminum, SiC, steel, diamond, composite diamond, AlN, sapphire, or other metals, ceramics, or semiconductors. The mounting to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diode are made to using wirebonds 1205 and 1206 to internal feedthroughs 1207 and 1208. The feedthroughs are electrically coupled to external leads. The external leads can be electrically coupled to a power source to electrify the wide-spectrum light source and generate wide-spectrum light emission. The top surface of the base member 1201 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful wide-spectrum light output. In this configuration the wide-spectrum light source is not capped or sealed such that is exposed to the open environment. In some examples of this embodiment of the integrated wide-spectrum light source apparatus, an electrostatic discharge (ESD) protection element such as a transient voltage suppression (TVS) element is included. Of course, FIG. 4 is merely an example and is intended to illustrate one possible simple configuration of a surface mount packaged wide-spectrum light source. Specifically, since surface mount type packages are widely popular for LEDs and other devices and are available off the shelf they could be one option for a low cost and highly adaptable solution.

Figure 5:
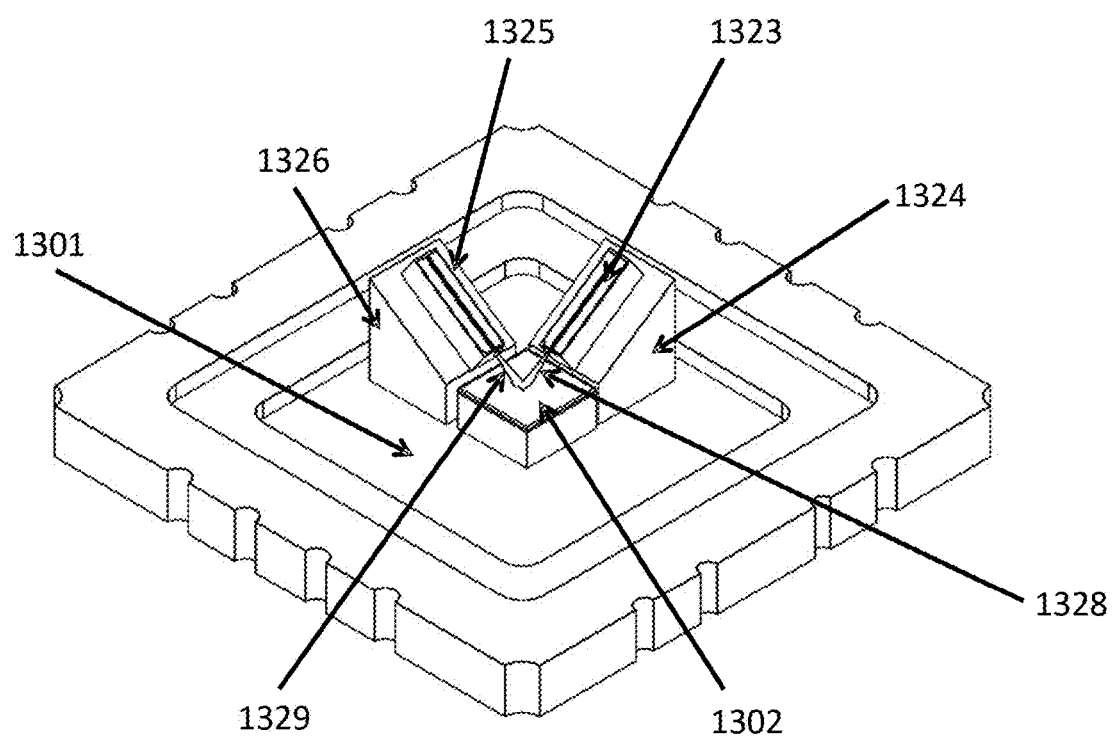
FIG. 5 is a simplified diagram illustrating a reflective mode phosphor member integrated laser-based wide-spectrum light source with multiple laser diode devices mounted in a surface mount package according to an embodiment of the present invention.

An alternative example of a packaged wide-spectrum light source including 2 laser diode chips according to the present invention is provided in the schematic diagram of FIG. 5. In this example, a reflective mode wide-spectrum light source is configured in a surface mount device (SMD) type package. The example SMD package has a base member 1301 with the reflective mode phosphor member 1302 mounted on a support member or on a base member. A first laser diode device 1323 may be mounted on a first support member 1324 or a base member. A second laser diode device 1325 may be mounted on a second support member 1326 or a base member. The first and second support members and base members are configured to conduct heat away from the phosphor member 1302 and laser diode members 1323 and 1325. The base member is comprised of a thermally conductive material such as copper, copper tungsten, aluminum, alumina, SiC, steel, diamond, composite diamond, AlN, sapphire, or other metals, ceramics, or semiconductors. The mounting to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diodes can be made to using wirebonds to internal feedthroughs. The feedthroughs are electrically coupled to external leads. The external leads can be electrically coupled to a power source to electrify the laser diode sources to emit a first laser beam 1328 from the first laser diode device 1323 and a second laser beam 1329 from a second laser diode device 1325. The laser beams are incident on the phosphor member 1302 to create an excitation spot and a wide-spectrum light emission. The laser beams are preferably overlapped on the phosphor 1302 to create an optimized geometry and/or size excitation spot. For example, in the example according to FIG. 5 the laser beams from the first and second laser diodes are rotated by 90 degrees with respect to each other such that the slow axis of the first laser beam is aligned with the fast axis of the second laser beam. The top surface of the base member 1301 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful wide-spectrum light output. In this configuration the wide-spectrum light source is not capped or sealed such that is exposed to the open environment. In some examples of this embodiment of the integrated wide-spectrum light source apparatus, an electrostatic discharge (ESD) protection element such as a transient voltage suppression (TVS) element is included. Of course, FIG. 5 is merely an example and is intended to illustrate one possible simple configuration of a surface mount packaged wide-spectrum light source. Specifically, since surface mount type packages are widely popular for LEDs and other devices and are available off the shelves they could be one option for a low cost and highly adaptable solution.

Figure 6:
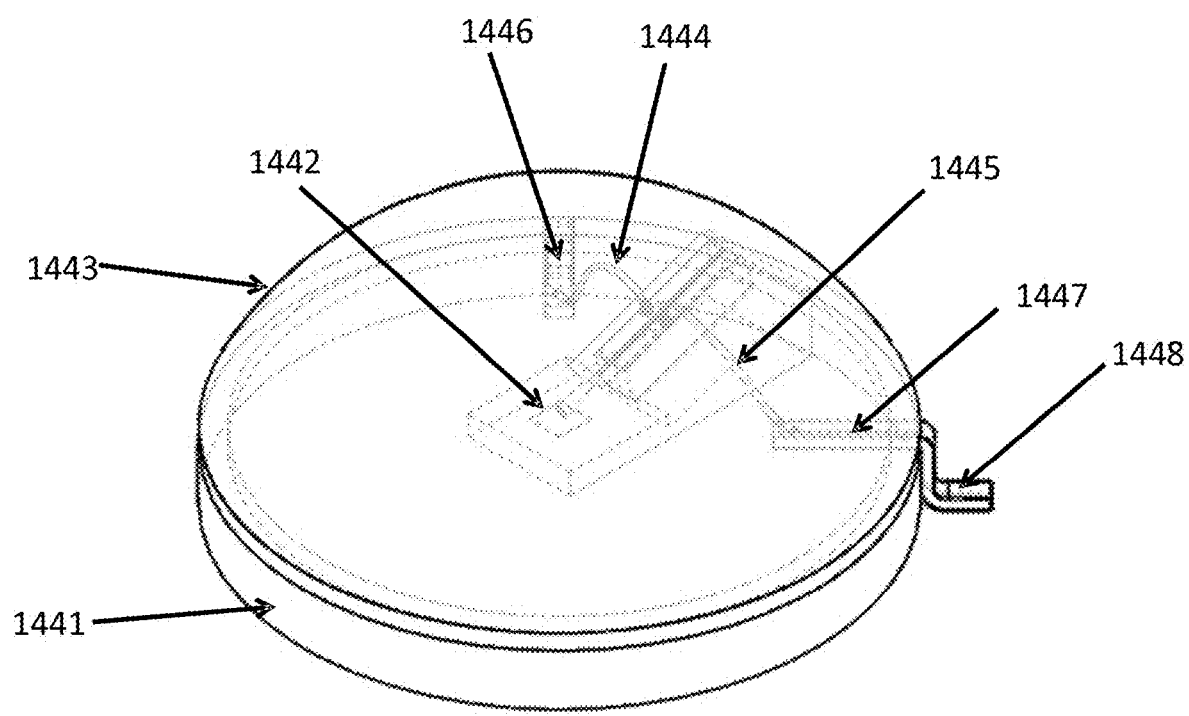
FIG. 6 is a simplified diagram illustrating an integrated laser-induced wide-spectrum light source mounted in a surface mount-type package and sealed with a cap member according to an embodiment of the present invention.

FIG. 6 is a schematic illustration of the CPoS wide-spectrum light source configured in a SMD type package, but with an additional cap member to form a seal around the wide-spectrum light source. As seen in FIG. 6, the SMD type package has a base member 1441 with the wide-spectrum light source 1442 mounted to the base. The mounting to the base can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Overlying the wide-spectrum light source is a cap member 1443, which is attached to the base member around the peripheral. In an example, the attachment can be a soldered attachment, a brazed attachment, a welded attachment, or a glued attachment to the base member. The cap member 1443 has at least a transparent window region and in preferred embodiments would be primarily comprised of a transparent window region such as the transparent dome cap illustrated in FIG. 6. The transparent material can be a glass, a quartz, sapphire, silicon carbide, diamond, plastic, or any suitable transparent material. The sealing type can be an environmental seal or a hermetic seal, and in an example the sealed package is backfilled with a nitrogen gas or a combination of a nitrogen gas and an oxygen gas. Electrical connections from the p-electrode and n-electrode of the laser diode are made using wire bonds 1444 and 1445. The wirebonds connect the electrode to electrical feedthroughs 1446 and 1447 that are electrically connected to external leads such as 1448 on the outside of the sealed SMD package. The leads are then electrically coupled to a power source to electrify the wide-spectrum light source and generate wide-spectrum light emission. In some embodiments, a lens or other type of optical element to shape, direct, or collimate the wide-spectrum light is included directly in the cap member. Of course, the example in FIG. 6 is merely an example and is intended to illustrate one possible configuration of sealing a wide-spectrum light source. Specifically, since SMD type packages are easily hermetically sealed, this embodiment may be suitable for applications where hermetic seals are needed.

Figure 7:
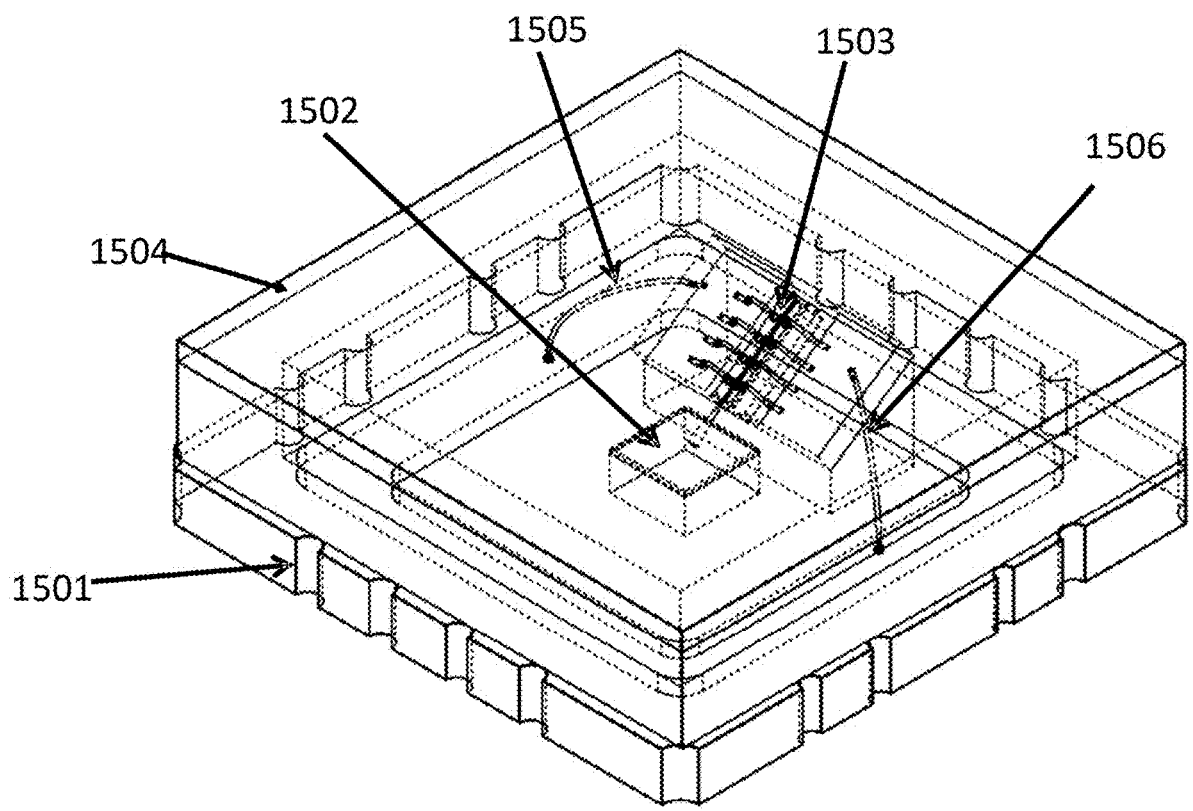
FIG. 7 is a simplified diagram illustrating an integrated laser-induced wide-spectrum light source mounted in a surface mount-type package and sealed with a cap member according to another embodiment of the present invention.

FIG. 7 is a schematic illustration of the wide-spectrum light source configured in a SMD type package, but with an additional cap member to form a seal around the wide-spectrum light source. As seen in FIG. 7, the SMD type package has a base member 1501 with the wide-spectrum light source comprised of a reflective mode phosphor member 1502 and a laser diode member 1503 mounted to submount members or the base member 1501. The mounting to submount and/or the base member 1501 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Overlying the wide-spectrum light source is a cap member 1504, which is attached to the base member around the sides. In an example, the attachment can be a soldered attachment, a brazed attachment, a welded attachment, or a glued attachment to the base member. The cap member 1504 has at least a transparent window region and in preferred embodiments would be primarily comprised of a transparent window region such as the transparent flat cap member 1504 illustrated in FIG. 7. The transparent material can be a glass, a quartz, sapphire, silicon carbide, diamond, plastic, or any suitable transparent material. The sealing type can be an environmental seal or a hermetic seal, and in an example the sealed package is backfilled with a nitrogen gas or a combination of a nitrogen gas and an oxygen gas. Electrical connections from the p-electrode and n-electrode of the laser diode are made using wire bonds 1505 and 1506. The wirebonds connect the electrode to electrical feedthroughs that are electrically connected to external leads on the outside of the sealed SMD package. The leads are electrically coupled to a power source to electrify the wide-spectrum light source and generate wide-spectrum light emission. In some embodiments, a lens or other type of optical element to shape, direct, or collimate the wide-spectrum light is included directly in the cap member. Of course, the example in FIG. 7 is merely an example and is intended to illustrate one possible configuration of sealing a wide-spectrum light source. Specifically, since SMD type packages are easily hermetically sealed, this embodiment may be suitable for applications where hermetic seals are needed.

Of course, a suitable assembly process is required for the fabrication of integrated laser-based wide-spectrum light sources as shown in FIG. 7 and other embodiments according to the present invention. In many embodiments, assembly processes suitable for a such a device would follow standard semiconductor and LED assembly processes as they are today. As an example, a general assembly process would follow the subsequent steps:

I) The laser is attached to heat a conducting member such as a first submount member and optionally a second submount member, or a second and a third submount member II) The composite laser and heat conducting member are attached to common support member such as the package member (e.g. SMD package), or substrate member.

III) The phosphor is attached to the common support member such as a package member (e.g. SMD) or a substrate member.

IV) An ESD protection device (e.g. TVS) or other peripheral component is attached to a package member, submount member, or substrate member.

V) The subcomponents that require electrical connection to package are wirebonded to feedthroughs.

VI) An operation verification test is performed.

VII) The frame assembly is attached to package or substrate or the frame+lid assembly is attached to the package or substrate.

VIII) The completed SMD package is attached to a next level board such as an MCPCB, FR4, or suitable carrier substrate.

In step I the laser device would be attached to the heat conducting member by a selection of various materials to provide mechanical stability, alignment and thermal conductivity to suit the particular requirements of the product application. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In step II the combined member consisting of a laser and heat conducting member would then be presented with a similar set of materials choices for its attachment into the package or onto the substrate. The materials choices and processes selection would be as follows. Depending on the materials selection, the process flow could be adjusted such that each subsequent step in the process puts a lower temperature excursion on the device than the previous steps. In this way, the early joints or connections do not experience a secondary reflow. A typical pick and place style operation either with in situ heating/pressure or post reflow would be utilized for this attach process. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In step III the phosphor subcomponent attach would depend on the structure and design of the subcomponent. For a single piece, solid state object. The phosphor could be handled by a pick and place operation, as one would handle an LED attach today. This requires that the base of the phosphor subcomponent be prepared for standard metallized attaches would could utilize the following materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In the case of a less rigid phosphor subcomponent, which utilizes phosphor powders and binders like silicones. The method of attach would simply be the adhesion of the phosphor and silicone slurry to the package surface during the silicone drying steps. Methods of application of a phosphor slurry would include but not limited to a dispense and cure process, a spray and cure process, an electrophoretic deposition with silicone dispense and cure process, a mechanical coining of powder/embedding into the surface of the package metallization process, a sedimentation deposition process, or a jet dispense and cure process.

In step IV an ESD or other peripheral component attach process could follow industry standard attach protocols which would include one or more of a solder dispense/stencil or preform attach process, an ESD or peripheral attach via pick and place operation, or a reflow process.

In step V wirebonding of the attached subcomponents would utilize industry standard materials and processes. This would include wire materials selection Al, Cu, Ag and Au. Alternatively ribbon bonding could be employed if necessary or suitable for the application. Normal wirebonding techniques would include ball bonding, wedge bonding and compliant bonding techniques known to the semiconductor industry.

In step VI with device fully connected with subcomponents, an operation verification test could be placed in the assembly process to verify proper operation before committing the final assembly pieces (frame and Lid) to the SMD component. In case of a non-working device, this provides an opportunity to repair the unit before being sealed. This test would consist of a simple electrical turn on for the device to verify proper operation of the laser and possibly a soft ESD test to verify the ESD/TVS component is working. Typical operating values for voltage, current, light output, color, spot size and shape would be used to determine proper operation.

In step VII the frame assembly and attach steps would be used to prepare the device to be sealed from the environment. The frame would be attached to the SMD via a choice of materials depending on the level of sealing required by the device. In one example of sealing materials and processes include a AuSn attach to metalized frame and package surface to provide a true hermetic seal. AuSn dispense, stencil processes would place AuSn in the proper locations on the SMD. This would be followed by a pick and place of the frame onto the wet AuSn and followed by a reflow step. In a second example of sealing materials and processes include epoxy materials are used if the hermeticity and gas leak requirements are sufficient for product use conditions. Epoxy materials would typically be stenciled or dispensed followed by a pick and place of the frame and subsequent epoxy cure. In a third example of sealing materials and processes includes indium metal used by placing thin indium wire on the attach surface and applying heat and pressure to the indium using the frame as a pressing member to compress and mechanical attach the Indium to both the SMD and Frame surfaces.

An alternative approach to the frame assembly process would first attach the transparent Lid (typically Glass) to the frame and this combined unit would then be attached to the SMD as described by the methods above otherwise the lid attach separately would follow the same processes and materials choices, but the surfaces would be the top of the frame and the bottom of the lid.

In step VIII the completed SMD attach to next level board would employ industry standard attach methodologies and materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In all embodiments, transmissive and reflective mode, of the integrated CPoS wide-spectrum light source according to the present invention safety features and design considerations can be included. In any laser-induced source, safety is a key aspect. It is critical that the light source cannot be compromised or modified in such a way to create laser diode beam that can be harmful to human beings, animals, or the environment. Thus, the overall design should include safety considerations and features, and in some cases even active components for monitoring. Examples of design considerations and features for safety include positioning the laser beam with respect to the phosphor in a way such that if the phosphor is removed or damaged, the exposed laser beam would not make it to the outside environment in a harmful form such as collimated, coherent beam. More specifically, the wide-spectrum light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor.

In one embodiment, an optical beam dump serves as an optical element to absorb the laser beam that could otherwise be dangerous to the outside environment. Design concerns in the beam dump would include the management and reduction of laser beam back reflections and scattering as well as dissipation of heat generated by absorption. Simple solutions where the optical power is not too high, the absorbing material can be as simple as a piece of black velvet or flock paper attached to a backing material with a glue, solder, or other material. In high power applications such as those that would be incorporated into high power laser systems, beam dumps must often incorporate more elaborate features to avoid back-reflection, overheating, or excessive noise. Dumping the laser beam with a simple flat surface could result in unacceptably large amounts of light escaping to the outside world where it could be dangerous to the environment even though the direct reflection is mitigated. One approach to minimize scattering is to use a porous or deep dark cavity material deep lined with an absorbing material to dump the beam.

A commonly available type of beam dump suitable for most medium-power lasers is a cone of aluminum with greater diameter than the beam, anodized to a black color and enclosed in a canister with a black, ribbed interior. Only the point of the cone is exposed to the beam head-on; mostly, incoming light grazes the cone at an angle, which eases performance requirements. Any reflections from this black surface are then absorbed by the canister. The ribs both help to make light less likely to escape, and improve heat transfer to the surrounding air. (https://en.wikipedia.org/wiki/Beam_dump).

In some embodiments of the present invention a thermal fuse is integrated into the package with the phosphor member. Thermal fuses are simple devices configured to conduct electricity under normal operation and typically consist of a low melting point alloy. In one example, the thermal fuse is comprised of metal material with a low melting point and configured to rapidly heat when irradiated directly or indirectly with the violet or blue laser beam light. The rapid heat rise in the thermal fuse material causes the material to melt, creating a discontinuity in the fuse metal, which opens the electrical conduction pathway and prevents current flow through the fuse.

In this embodiment of the present invention, a thermal fuse is contained within the electrical pathway providing the current input from an external power source to the gain element of the laser diode. The thermal fuse is physically positioned in locations where the output of the violet or blue laser beam would be incident in the case that the phosphor member is comprised, broken, or removed. That is, the thermal fuse is placed in the package where the beam is not expected to be unless an upstream failure in the beam line has occurred. In the case of such an event, the violet or blue laser light would irradiate the fuse material inducing a temperature rise at or above the melting point and hence causing a melting of thermal fuse element. This melting would then open the electrical pathway and break the electrical circuit from the external power supply to the laser diode gain element and thereby shutting the laser device off. In this preferred example, the thermal fuse could cutoff power to the laser without requiring external control mechanisms.

There are numbers of variations on the fusible alloy thermal fuse structure according to the present invention. In another example, one could utilize a tensioned spring which is soldered in place inside a ball of fusible allow. The spring and alloy are provided in the electrical circuit. When the alloy becomes soft enough, the spring pulls free, thereby breaking the circuit connection. In some embodiments the melting point could be suitably chosen to only break connection in the operating device when a sufficiently-high temperature had been met or exceeded.

In some embodiments of this invention, safety features and systems use active components. Example active components include photodetectors/photodiode and thermistors. A photodiode is a semiconductor device that converts light into current wherein a current is generated when light within a certain wavelength range is incident on the photodiode. A small amount of current is also produced when no light is present. Photodiodes may be combined with components such as optical filters to provide a wavelength or polarization selection of the light incident on the detector, built-in lenses to focus the light or manipulate the light incident on the detector, and may have large or small surface areas to select a certain responsivity and/or noise level. The most prevalent photodiode type is based on Si as the optical absorbing material, wherein a depletion region is formed. When a photon is absorbed in this region an electron-hole pair is formed, which results in a photocurrent. The primary parameter defining the sensitivity of a photodiode is its quantum efficiency (QE) which is defined as the percentage of incident photons generating electron-hole pairs which subsequently contribute to the output signal. Quantum efficiencies of about 80% are usual for silicon detectors operating at wavelengths in the 800-900 nm region. The sensitivity of a photodiode may also be expressed in units of amps of photodiode current per watt of incident illumination. This relationship leads to a tendency for responsivity to reduce as the wavelength becomes shorter. For example, at 900 nm, 80% QE represents a responsivity of 0.58 A/W, whereas at 430 nm, the same QE gives only 0.28 A/W. In alternative embodiments, photodiodes based on other materials such as Ge, InGaAs, GaAs, InGaAsP, InGaN, GaN, InP, or other semiconductor-based materials can be used. The photodiode can be a p-n type, a p-i-n type, an avalanche photodiode, a uni-traveling carrier photodiode, a partially depleted photodiode, or other type of diode.

The decreasing responsivity with such shorter wavelengths presents difficulty in achieving a high-performance silicon-based photodiode in the violet or blue wavelength range. To overcome this difficulty blue enhancement and/or filter techniques can be used to improve the responsivity this wavelength range. However, such techniques can lead to increased costs, which may not be compatible with some applications. Several techniques can be used to overcome this challenge including deploying new technologies for blue enhanced silicon photodiodes or using photodiodes based on different material systems such as photodiodes based on GaN/InGaN. In one embodiment an InGaN and/or GaN-containing photodiode is combined with the integrated wide-spectrum light source. In a specific embodiment, the photodiode is integrated with the laser diode either by a monolithic technique or by an integration onto a common submount or support member as the laser diode to form an integrated GaN/InGaN based photodiode.

In another embodiment of this invention to overcome the difficulty of achieving a low cost silicon based photodiode operable with high responsivity in the blue wavelength region, a wavelength converter material such as a phosphor can be used to down convert ultraviolet, violet, or blue laser light to a wavelength more suitable for high-responsivity photo-detection according to the criteria required in an embodiment for this invention. For example, if photodiodes operating in the green, yellow, or red wavelength regime can be lower cost and have a suitable responsivity for the power levels associated with a converted wavelength, the photodiode can be coated with phosphors to convert the laser light to a red, green, or yellow emission. In other embodiments the detectors are not coated, but a converter member such as a phosphor is place in the optical pathway of the laser beam or scattered laser beam light and the photodiode.

Strategically located detectors designed to detect direct blue emission from the laser, scattered blue emission, or phosphor emission such as yellow phosphor emission can be used to detect failures of the phosphor where a blue beam could be exposed or other malfunctions of the wide-spectrum light source. Upon detection of such an event, a close circuit or feedback loop would be configured to cease power supply to the laser diode and effectively turn it off.

As an example, a photodiode can be used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system.

In a preferred embodiment, a InGaN/GaN-based photodiode is integrated with the wide-spectrum light source. The InGaN/GaN-based photodiode can be integrated using a discrete photodiode mounted in the package or can be directly integrated onto a common support member with the laser diode. In a preferable embodiment, the InGaN/GaN-based photodiode can be monolithically integrated with the laser diode.

In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and shut it off.

In some embodiments additional optical elements are used to recycle reflected or stray excitation light. In one example, a re-imaging optic is used to re-image the reflected laser beam back onto the phosphor and hence re-cycle the reflected light.

In some embodiments of the present invention additional elements can be included within the package member to provide a shield or blocking function to stray or reflected light from the laser diode member. By blocking optical artifacts such as reflected excitation light, phosphor bloom patterns, or the light emitted from the laser diode not in the primary emission beam such as spontaneous light, scattered light, or light escaping a back facet the optical emission from the wide-spectrum light source can be more ideal for integration into lighting systems. Moreover, by blocking such stray light the integrated wide-spectrum light source will be inherently safer. Finally, a shield member can act as an aperture such that wide-spectrum emission from the phosphor member is aperture through a hole in the shield. This aperture feature can form the emission pattern from the wide-spectrum source.

In many applications according to the present invention, the packaged integrated wide-spectrum light source will be attached to a heat sink member. The heat sink is configured to transfer the thermal energy from the packaged wide-spectrum light source to a cooling medium. The cooling medium can be an actively cooled medium such as a thermoelectric cooler or a microchannel cooler, or can be a passively cooled medium such as an air-cooled design with features to maximize surface and increase the interaction with the air such as fins, pillars, posts, sheets, tubes, or other shapes. The heat sink will typically be formed from a metal member, but can be others such as thermally conductive ceramics, semiconductors, or composites.

The heat sink member is configured to transport thermal energy from the packaged laser diode based wide-spectrum light source to a cooling medium. The heat sink member can be comprised of a metal, ceramic, composite, semiconductor, plastic and is preferably comprised of a thermally conductive material. Examples of candidate materials include copper which may have a thermal conductivity of about 400 W/(m·K), aluminum which may have a thermal conductivity of about 200 W/(m·K), 4H-SiC which may have a thermal conductivity of about 370 W/(m·K), 6H-SiC which may have a thermal conductivity of about 490 W/(m·K), AlN which may have a thermal conductivity of about 230 W/(m·K), a synthetic diamond which may have a thermal conductivity of about >1000 W/(m·K), a composite diamond, sapphire, or other metals, ceramics, composites, or semiconductors. The heat sink member may be formed from a metal such as copper, copper tungsten, aluminum, or other by machining, cutting, trimming, or molding.

The attachment joint joining the packaged wide-spectrum light source according to this invention to the heat sink member should be carefully designed and processed to minimize the thermal impedance. Therefore, a suitable attaching material, interface geometry, and attachment process practice must be selected for appropriate thermal impedance with sufficient attachment strength. Examples include AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively, the joint could be formed from a metal-metal bond such as an Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink.

In many embodiments according to the present invention the completed SMD is attached to the next level board would employ industry standard attach methodologies and materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

Figure 8:
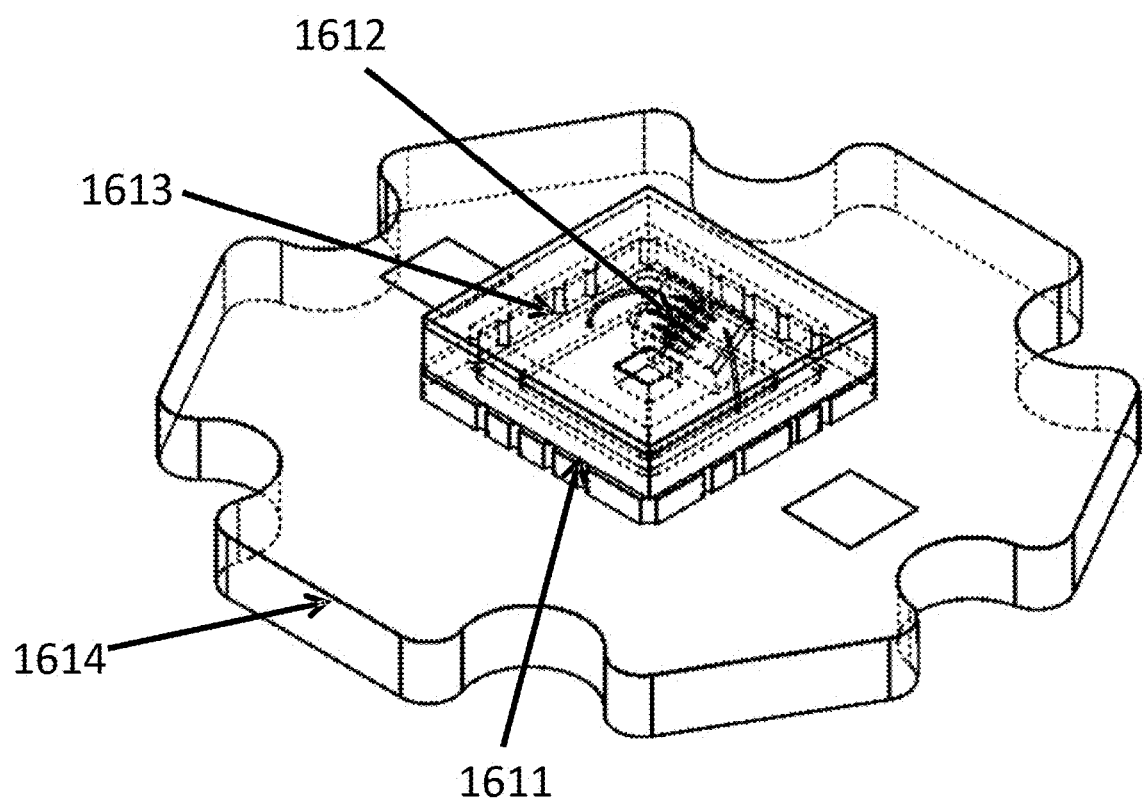
FIG. 8 is a simplified diagram illustrating an integrated laser-induced wide-spectrum light source mounted in a surface mount package mounted onto a starboard according to an embodiment of the present invention.

FIG. 8 is a schematic illustration of a wide-spectrum light source configured in a sealed SMD mounted on a board member such as a starboard according to the present invention. The sealed wide-spectrum light source 1612 in an SMD package is similar to that example shown in FIG. 7. As seen in FIG. 8, the SMD type package has a base member 1611 (i.e., the base member 1401 of FIG. 6) with the wide-spectrum light source 1612 mounted to the base and a cap member 1613 providing a seal for the light source 1612. The mounting to the base member 1611 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900×C), processes can avoid thermal load restrictions on downstream processes, allowing completed devices to have very good and consistent bonds throughout. The cap member 1613 has at least a transparent window region. The transparent material can be glass, quartz, sapphire, silicon carbide, diamond, plastic, or any suitable transparent material. The base member 1611 of the SMD package is attached to a starboard member 1614 configured to allow electrical and mechanical mounting of the integrated wide-spectrum light source, provide electrical and mechanical interfaces to the SMD package, and supply the thermal interface to the outside world such as a heatsink. The heat sink member 1614 can be comprised of a material such as a metal, ceramic, composite, semiconductor, or plastic and is preferably comprised of a thermally conductive material. Examples of candidate materials include aluminum, alumina, copper, copper tungsten, steel, SiC, AlN, diamond, a composite diamond, sapphire, or other materials. Of course, FIG. 8 is merely an example and is intended to illustrate one possible configuration of a wide-spectrum light source according to the present invention mounted on a heat sink. Specifically, the heat sink could include features to help transfer heat such as fins.

In some embodiments of this invention, the CPoS integrated wide-spectrum light source is combined with an optical member to manipulate the generated wide-spectrum light. In an example the wide-spectrum light source could serve in a spot light system such as a flashlight or an automobile headlamp or other light applications where the light must be directed or projected to a specified location or area. As an example, to direct the light it should be collimated such that the photons comprising the wide-spectrum light are propagating parallel to each other along the desired axis of propagation. The degree of collimation depends on the light source and the optics using to collimate the light source. For the highest collimation a perfect point source of light with 4-pi emission and a sub-micron or micron-scale diameter is desirable. In one example, the point source is combined with a parabolic reflector wherein the light source is placed at the focal point of the reflector and the reflector transforms the spherical wave generated by the point source into a collimated beam of plane waves propagating along an axis.

In one embodiment a reflector is coupled to the wide-spectrum light source. Specifically, a parabolic (or paraboloid or paraboloidal) reflector is deployed to project the wide-spectrum light. By positioning the wide-spectrum light source in the focus of a parabolic reflector, the plane waves will be reflected and propagate as a collimated beam along the axis of the parabolic reflector.

In another example a simple singular lens or system of lenses is used to collimate the wide-spectrum light into a projected beam. In a specific example, a single aspheric lens is place in front of the phosphor member emitting wide-spectrum light and configured to collimate the emitted wide-spectrum light. In another embodiment, the lens is configured in the cap of the package containing the integrated wide-spectrum light source. In some embodiments, a lens or other type of optical element to shape, direct, or collimate the wide-spectrum light is included directly in the cap member. In an example the lens is comprised of a transparent material such as glass, SiC, sapphire, quartz, ceramic, composite, or semiconductor.

Such wide-spectrum light collimating optical members can be combined with the wide-spectrum light source at various levels of integration. For example, the collimating optics can reside within the same package as the integrated wide-spectrum light source in a co-packaged configuration. In a further level of integration, the collimating optics can reside on the same submount or support member as the wide-spectrum light source. In another embodiment, the collimating optics can reside outside the package containing the integrated wide-spectrum light source.

Figure 9:
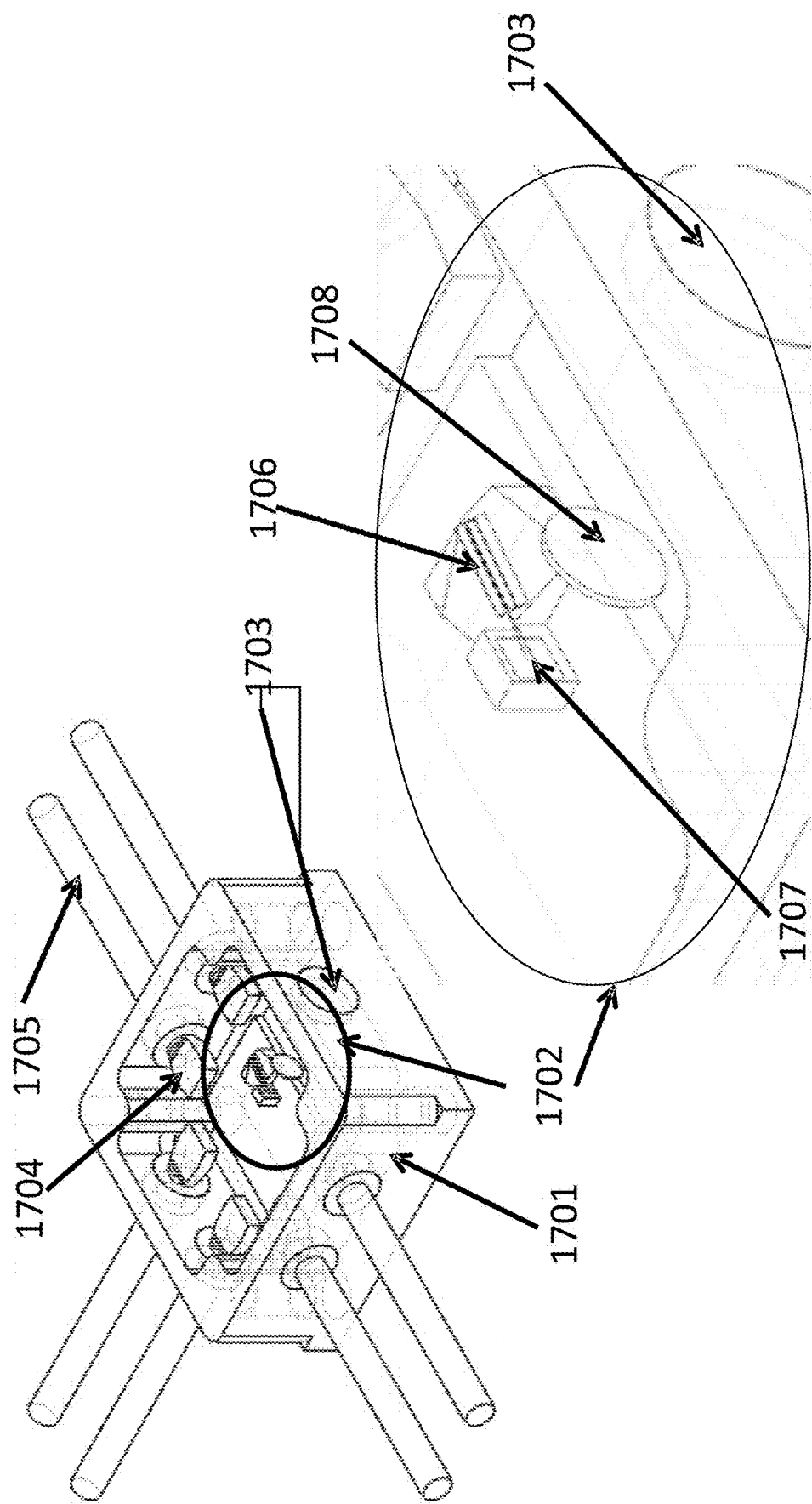
FIG. 9 is a simplified diagram illustrating an integrated laser-induced wide-spectrum light source mounted in a flat-type package with a collimating optic according to an embodiment of the present invention.

In one embodiment according to the present invention, a reflective mode integrated wide-spectrum light source is configured in a flat type package with a lens member to create a collimated wide-spectrum beam as illustrated in FIG. 9. As seen in FIG. 9, the flat type package has a base or housing member 1701 with a collimated wide-spectrum light source 1702 mounted to the base and configured to create a collimated wide-spectrum beam to exit a window 1703 configured in the side of the base or housing member 1701. The mounting to the base or housing can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Electrical connections to the wide-spectrum light source 1702 can be made with wire bonds to the feedthroughs 1704 that are electrically coupled to external pins 1705. In this example, the collimated reflective mode wide-spectrum light source 1702 comprises the laser diode 1706, the phosphor wavelength converter 1707 configured to accept a laser beam emitted from the laser diode 1706, and a collimating lens such as an aspheric lens 1708 configured in front of the phosphor 1707 to collect the emitted wide-spectrum light and form a collimated beam. The collimated beam is directed toward the window 1703 formed from a transparent material. The transparent material can be glass, quartz, sapphire, silicon carbide, diamond, plastic, or any suitable transparent material. The external pins 1705 are electrically coupled to a power source to electrify the wide-spectrum light source 1702 and generate wide-spectrum light emission. As seen in the Figure, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, the example in FIG. 9 is merely an example and is intended to illustrate one possible configuration of sealing a wide-spectrum light source.

Figure 10:
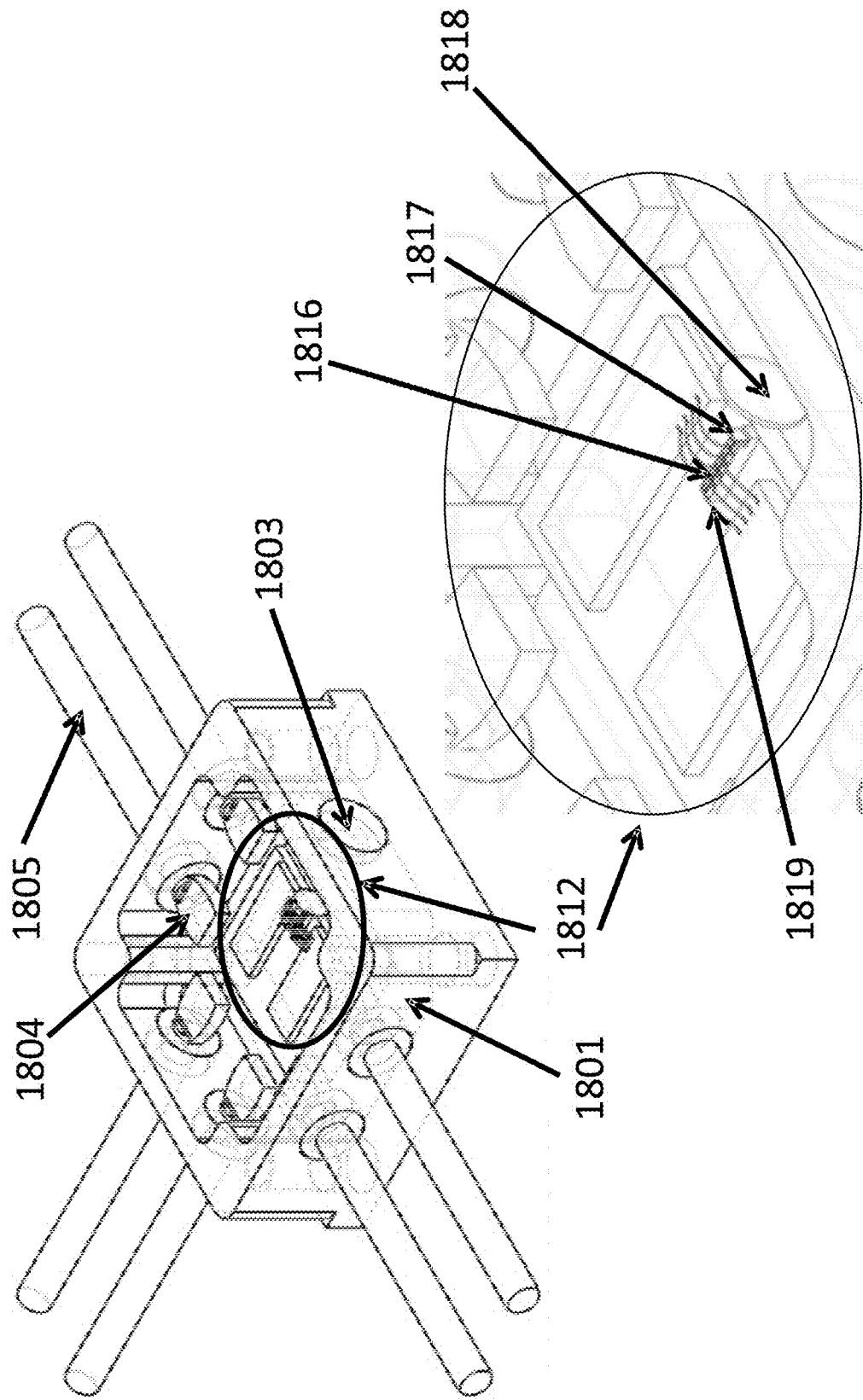
FIG. 10 is a simplified diagram illustrating an integrated laser-induced wide-spectrum light source mounted in a flat-type package with a collimating optic according to an embodiment of the present invention.

In one embodiment according to the present invention, a transmissive mode integrated wide-spectrum light source is configured in a flat type package with a lens member to create a collimated wide-spectrum beam as illustrated in FIG. 10. As seen in FIG. 10, the flat type package has a base or housing member 1801 with a collimated wide-spectrum light source 1812 mounted to the base member 1801 and configured to create a collimated wide-spectrum beam to exit a window 1803 configured in the side of the base or housing member 1801. The mounting to the base or housing member 1801 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Electrical connections to the wide-spectrum light source 1812 can be made with wire bonds to the feedthroughs 1804 that are electrically coupled to external pins 1805. In this example, the collimated transmissive mode wide-spectrum light source 1812 comprises the laser diode 1816, the phosphor wavelength converter 1817 configured to accept a laser beam emitted from the laser diode 1816, and a collimating lens such as an aspheric lens 1818 configured in front of the phosphor 1817 to collect the emitted wide-spectrum light and form a collimated beam. The collimated beam is directed toward the window 1803 formed from a transparent material. The transparent material can be glass, quartz, sapphire, silicon carbide, diamond, plastic, or any suitable transparent material. The external pins 1805 are electrically coupled to a power source to electrify the wide-spectrum light source 1812 and generate wide-spectrum light emission. As seen in the FIG. 10, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, the example in FIG. 10 is merely an example and is intended to illustrate one possible configuration of sealing a wide-spectrum light source.

Figure 11:
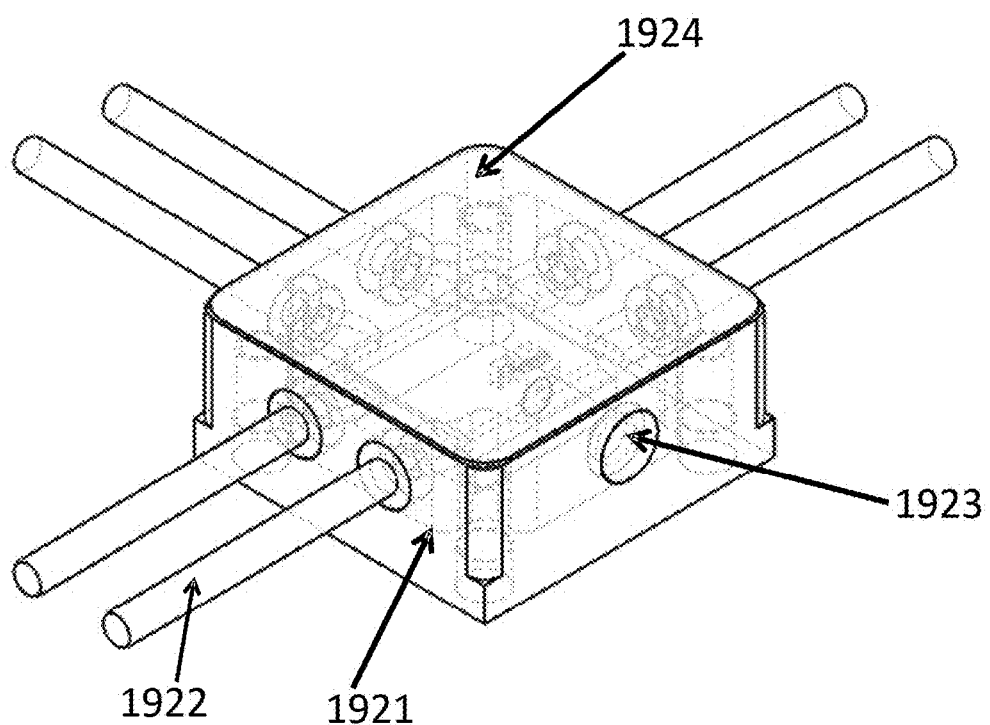
FIG. 11 is a simplified diagram illustrating an integrated laser-induced wide-spectrum light source mounted in a flat-type package and sealed with a cap member according to an embodiment of the present invention.

The flat type package examples shown in FIGS. 9 and 10 according to the present invention are illustrated in an unsealed configuration without a lid to show examples of internal configurations. However, flat packages are easily sealed with a lid or cap member. FIG. 11 is an example of a sealed flat package with a collimated wide-spectrum light source inside. As seen in FIG. 11, the flat type package has a base or housing member 1921 with external pins 1922 configured for electrical coupling to internal components such as the wide-spectrum light source, safety features, and thermistors. The sealed flat package is configured with a window 1923 for the collimated wide-spectrum beam to exit and a lid or cap 1924 to form a seal between the external environment and the internal components. The lid or cap can be soldered, brazed, welded, glued to the base, or other. The sealing type can be an environmental seal or a hermetic seal, and in an example the sealed package is backfilled with a nitrogen gas or a combination of a nitrogen gas and an oxygen gas.

Figure 12:
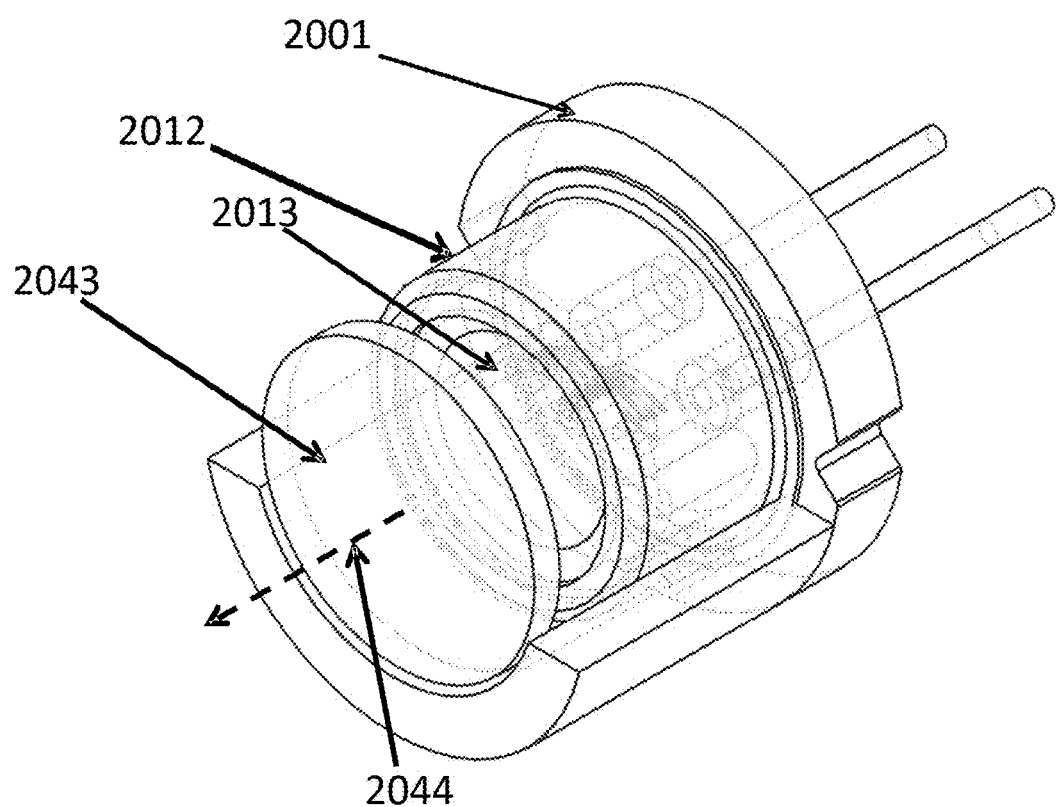
FIG. 12 is a simplified diagram illustrating an integrated laser-induced wide-spectrum light source mounted in a can-type package with a collimating lens according to an embodiment of the present invention.

In an alternative embodiment, FIG. 12 provides a schematic illustration of the CPoS wide-spectrum light source configured in a TO-can type package, but with an additional lens member configured to collimate and project the wide-spectrum light. The example configuration for a collimated wide-spectrum light from TO-can type package according to FIG. 12 comprises a TO-can base 2001, a cap 2012 configured with a transparent window region 2013 mounted to the base 2001. The cap 2012 can be soldered, brazed, welded, or glue to the base. An aspheric lens member 2043 configured outside the window region 2013 wherein the lens 2043 functions to capture the emitted wide-spectrum light passing the window, collimate the light, and then project it along the axis 2044. Of course, this is merely an example and is intended to illustrate one possible configuration of combining the integrated wide-spectrum light source according to this invention with a collimation optic. In another example, the collimating lens could be integrated into the window member on the cap or could be included within the package member.

Figure 13:
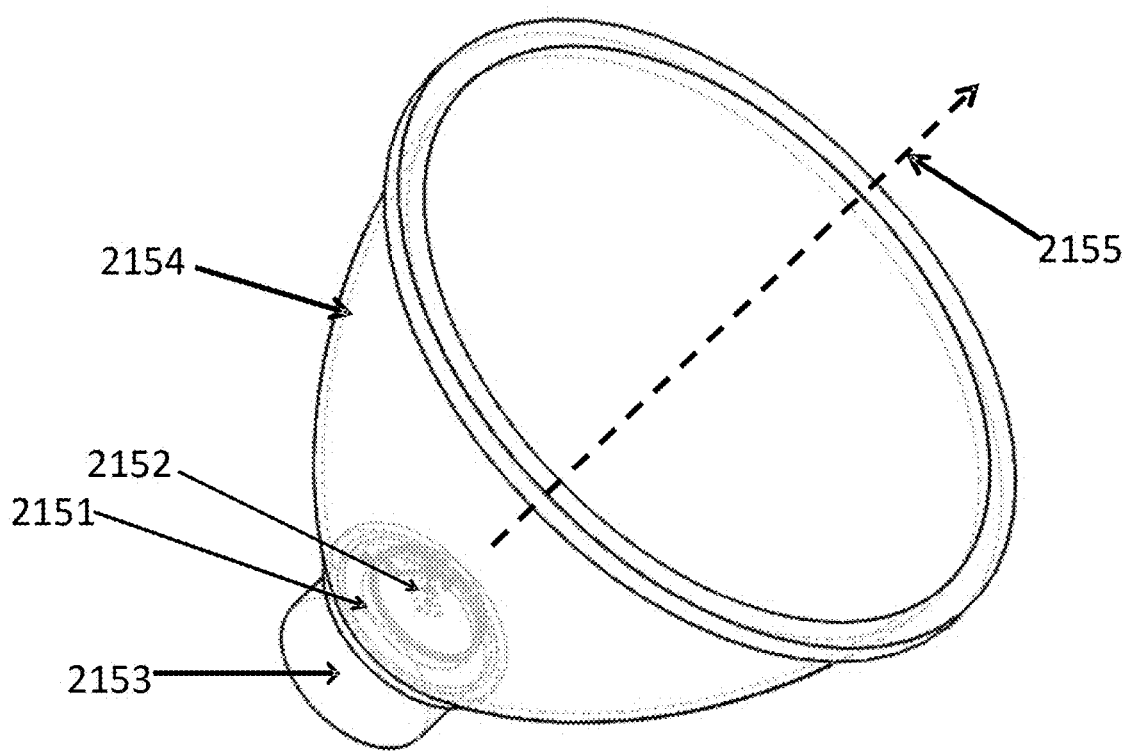
FIG. 13 is a simplified diagram illustrating an integrated laser-induced wide-spectrum light source mounted in a surface mount type package mounted on a heat sink with a collimating reflector according to an embodiment of the present invention.

In an alternative embodiment, FIG. 13 provides a schematic illustration of a wide-spectrum light source according to this invention configured in an SMD-type package but with an additional parabolic member configured to collimate and project the wide-spectrum light. The example configuration for a collimated wide-spectrum light from SMD-type package according to FIG. 13 comprises an SMD type package 2151 comprising a based and a cap or window region and the integrated wide-spectrum light source 2152. The SMD package is mounted to a heat-sink member 2153 configured to transport and/or store the heat generated in the SMD package from the laser and phosphor member. A reflector member 2154 such as a parabolic reflector is configured with the wide-spectrum light emitting phosphor member of the wide-spectrum light source at or near the focal point of the parabolic reflector. The parabolic reflector functions to collimate and project the wide-spectrum light along the axis of projection 2155. Of course, this is merely an example and is intended to illustrate one possible configuration of combining the integrated wide-spectrum light source according to this invention with a reflector collimation optic. In another example, the collimating reflector could be integrated into the window member of the cap or could be included within the package member. In a preferred embodiment, the reflector is integrated with or attached to the submount.

Figure 14:
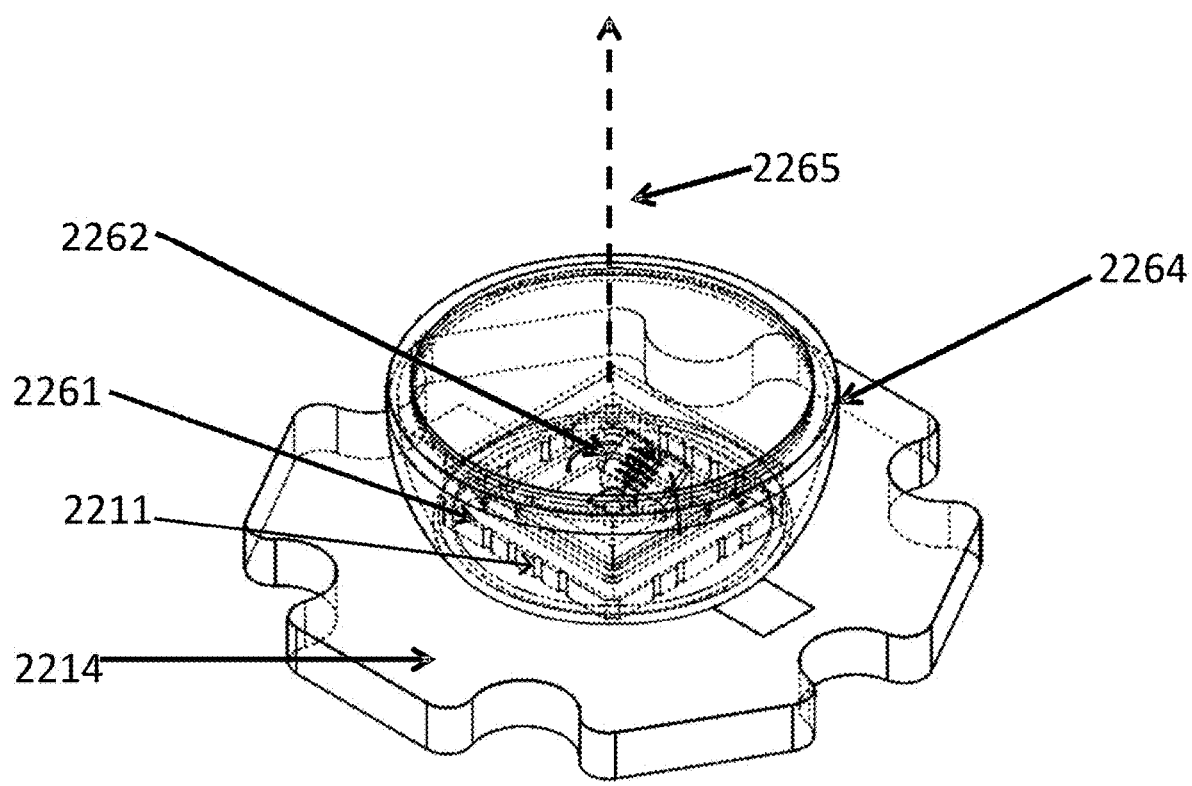
FIG. 14 is a simplified diagram illustrating an integrated laser-induced wide-spectrum light source mounted in a surface mount type package mounted on a starboard with a collimating reflector according to an embodiment of the present invention.

In an alternative embodiment, FIG. 14 provides a schematic illustration of a wide-spectrum light source according to this invention configured in an SMD-type package, but with an additional parabolic reflector member or alternative collimating optic member such as lens or TIR optic configured to collimate and project the wide-spectrum light. The example configuration for a collimated wide-spectrum light from SMD-type package according to FIG. 14 comprises an SMD type package 2261 comprising a based 2211 and a cap or window region and the integrated wide-spectrum laser-based light source 2262. The SMD package 2261 is mounted to a starboard member 2214 configured to allow electrical and mechanical mounting of the integrated wide-spectrum light source, provide electrical and mechanical interfaces to the SMD package 2261, and supply the thermal interface to the outside world such as a heat-sink. A reflector member 2264 such as a parabolic reflector is configured with the wide-spectrum light emitting phosphor member of the wide-spectrum light source at or near the focal point of the parabolic reflector. The parabolic reflector 2264 functions to collimate and project the wide-spectrum light along the axis of projection 2265. Of course, this is merely an example and is intended to illustrate one possible configuration of combining the integrated wide-spectrum light source according to this invention with a reflector collimation optic. In another example, the collimating reflector could be integrated into the window member of the cap or could be included within the package member. The collimating optic could be a lens member, a TIR optic member, a parabolic reflector member, or an alternative collimating technology, or a combination. In an alternative embodiment, the reflector is integrated with or attached to the submount.

Figure 15:
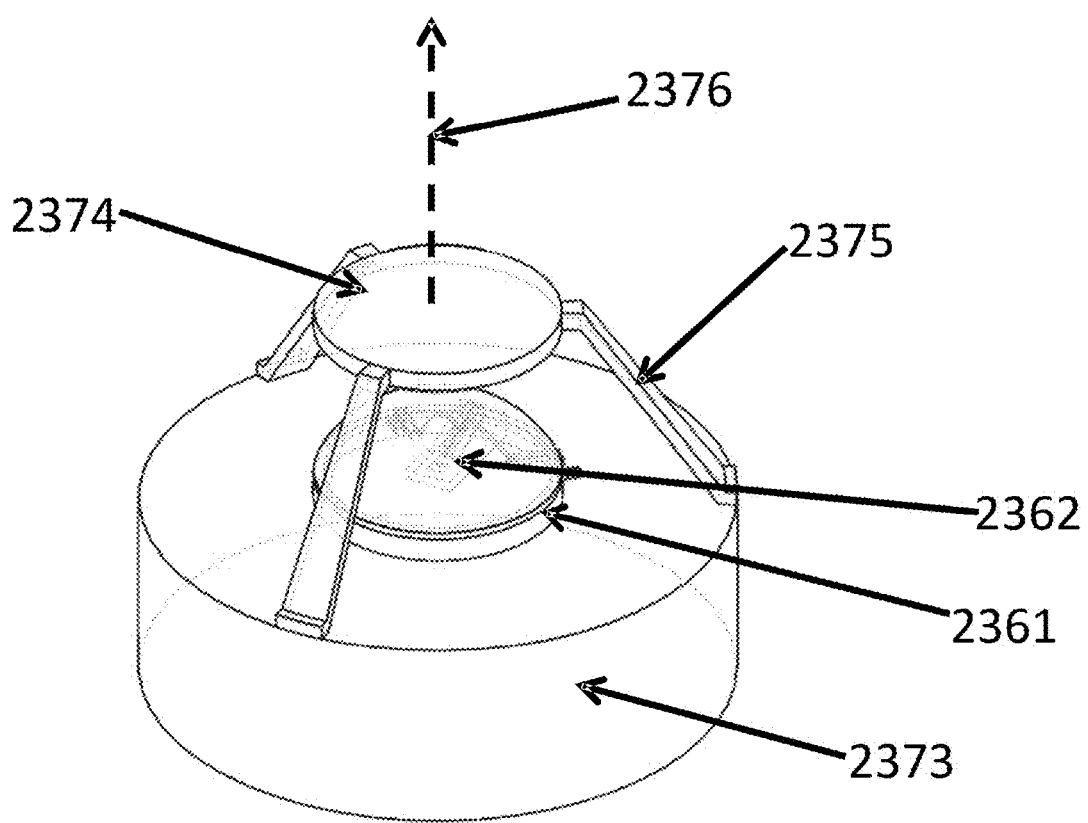
FIG. 15 is a simplified diagram illustrating an integrated laser-induced wide-spectrum light source mounted in a surface mount type package mounted on a heat sink with a collimating lens according to an embodiment of the present invention.

In an alternative embodiment, FIG. 15 provides a schematic illustration of a wide-spectrum light source according to this invention configured in an SMD-type package, but with an additional lens member configured to collimate and project the wide-spectrum light. The example configuration for a collimated wide-spectrum light from SMD-type package according to FIG. 15 comprises an SMD type package 2361 comprising a based and a cap or window region and the integrated wide-spectrum light source 2362. The SMD package 2361 is mounted to a heat-sink member 2373 configured to transport and/or store the heat generated in the SMD package 2361 from the laser and phosphor member. A lens member 2374 such as an aspheric lens is configured with the wide-spectrum light emitting phosphor member of the wide-spectrum light source 2362 to collect and collimate a substantial portion of the emitted wide-spectrum light. The lens member 2374 is supported by support members 2375 to mechanically brace the lens member 2374 in a fixed position with respect to the wide-spectrum light source 2362. The support members 2375 can be comprised of metals, plastics, ceramics, composites, semiconductors or other. The lens member 2374 functions to collimate and project the wide-spectrum light along the axis of projection 2376. Of course, this is merely an example and is intended to illustrate one possible configuration of combining the integrated wide-spectrum light source according to this invention with a reflector collimation optic. In another example, the collimating reflector could be integrated into the window member of the cap or could be included within the package member. In a preferred embodiment, the reflector is integrated with or attached to the submount.

Figure 16:
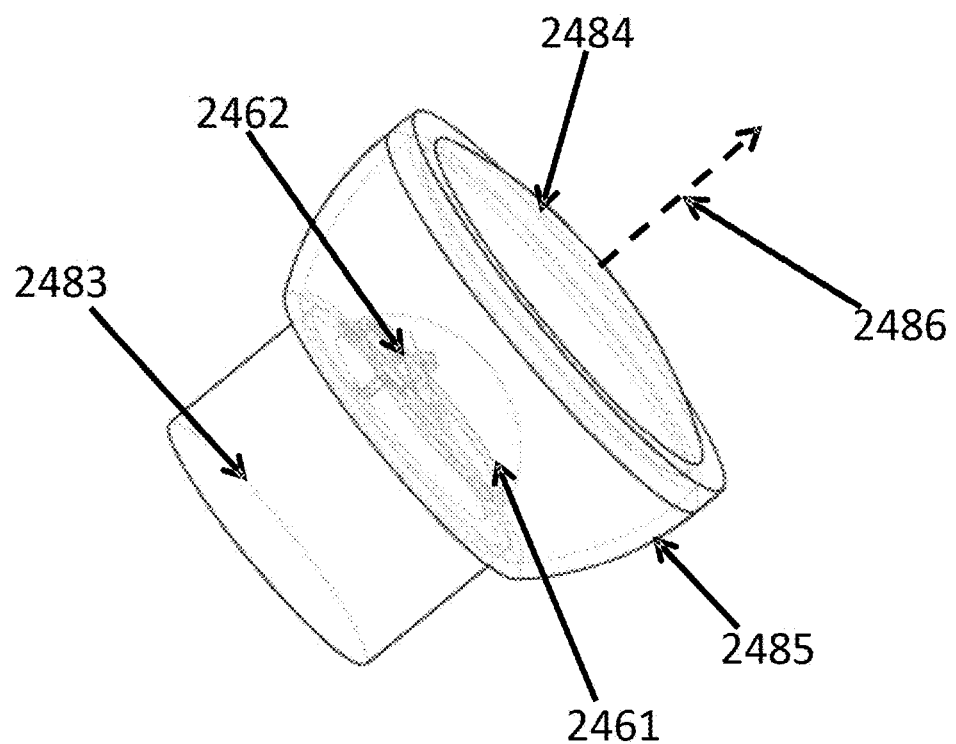
FIG. 16 is a simplified diagram illustrating an integrated laser-induced wide-spectrum light source mounted in a surface mount type package mounted on a heat sink with a collimating lens and reflector member according to an embodiment of the present invention.

In an embodiment according to the present invention, FIG. 16 provides a schematic illustration of a wide-spectrum light source according to this invention configured in an SMD-type package, but with an additional lens member and reflector member configured to collimate and project the wide-spectrum light. The example configuration for a collimated wide-spectrum light from SMD-type package according to FIG. 16 comprises an SMD type package 2461 comprising a based and a cap or window region and the integrated wide-spectrum light source 2462. The SMD package 2461 is mounted to a heat-sink member 2483 configured to transport and/or store the heat generated in the SMD package 2461 from the laser and phosphor member. A lens member 2484 such as an aspheric lens is configured with the wide-spectrum light source 2462 to collect and collimate a substantial portion of the emitted wide-spectrum light. A reflector housing member 2485 or lens member 2484 is configured between the wide-spectrum light source 2462 and the lens member 2484 to reflect any stray light or light (that would not otherwise reach the lens member) into the lens member for collimation and contribution to the collimated beam. In one embodiment the lens member 2484 is supported by the reflector housing member 2485 to mechanically brace the lens member 2484 in a fixed position with respect to the wide-spectrum light source 2462. The lens member 2484 functions to collimate and project the wide-spectrum light along the axis of projection 2486. Of course, this is merely an example and is intended to illustrate one possible configuration of combining the integrated wide-spectrum light source according to this invention with a reflector collimation optic. In another example, the collimating reflector could be integrated into the window member of the cap or could be included within the package member. In a preferred embodiment, the reflector is integrated with or attached to the submount.

Laser device plus phosphor excitation sources integrated in packages such as an SMD can be attached to an external board to allow electrical and mechanical mounting of packages. In addition to providing electrical and mechanical interfaces to the SMD package, these boards also supply the thermal interface to the outside world such as a heat-sink. Such boards can also provide for improved handling for small packages such as an SMD (typically less than 2 cm×2 cm) during final assembly. In addition to custom board designs, there are a number of industry standard board designs that include metal core printed circuit board (MCPCB) with base being Cu, Al or Fe alloys, fiber filled epoxy boards such as the FR4, Flex/Hybrid Flex boards that are typically polyimide structures with Cu interlayers and dielectric isolation to be used in applications which need to be bent around a non-flat surface, or a standard heat sink material board that can be directly mounted to an existing metal frame in a larger system.

A further understanding of the nature and advantages of the present invention may be realized by reference to the latter portions of the specification and attached drawings.

Figure 17:
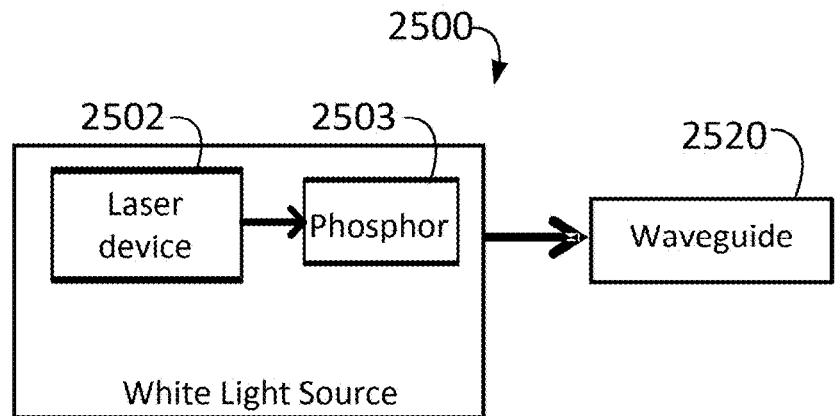
FIG. 17 is a simplified block diagram of a laser-based fiber-coupled wide-spectrum light system according to an embodiment of the present invention.

In an aspect, the present disclosure provides a light guide-coupled wide-spectrum light system based on integrated laser-induced wide-spectrum light source. FIG. 17 shows a simplified block diagram of a functional light guide-coupled wide-spectrum light system according to some embodiments of the present disclosure. This diagram is merely an example, which should not unduly limit the scope of the claims. One of ordinary skill in the art would recognize many variations, alternatives, and modifications. As shown in FIG. 17, the light guide-coupled wide-spectrum light system 2500 includes a wide-spectrum light source 2510 and a light guide 2520 coupled to it to deliver the wide-spectrum light for various applications. In some embodiments, the wide-spectrum light source 2510 is a laser-based wide-spectrum light source including at least one laser device 2502 configured to emit a laser light with a blue wavelength in a range from about 385 nm to about 495 nm. Optionally, the at least one laser device 2502 is a laser diode (LD) chip configured as a chip-on-submount (CoS) form having a Gallium and Nitrogen containing emitting region operating in a first wavelength selected from 395 nm to 425 nm wavelength range, 425 nm to 490 nm wavelength range, and 490 nm to 550 nm range. Optionally, the laser device 2502 is configured as a chip-on-submount (CoS) structure based on lifted off and transferred epitaxial gallium and nitrogen containing layers. Optionally, the at least one laser device 2502 includes a set of multiple laser diode (LD) chips. Each includes an GaN-based emission stripe configured to be driven by independent driving current or voltage from a laser driver to emit a laser light. All emitted laser light from the multiple LD chips can be combined to one beam of electromagnetic radiation. Optionally, the multiple LD chips are blue laser diodes with an aggregated output power of less than 1 W, or about 1 W to about 10 W, or about 10 W to about 30 W, or about 30 W to 100 W, or greater. Optionally, each emitted light is driven and guided separately.

In some embodiments, the laser-based light guide-coupled wide-spectrum light system 2500 further includes a phosphor member 2503. Optionally, the phosphor member 2503 is mounted on a remote/separate support member co-packaged within the wide-spectrum light source 2510. Optionally, the phosphor member 2503 is mounted on a common support member with the laser device 2502 in a chip-and-phosphor-on-submount (CPoS) structure. The phosphor member 2503 comprises a flat surface or a pixelated surface disposed at proximity of the laser device 2502 in a certain geometric configuration so that the beam of electromagnetic radiation emitted from the laser device 2502 can land in a spot on the excitation surface of the phosphor member 2503 with a spot size limited in a range of about 50 μm to 5 mm.

Optionally, the phosphor member 2503 is comprised of a ceramic yttrium aluminum garnet (YAG) doped with Ce or a single crystal YAG doped with Ce or a powdered YAG comprising a binder material. The phosphor plate has an optical conversion efficiency of greater than 50 lumen per optical watt, greater than 100 lumen per optical watt, greater than 200 lumen per optical watt, or greater than 300 lumen per optical watt.

Optionally, the phosphor member 2503 is comprised of a single crystal plate or ceramic plate selected from a Lanthanum Silicon Nitride compound and Lanthanum aluminum Silicon Nitrogen Oxide compound containing $Ce^{3+}$ ions atomic concentration ranging from 0.01% to 10%.

Optionally, the phosphor member 2503 absorbs the laser emission of electromagnetic radiation of the first wavelength in violet, blue (or green) spectrum to induce a phosphor emission of a second wavelength in yellow spectra range. Optionally, the phosphor emission of the second wavelength is partially mixed with a portion of the incoming/reflecting laser beam of electromagnetic radiation of the first wavelength to produce a wide-spectrum light beam to form a laser induced wide-spectrum light source 2510. Optionally, the laser beam emitted from the laser device 2502 is configured with a relative angle of beam incidence with respect to a direction of the excitation surface of the phosphor member 2503 in a range from 5 degrees to 90 degrees to land in the spot on the excitation surface. Optionally, the angle of laser beam incidence is narrowed in a smaller range from 25 degrees to 35 degrees or from 35 degrees to 40 degrees. Optionally, the wide-spectrum light emission of the wide-spectrum light source 2510 is substantially reflected out of the same side of the excitation surface (or pixelated surface) of the phosphor member 2503. Optionally, the wide-spectrum light emission of the wide-spectrum light source 2510 can also be transmitted through the phosphor member 2503 to exit from another surface opposite to the excitation surface. Optionally, the wide-spectrum light emission reflected or transmitted from the phosphor member is redirected or shaped as a wide-spectrum light beam used for various applications. Optionally, the wide-spectrum light emission out of the phosphor material can be in a luminous flux of at least 250 lumens, at least 500 lumens, at least 1000 lumens, at least 3000 lumens, or at least 10,000 lumens. Alternatively, the wide-spectrum light emission out of the wide-spectrum light system 2500 with a luminance of 100 to 500 $cd/mm^2$, 500 to 1000 $cd/mm^2$, 1000 to 2000 $cd/mm^2$, 2000 to 5000 $cd/mm^2$, and greater than 5000 $cd/mm^2$.

In some embodiments, the wide-spectrum light source 2510 that co-packages the laser device 2502 and the phosphor member 2503 is a surface-mount device (SMD) package. Optionally, the SMD package is hermetically sealed. Optionally, the common support member is provided for supporting the laser device 2502 and the phosphor member 2503. Optionally, the common support member provides a heat sink configured to provide thermal impedance of less than 10 degrees Celsius per watt, an electronic board configured to provide electrical connections for the laser device, a driver for modulating the laser emission, and sensors associated with the SMD package to monitor temperature and optical power. Optionally, the electronic board is configured to provide electrical contact for anode(s) and cathode(s) of the SMD package. Optionally, the electronic board may include or embed a driver for providing temporal modulation for applications related to communication such as LiFi free-space light communication, and/or data communications using optic fiber. Or, the driver may be configured to provide temporal modulation for applications related to LiDAR remote sensing to measure distance, generate 3D images, or other enhanced 2D imaging techniques. Optionally, the sensors include a thermistor for monitor temperatures and photodetectors for providing alarm or operation condition signaling. Optionally, the sensors include fiber sensors. Optionally, the electronic board has a lateral dimension of 50 mm or smaller.

Figure 18:
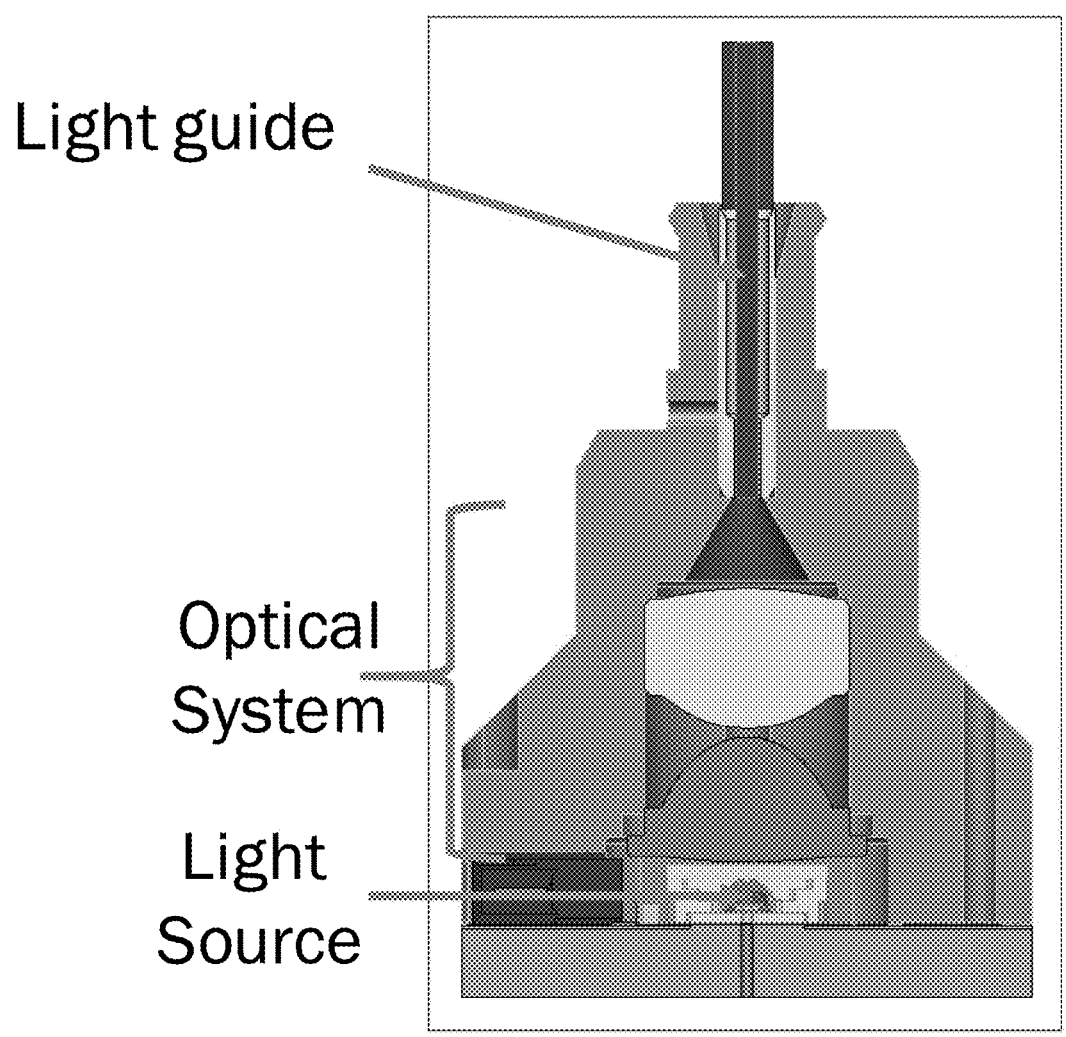
FIG. 18 is a simplified cross-sectional view of an exemplary fiber-coupled wide-spectrum light system according to an embodiment of the present invention.
Figure 19:
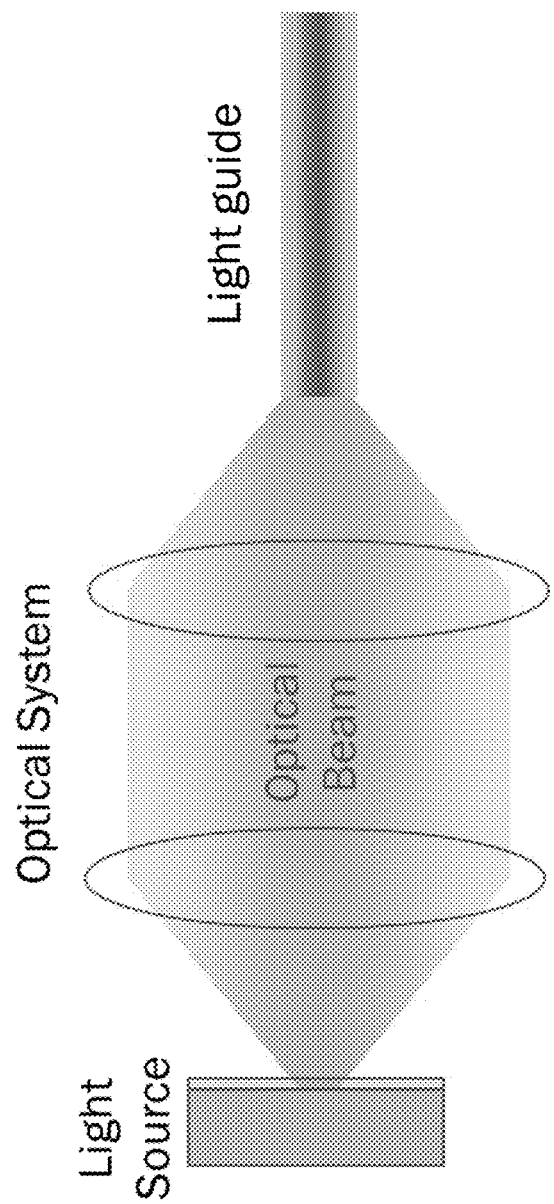
FIG. 19 is a simplified diagram of an exemplary fiber-coupled wide-spectrum light system according to an embodiment of the present invention.

In some embodiments, the wide-spectrum light source 2510 includes one or more optics members to process the wide-spectrum light emission out of the phosphor member 2503 either in reflection mode or transmissive mode. Optionally, the one or more optics members include lenses with high numerical apertures to capture Lambertian emission (primarily for the wide-spectrum light emission out of the surface of the phosphor member 2503). As shown in FIG. 18, an optical system may include one or more optics members to process the emission from a light source and provide the emission to a light guide. The one or more optics members in some embodiments include at least two refractive lenses as shown in FIG. 19. One lens to collimate the wide-spectrum light emission and one lens to focus the collimated beam to image the wide-spectrum light source onto an input tip of a light guide. The one or more optics members may be configured to couple the wide-spectrum light emission into the light guide having a core diameter ranging from about 5 μm to greater than 1 mm. As shown in FIG. 18, the light source and optical system may be arranged and aligned in a housing that also provides alignment with the light guide. The light source may be a laser-based SMD package, examples of which are described in this application. Optionally, the one or more optics members include reflectors such as mirrors, MEMS devices, or other light deflectors. Optionally, the one or more optics members include a combination of lenses and reflectors (including total-internal-reflector). Optionally, each or all of the one or more optics members is configured to be less than 50 mm in dimension for ultra-compact packaging solution.

In some embodiments, the laser-based light guide-coupled wide-spectrum light system 2500 also includes a light guide device 2520 coupled to the wide-spectrum light source 2510 to deliver a beam of wide-spectrum light emission to a light head module at a remote destination or directly serve as a light releasing device in various lighting applications. In an embodiment, the light guide device 2520 is an optical fiber to deliver the wide-spectrum light emission from a first end to a second end at a remote site. Optionally, the optical fiber is comprised of a single mode fiber (SMF) or a multi-mode fiber (MMF). Optionally, the fiber is a glass communication fiber with core diameters ranging from about 1 um to 10 um, about 10 um to 50 um, about 50 um to 150 um, about 150 um to 500 um, about 500 um to 1 mm, or greater than 1 mm, yielding greater than 90% per meter transmissivity. The optical core material of the fiber may consist of a glass such as silica glass wherein the silica glass could be doped with various constituents and have a predetermined level of hydroxyl groups (OH) for an optimized propagation loss characteristic. The glass fiber material may also be comprised of a fluoride glass, a phosphate glass, or a chalcogenide glass. In an alternative embodiment, a plastic optical fiber is used to transport the wide-spectrum light emission with greater than 50% per meter transmissivity. In another alternative embodiment, the optical fiber is comprised of lensed fiber which optical lenses structure built in the fiber core for guiding the electromagnetic radiation inside the fiber through an arbitrary length required to deliver the wide-spectrum light emission to a remote destination. Optionally, the fiber is set in a 3-dimensional (3D) setting that fits in different lighting application designs along a path of delivering the wide-spectrum light emission to the remote destination. Optionally, the light guide device 2520 is a planar light guide (such as semiconductor light guide formed in silicon wafer) to transport the light in a 2D setting.

In another embodiment, the light guide device 2520 is configured to be a distributed light source. Optionally, the light guide device 2520 is a light guide or a fiber that allows light to be scattered out of its outer surface at least partially. In one embodiment, the light guide device 2520 includes a leaky fiber to directly release the wide-spectrum light emission via side scattering out of the outer surface of the fiber. Optionally, the leaky fiber has a certain length depending on applications. Within the length, the wide-spectrum light emission coupled in from the wide-spectrum light source 2510 is substantially leaked out of the fiber as an illumination source. Optionally, the leaky fiber is a directional side scattering fiber to provide preferential illumination in a particular angle. Optionally, the leaky fiber provides a flexible 3D setting for different 3D illumination lighting applications. Optionally, the light guide device 2520 is a form of leaky light guide formed in a flat panel substrate that provides a 2D patterned illumination in specific 2D lighting applications.

In an alternative embodiment, the light guide device 2520 is a leaky fiber that is directly coupled with the laser device to couple a laser light in blue spectrum. Optionally, the leaky fiber is coated or doped with phosphor material in or on surface to induce different colored phosphor emission and to modify colors of light emitted through the phosphor material coated thereover.

Figure 20:
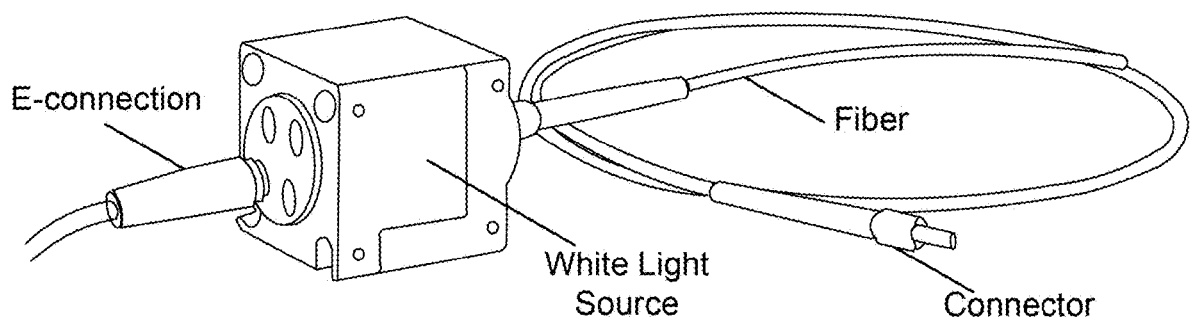
FIG. 20 is an exemplary diagram of a laser-based fiber-coupled wide-spectrum light system according to an embodiment of the present invention.

In a specific embodiment, as shown in FIG. 20, the laser-based fiber-coupled wide-spectrum light system includes one wide-spectrum light source coupling a beam of wide-spectrum light emission into a section of fiber. Optionally, the wide-spectrum light source is in a SMD package that holds at least a laser device and a phosphor member supported on a common support member. The common support member may be configured as a heat sink coupled with an electronic board having an external electrical connection (E-connection). The SMD package may also be configured to hold one or more optics members for collimating and focusing the emitted wide-spectrum light emission out of the phosphor member to an input end of the second of fiber and transport the wide-spectrum light to an output end. Optionally, referring to FIG. 20, the wide-spectrum light source is in a package having a cubic shape of with a compact dimension of about 60 mm. The E-connection is provided at one (bottom) side while the input end of the fiber is coupled to an opposite (front) side of the package. Optionally, the output end of the fiber, after an arbitrary length, includes an optical connector. Optionally, the optical connector is just at a middle point, instead of the output end, of the fiber and another section of fiber with a mated connector (not shown) may be included to further transport the wide-spectrum light to the output end. Thus, the fiber becomes a detachable fiber, convenient for making the laser-based fiber-coupled wide-spectrum light system a modular form that includes a wide-spectrum light source module separately and detachably coupled with a light head module. For example, a SMA-905 type connector is used. Optionally, the electronic board also includes a driver configured to modulate (at least temporarily the laser emission for LiFi communication or for LiDAR remote sensing.

In an alternative embodiment, the laser-based fiber coupled wide-spectrum light system includes a wide-spectrum light source in SMD package provided to couple one wide-spectrum light emission to split into multiple fibers. In yet another alternative embodiment, the laser-based fiber-coupled wide-spectrum light system includes multiple SMD-packaged wide-spectrum light sources coupling a combined beam of the wide-spectrum light emission into one fiber.

In an embodiment, the laser-based fiber-coupled wide-spectrum light system 2500 includes one wide-spectrum light source 2510 in SMD package coupled with two detachable sections of fibers joined by an optical connector. Optionally, SMA, FC, or other optical connectors can be used, such as SMA-905 type connector.

Optionally, the fiber 2520 includes additional optical elements at the second end for collimating or shaping or generating patterns of exiting wide-spectrum light emission in a cone angle of 5~50 degrees. Optionally, the fiber 2520 is provided with a numerical aperture of 0.05~0.7 and a diameter of less than 2 mm for flexibility and low-cost.

In an embodiment, the wide-spectrum light source 2510 can be made as one package selected from several different types of integrated laser-induced wide-spectrum light sources shown from FIG. 6 through FIG. 16. Optionally, the package is provided with a dimension of 60 mm for compactness. The package provides a mechanical frame for housing and fixing the SMD packaged wide-spectrum light source, phosphor members, electronic board, one or more optics members, etc., and optionally integrated with a driver. The phosphor member 2503 in the wide-spectrum light source 2510 can be set as either reflective mode or transmissive mode. Optionally, the laser device 2502 is mounted in a mounted in a surface mount-type package and sealed with a cap member. Optionally, the laser device 2502 is mounted in a surface mount package mounted onto a starboard. Optionally, the laser device 2502 is mounted in a flat-type package with a collimating optic member coupled. Optionally, the laser device 2502 is mounted in a flat-type package and sealed with a cap member. Optionally, the laser device 2502 is mounted in a can-type package with a collimating lens. Optionally, the laser device 2502 is mounted in a surface mount type package mounted on a heat sink with a collimating reflector. Optionally, the laser device 2502 is mounted in a surface mount type package mounted on a starboard with a collimating reflector. Optionally, the laser device 2502 is mounted in a surface mount type package mounted on a heat sink with a collimating lens. Optionally, the laser device 2502 is mounted in a surface mount type package mounted on a heat sink with a collimating lens and reflector member.

Many benefits and applications can be yielded out of the laser-based fiber-coupled wide-spectrum light system. For example, it is used as a distributed light source with thin plastic optical fiber for low-cost wide-spectrum fiber lighting, including daytime running lights for car headlights, interior lighting for cars, outdoor lighting in cities and shops. Alternatively, it can be used for communications and data centers. Also, a new linear light source is provided as a light wire with <1 mm in diameter, producing either wide-spectrum light or RGB color light. Optionally, the linear light source is provided with a laser-diode plus phosphor source to provide wide-spectrum light to enter the fiber that is a leaky fiber to distribute side scattered wide-spectrum light. Optionally, the linear light source is coupled RGB laser light in the fiber that is directly leak side-scattered RGB colored light. Optionally, the linear light source is configured to couple a blue laser light in the fiber that is coated with phosphor material(s) to allow laser-pumped phosphor emission be side-scattered out of the outer surface of the fiber. Analogously, a 2D patterned light source can be formed with either arranging the linear fiber into a 2D setting or using 2D solid-state light guides instead formed on a planar substrate.

Figure 21:
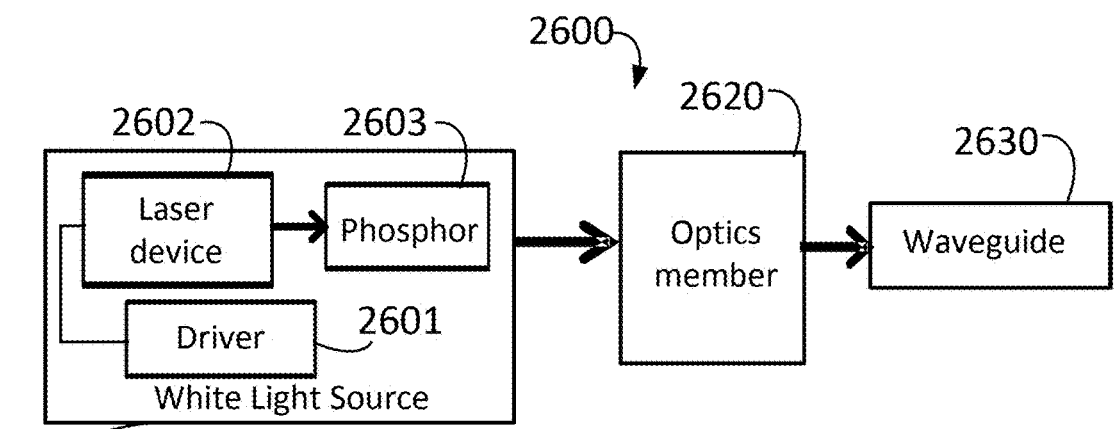
FIG. 21 is a simplified block diagram of a laser-based fiber-coupled wide-spectrum light system according to another embodiment of the present invention.

In an alternative embodiment, FIG. 21 shows a simplified block diagram of a functional laser-based light guide-coupled wide-spectrum light system 2600. The laser-based light guide-coupled wide-spectrum light system 2600 includes a wide-spectrum light source 2610, substantially similar to the wide-spectrum light source 2510 shown in FIG. 20, having at least one laser device 2602 configured to emit blue spectrum laser beam of a first wavelength to a phosphor member 2603. The at least one laser device 2602 is driven by a laser driver 2601. The laser driver 2601 generates a drive current adapted to drive one or more laser diodes. In a specific embodiment, the laser driver 2601 is configured to generate pulse-modulated signal at a frequency range of about 50 to 300 MHz. The phosphor member 2603 is substantially the same as the phosphor member 2503 as a wavelength converter and emitter being excited by the laser beam from the at least one laser device 2602 to produce a phosphor emission with a second wavelength in yellow spectrum. The phosphor member 2603 may be packaged together with the laser device 2602 in a CPoS structure on a common support member. The phosphor emission is partially mixed with the laser beam with the first wavelength in violet or blue spectrum to produce a wide-spectrum light emission. Optionally, the light guide-coupled wide-spectrum light system 2600 includes a laser-induced wide-spectrum light source 2610 containing multiple laser diode devices 2602 in a co-package with a phosphor member 2603 and driven by a driver module 2601 to emit a laser light of 1 W, 2 W, 3 W, 4 W, 5 W or more power each, to produce brighter wide-spectrum light emission of combined power of 6 W, or 12 W, or 15 W, or more. Optionally, the wide-spectrum light emission out of the laser-induced wide-spectrum light source with a luminance of 100 to 500 cd/mm$^2$, 500 to 1000 cd/mm$^2$, 1000 to 2000 cd/mm$^2$, 2000 to 5000 cd/mm$^2$, and greater than 5000 cd/mm$^2$. Optionally, the wide-spectrum light emission is a reflective mode emission out of a spot of a size greater than 5 um on an excitation surface of the phosphor member 2603 based on a configuration that the laser beam from the laser device 2602 is guided to the excitation surface of the phosphor member 2603 with an off-normal angle of incidence ranging between 0 degrees and 89 degrees.

In the embodiment, the laser-based light guide-coupled wide-spectrum light system 2600 further includes an optics member 2620 configured to collimate and focus the wide-spectrum light emission out of the phosphor member 2603 of the wide-spectrum light source 2610. Furthermore, the laser-based light guide-coupled wide-spectrum light system 2600 includes a light guide device or assembly 2630 configured to couple with the optics member 2620 receive the focused wide-spectrum light emission with at least 20%, 40%, 60%, or 80% coupling efficiency. The light guide device 2630 serves as a transport member to deliver the wide-spectrum light to a remotely set device or light head module. Optionally, the light guide device 2630 serves an illumination member to direct perform light illumination function. Preferably, the light guide device 2630 is a fiber. Optionally, the light guide device 2630 includes all of the types of fiber, including single mode fiber, multiple module, polarized fiber, leaky fiber, lensed fiber, plastic fiber, etc.

Figure 22:
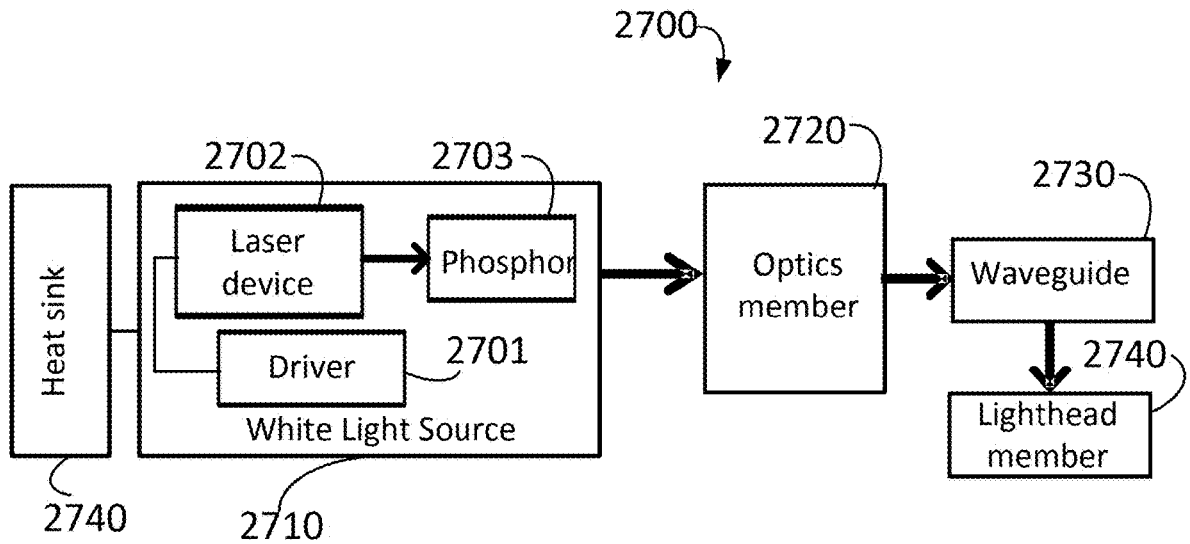
FIG. 22 is a simplified block diagram of a laser-based fiber-coupled wide-spectrum light system according to yet another embodiment of the present invention.

FIG. 22 shows a simplified block diagram of a laser-based light guide-coupled wide-spectrum light system 2700 according to yet another alternative embodiment of the present disclosure. As shown, a laser-based wide-spectrum light source 2710 including a laser device 2702 driven by a driver module 2701 to emit a laser beam of electromagnetic radiation with a first wavelength in violet or blue spectrum range. The electromagnetic radiation with the first wavelength is landed to an excitation surface of a phosphor member 2703 co-packaged with the laser device 2702 in a CPoS structure in the wide-spectrum light source 2710. The phosphor member 2703 serves as a wavelength converter and an emitter to produce a phosphor emission with a second wavelength in yellow spectrum range which is partially mixed with the electromagnetic radiation of the first wavelength to produce a wide-spectrum light emission reflected out of a spot on the excitation surface. Optionally, the laser device 2702 includes one or more laser diodes containing gallium and nitrogen in active region to produce laser of the first wavelength in a range from 385 nm to 495 nm. Optionally, the one or more laser diodes are driven by the driver module 2701 and laser emission from each laser diode is combined to be guided to the excitation surface of the phosphor member 2703. Optionally, the phosphor member 2703 comprises a phosphor material characterized by a wavelength conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. Additionally, the ceramic YAG:Ce phosphors is characterized by a temperature quenching characteristics above 150° C., above 200° C., or above 250° C. and a high thermal conductivity of 5-10 W/(m·K) to effectively dissipate heat to a heat sink member and keep the phosphor member at an operable temperature.

In the embodiment, the laser device 2702, the diver module 2710, and the phosphor member 2703 are mounted on a support member containing or in contact with a heat sink member 2740 configured to conduct heat generated by the laser device 2702 during laser emission and the phosphor member 2703 during phosphor emission. Optionally, the support member is comprised of a thermally conductive material such as copper with a thermal conductivity of about 400 W/(m·K), aluminum with a thermal conductivity of about 200 W/(m·K), 4H-SiC with a thermal conductivity of about 370 W/(m·K), 6H-SiC with a thermal conductivity of about 490 W/(m·K), AlN with a thermal conductivity of about 230 W/(m·K), a synthetic diamond with a thermal conductivity of about >1000 W/(m·K), sapphire, or other metals, ceramics, or semiconductors. The support member may be formed from a growth process such as SiC, AlN, or synthetic diamond, and then mechanically shaped by machining, cutting, trimming, or molding. Optionally, the support member is a High Temperature Co-fired Ceramic (HTCC) submount structure configured to embed electrical conducting wires therein. This type of ceramic support member provides high thermal conductivity for efficiently dissipating heat generated by the laser device 2702 and the phosphor member 2703 to a heatsink that is made to contact with the support member. The ceramic support member also can allow optimized conduction wire layout so that ESD can be prevented and thermal management of the whole module can be improved. Electrical pins are configured to connect external power with conducting wires embedded in the HTTC ceramic submount structure for providing drive signals for the laser device 2702. Optionally, the wide-spectrum light source 2710 includes a temperature sensor (not shown) that can be disposed on the support member. Alternatively, the support member may be formed from a metal such as copper, copper tungsten, aluminum, or other by machining, cutting, trimming, or molding. Optionally, the one or more laser diodes are producing an aggregated output power of less than 1 W, or about 1 W to about 10 W, or about 10 W to about 30 W, or about 30 W to 100 W, or greater. Each of the laser diodes is configured on a single ceramic or multiple chips on a ceramic, which are disposed on the heat sink member 2740.

In the embodiment, the laser-based light guide-coupled wide-spectrum light source 2700 includes a package holding the one or more laser diodes 2702, the phosphor member 2703, the driver module 2701, and a heat sink member 2740. Optionally, the package also includes or couples to all free optics members 2720 such as couplers, collimators, mirrors, and more. The optics members 2720 are configured spatially with optical alignment to couple the wide-spectrum light emission out of the excitation surface of the phosphor member 2703 or refocus the wide-spectrum light emission into a light guide 2730. Optionally, the light guide 2730 is a fiber or a light guide medium formed on a flat panel substrate. As an example, the package has a low profile and may include a flat pack ceramic multilayer or single layer. The layer may include a copper, a copper tungsten base such as butterfly package or covered CT mount, Q-mount, or others. In a specific embodiment, the laser devices are soldered on CTE matched material with low thermal resistance (e.g., AlN, diamond, diamond compound) and forms a sub-assembled chip on ceramics. The sub-assembled chip is then assembled together on a second material with low thermal resistance such as copper including, for example, active cooling (i.e., simple water channels or micro channels), or forming directly the base of the package equipped with all connections such as pins. The flatpack is equipped with an optical interface such as window, free space optics, connector or fiber to guide the light generated and a cover environmentally protective.

In the embodiment, the laser-based light guide-coupled wide-spectrum light source 2700 further includes an optics member 2720 for coupling the wide-spectrum light emission out of the wide-spectrum light source 2710 to a light guide device 2730. Optionally, the optics member 2720 includes free-space collimation lens, mirrors, focus lens, fiber adaptor, or others. Optionally, the light guide device 2730 includes flat-panel light guide formed on a substrate or optical fibers. Optionally, the optical fiber includes single-mode fiber, multi-mode fiber, lensed fiber, leaky fiber, or others. Optionally, the light guide device 2730 is configured to deliver the wide-spectrum light emission to a lighthead member 2740 which re-shapes and projects the wide-spectrum light emission to different kinds of light beams for various illumination applications. Optionally, the light guide device 2730 itself serves an illumination source or elements being integrated in the lighthead member 2740.

Figure 23:
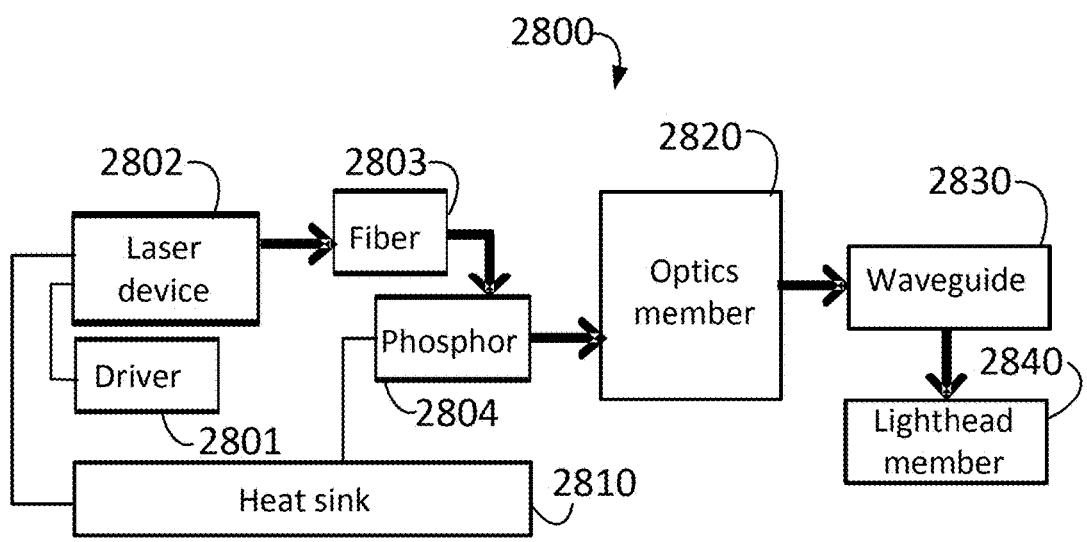
FIG. 23 is a simplified block diagram of a laser-based fiber-coupled wide-spectrum light system according to still another embodiment of the present invention.

FIG. 23 shows a simplified block diagram of a laser-based light guide-coupled wide-spectrum light system 2800 according to a specific embodiment of the present disclosure. Referring to FIG. 23, the laser-based light guide-coupled wide-spectrum light system 2800 includes a laser device 2802 configured as one or more laser diodes (LDs) mounted on a support member and driven by a driver 2801 to emit a beam of laser electromagnetic radiation characterized by a first wavelength ranging from 395 nm to 490 nm. The support member is formed or made in contact with a heat sink 2810 for sufficiently transporting thermal energy released during laser emission by the LDs. Optionally, the laser-based light guide-coupled wide-spectrum light system 2800 includes a fiber for collecting the laser electromagnetic radiation with at least 20%, 40%, 60%, or 80% coupling efficiency and deliver it to a phosphor 2804 in a certain angular relationship to create laser spot on an excitation surface of the phosphor 2804. The phosphor 2804 also serves an emitter to convert the incoming laser electromagnetic radiation to a phosphor emission with a second wavelength longer than the first wavelength. Optionally, the phosphor 2804 is also mounted or made in contact with the heat sink 2810 common to the laser device 2802 in a CPoS structure to allow heat due to laser emission and wavelength conversion being properly released. Optionally, a blocking member may be installed to prevent leaking out the laser electromagnetic radiation by direct reflection from the excitation surface of the phosphor 2804.

In the embodiment, a combination of laser emission of the laser device 2802, the angular relationship between the fiber-delivered laser electromagnetic radiation and the excitation surface of the phosphor 2804, and the phosphor emission out of the spot on the excitation surface leads to at least a partial mixture of the phosphor emission with the laser electromagnetic radiation, which produces a wide-spectrum light emission. In the embodiment, the laser-based light guide-coupled wide-spectrum light system 2800 includes an optics member 2820 configured to collimate and focus the wide-spectrum light emission into a light guide 2830. Optionally, the optics member 2820 is configured to couple the wide-spectrum light emission into the light guide 2830 with at least 20%, 40%, 60%, or 80% coupling efficiency. Optionally, the optics member 2820 includes free-space collimation lens, mirrors, focus lens, fiber adaptor, or others. Optionally, a non-transparent boot cover structure may be installed to reduce light loss to environment or causing unwanted damage.

In the embodiment, the laser-based light guide-coupled wide-spectrum light source 2800 further includes a lighthead member 2840 coupled to the light guide 2830 to receive the wide-spectrum light emission therein. Optionally, the light guide 2830 includes flat-panel light guide formed on a substrate or optical fibers. Optionally, the optical fiber includes single-mode fiber, multi-mode fiber, lensed fiber, leaky fiber, or others. Optionally, the light guide 2830 is configured to deliver the wide-spectrum light emission to the lighthead member 2840 which is disposed at a remote location convenient for specific applications. The lighthead member 2840 is configured to amplify, re-shape, and project the collected wide-spectrum light emission to different kinds of light beams for various illumination applications. Optionally, the light guide 2830 itself serves an illumination source or element being integrated in the lighthead member 2840.

Figure 24:
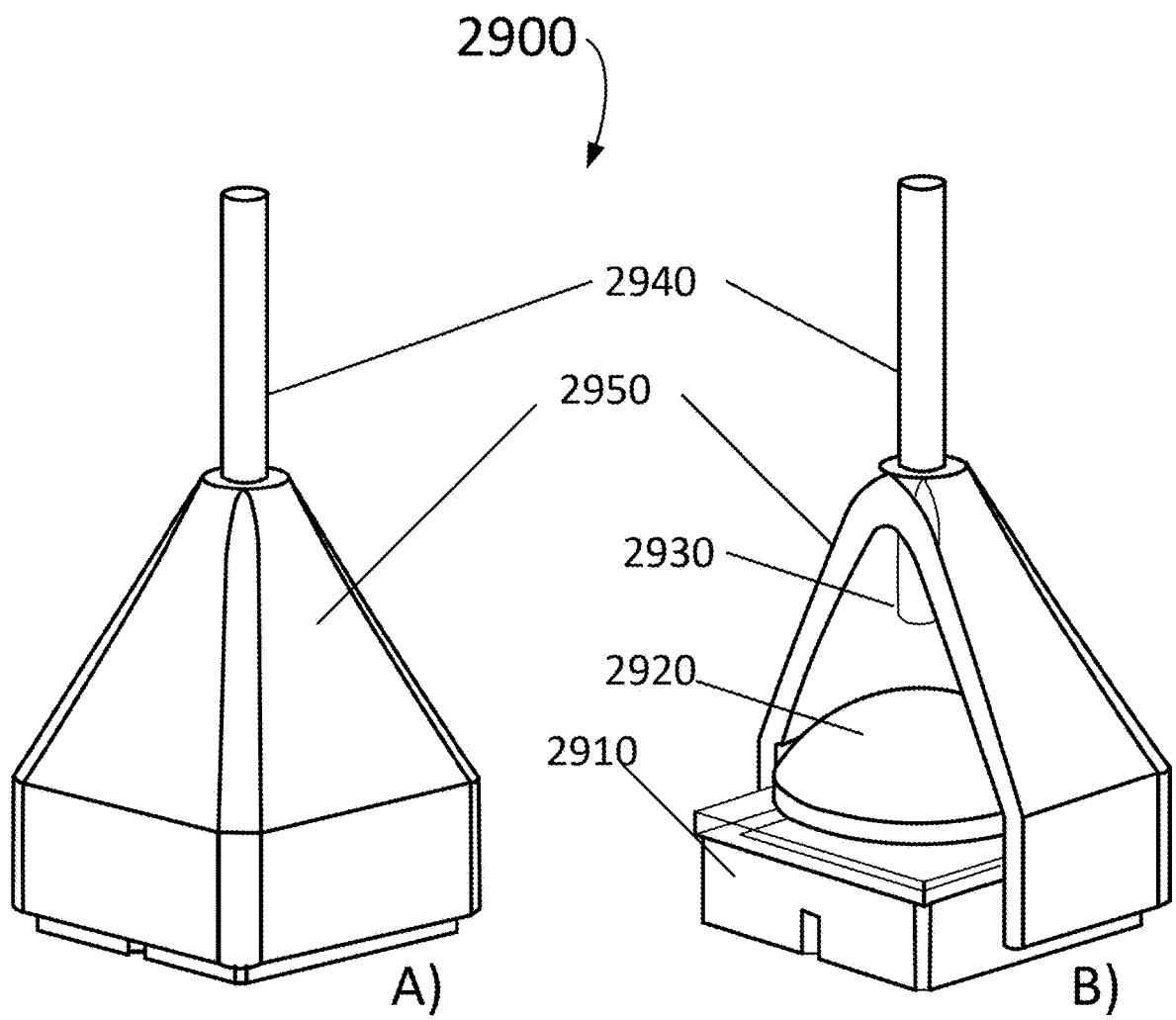
FIG. 24 is a simplified diagram of A) a laser-based fiber-coupled wide-spectrum light system based on surface mount device (SMD) wide-spectrum light source and B) a laser-based fiber-coupled wide-spectrum light system with partially exposed SMD wide-spectrum light source according to an embodiment of the present invention.

FIG. 24 is a simplified diagram of A) a laser-based fiber-coupled wide-spectrum light system based on surface mount device (SMD) wide-spectrum light source and B) a laser-based fiber-coupled wide-spectrum light system with partially exposed SMD wide-spectrum light source according to an embodiment of the present invention. This diagram is merely an example, which should not unduly limit the scope of the claims. One of ordinary skill in the art would recognize many variations, alternatives, and modifications. As shown, the laser-based fiber-coupled wide-spectrum light system 2900 is based on a laser-induced wide-spectrum light source 2910 configured in a surface-mount device (SMD) package. In some embodiments, the laser-induced wide-spectrum light source 2910 is provided as one selected from the SMD-packaged laser-based wide-spectrum light sources shown in FIG. 6 through FIG. 16, and configured to produce a wide-spectrum light emission with a luminance of 100 to 500 cd/mm$^2$, 500 to 1000 cd/mm$^2$, 1000 to 2000 cd/mm$^2$, 2000 to 5000 cd/mm$^2$, and greater than 5000 cd/mm$^2$. Optionally, the SMD-package wide-spectrum light source is made in contact with a heat sink to conduct the heat away during operation.

In an embodiment shown in FIG. 24, a lens structure 2920 is integrated with the SMD-packaged wide-spectrum light source 2910 and configured to collimate and focus the wide-spectrum light emission outputted by the wide-spectrum light source 2910. Optionally, the lens structure 2920 is mounted on top of the SMD-package. Optionally, the light guide-coupled wide-spectrum light system 2900 includes a cone shaped boot cover 2950 and the lens structure 2920 is configured to have its peripheral being fixed to the boot cover 2950. The boot cover 2950 also is used for fixing a fiber 2940 with an end facet 2930 inside the boot cover 2950 to align with the lens structure 2920. A geometric combination of the lens structure 2920 and the cone shaped boot structure 2950 provides a physical alignment between the end facet 2930 of the fiber 2940 and the lens structure 2920 to couple the wide-spectrum light emission into the fiber with at least 20%, 40%, 60%, or 80% coupling efficiency. The fiber 2940 is then provided for delivering the wide-spectrum light emission for illumination applications. Optionally, the boot cover 2950 is made by non-transparent solid material, such as metal, plastic, ceramic, or other suitable materials.

Figure 25:
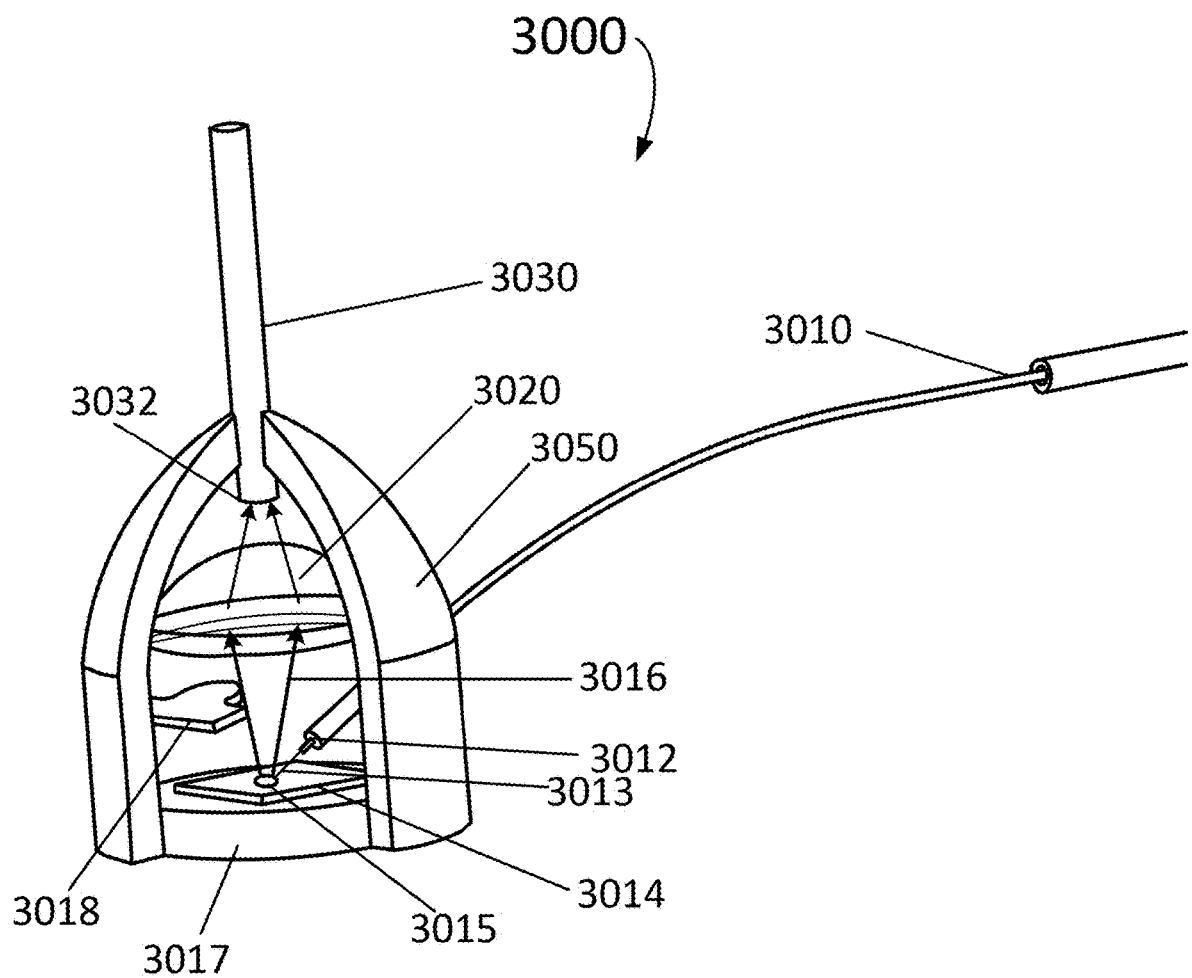
FIG. 25 is a simplified diagram of a laser-based fiber-coupled wide-spectrum light system based on fiber-in and fiber-out configuration according to another embodiment of the present invention.

FIG. 25 is a simplified diagram of a fiber-delivered-laser-induced fiber-coupled wide-spectrum light system based on fiber-in and fiber-out configuration according to another embodiment of the present invention. In the embodiment, the fiber-delivered-laser-induced fiber-coupled wide-spectrum light system 3000 includes a phosphor plate 3014 mounted on a heat sink support member 3017 which is remoted from a laser device. The phosphor plate 3014 is configured as a wavelength converting material and an emission source to receive a laser beam 3013 generated by the laser device and delivered via a first optical fiber 3010 and exited a first fiber end 3012 in an angled configuration (as shown in FIG. 25) to land on a surface spot 3015 of the phosphor plate 3014. The laser beam 3013 includes electromagnetic radiation substantially at a first wavelength in violet or blue spectrum range from 385 nm to 495 nm. The laser beam 3013 exits the fiber end 3012 with a confined beam divergency to land in the surface spot 3015 where it is absorbed at least partially by the phosphor member 3914 and converted to a phosphor emission with a second wavelength substantially in yellow spectrum. At least partially, the phosphor emission is mixed with the laser beam 3013 exited from the first fiber end 3012 or reflected by the surface of the phosphor plate 3014 to produce a wide-spectrum light emission 3016. The wide-spectrum light emission 3016 is outputted substantially in a reflection mode from the surface of the phosphor plate 3014.

In an embodiment, the fiber-delivered-laser-induced fiber-coupled wide-spectrum light system 3000 further includes a lens 3020 configured to collimate and focus the wide-spectrum light emission 3016 to a second end facet 3032 of a second optical fiber 3030. The lens 3020 is mounted inside a boot cover structure 3050 and has its peripheral fixed to the inner side of the boot cover structure 3050. Optionally, the boot cover structure 3050 has a downward cone shape with bigger opening coupled to the heat sink support member 3017 and a smaller top to allow the second optical fiber 3030 to pass through. The second optical fiber 3030 is fixed to the smaller top of the boot cover structure 3050 with a section of fiber left inside thereof and the second end facet 3032 substantially aligned with the lens 3020. The lens 3020 is able to focus the wide-spectrum light emission 3016 into the second end facet 3032 of the second optical fiber 3030 with at least 20%, 40%, 60%, or 80% coupling efficiency. The second optical fiber 3020 can have arbitrary length to either deliver the wide-spectrum light emission coupled therein to a remote destination or functionally serve as an illumination element for direct lighting. For example, the second optical fiber 3030 is a leaky fiber that directly serves as an illumination element by side-scattering the light out of its outer surface either uniformly or restricted in a specific angle range.

Figure 26:
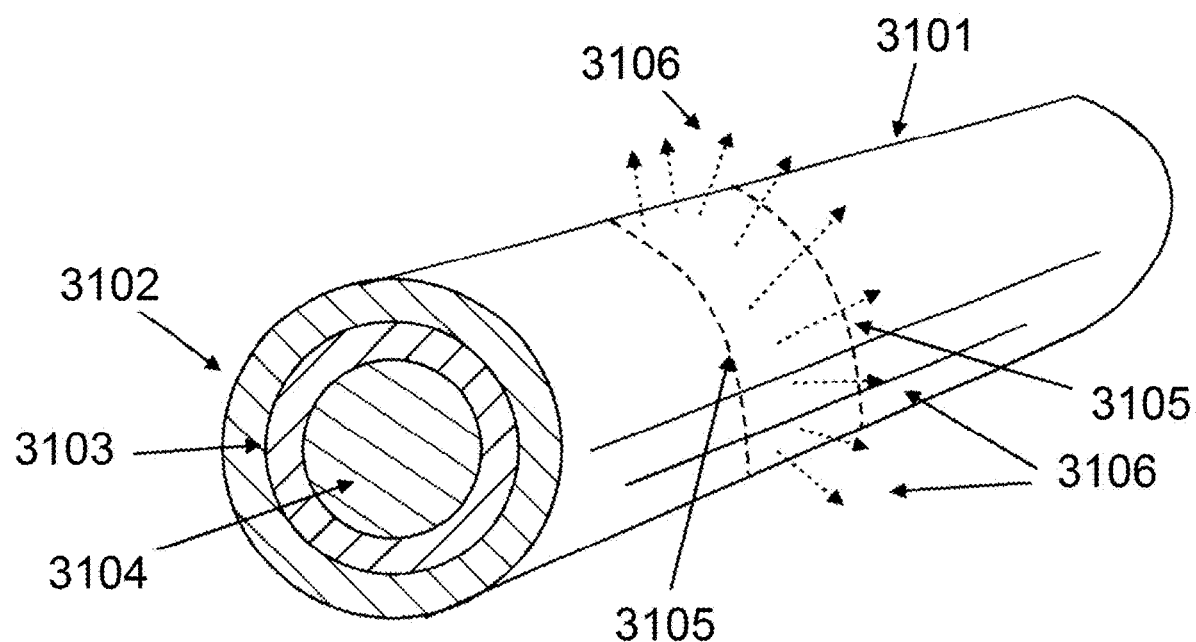
FIG. 26 is a schematic diagram of a leaky fiber used for a laser-based fiber-coupled wide-spectrum light system according to an embodiment of the present invention.

FIG. 26 is a schematic diagram of a leaky fiber used for a laser-based fiber-coupled wide-spectrum light system according to an embodiment of the present invention. Referring to the embodiment shown in FIG. 25, the optical fiber 3030 can be chosen from a leaky fiber that allows electromagnetic radiation coupled therein to leak out via a side firing effect like an illuminating filament. As shown in FIG. 26, a section 3105 of the leaky fiber 3101 allows radiation 3106 to leak from the fiber core 3104 through the cladding 3103. A buffer 3102 is a transparent material covering the cladding 3103. The radiation 3106 is leaked out substantially in a direction normal to the longitudinal axis of the optical fiber 3101.

Figure 27:
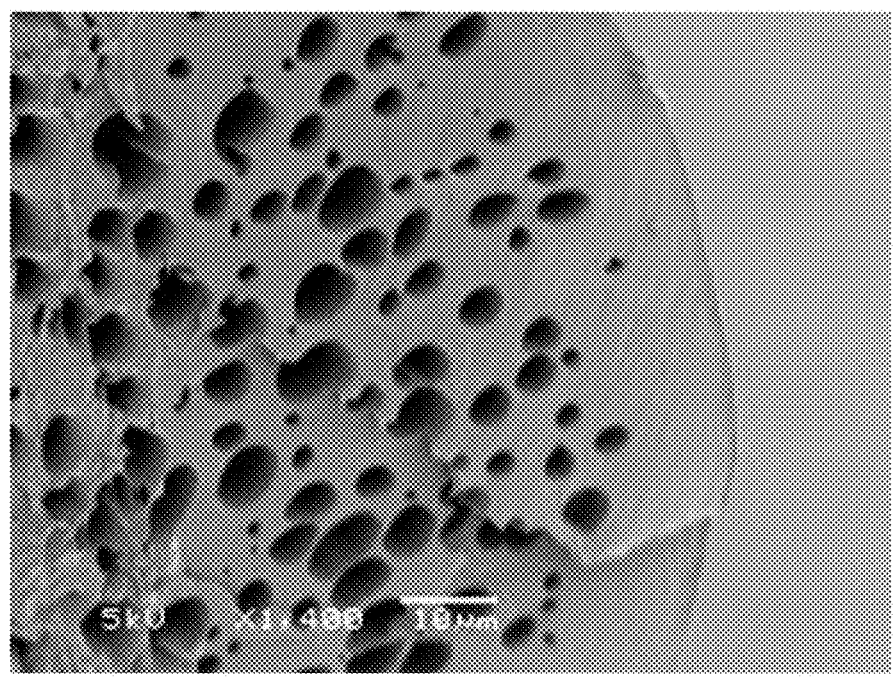
FIG. 27 is an exemplary image of a leaky fiber with a plurality of holes in fiber core according to an embodiment of the present invention.

FIG. 27 is an exemplary image of a leaky fiber with a plurality of holes in fiber core according to an embodiment of the present invention. Referring to FIG. 27, a polymer fiber is provided with a plurality of air bubbles formed in its core. The air bubbles act as light scattering centers to induce leaking from the fiber sidewalls.

Figure 28:
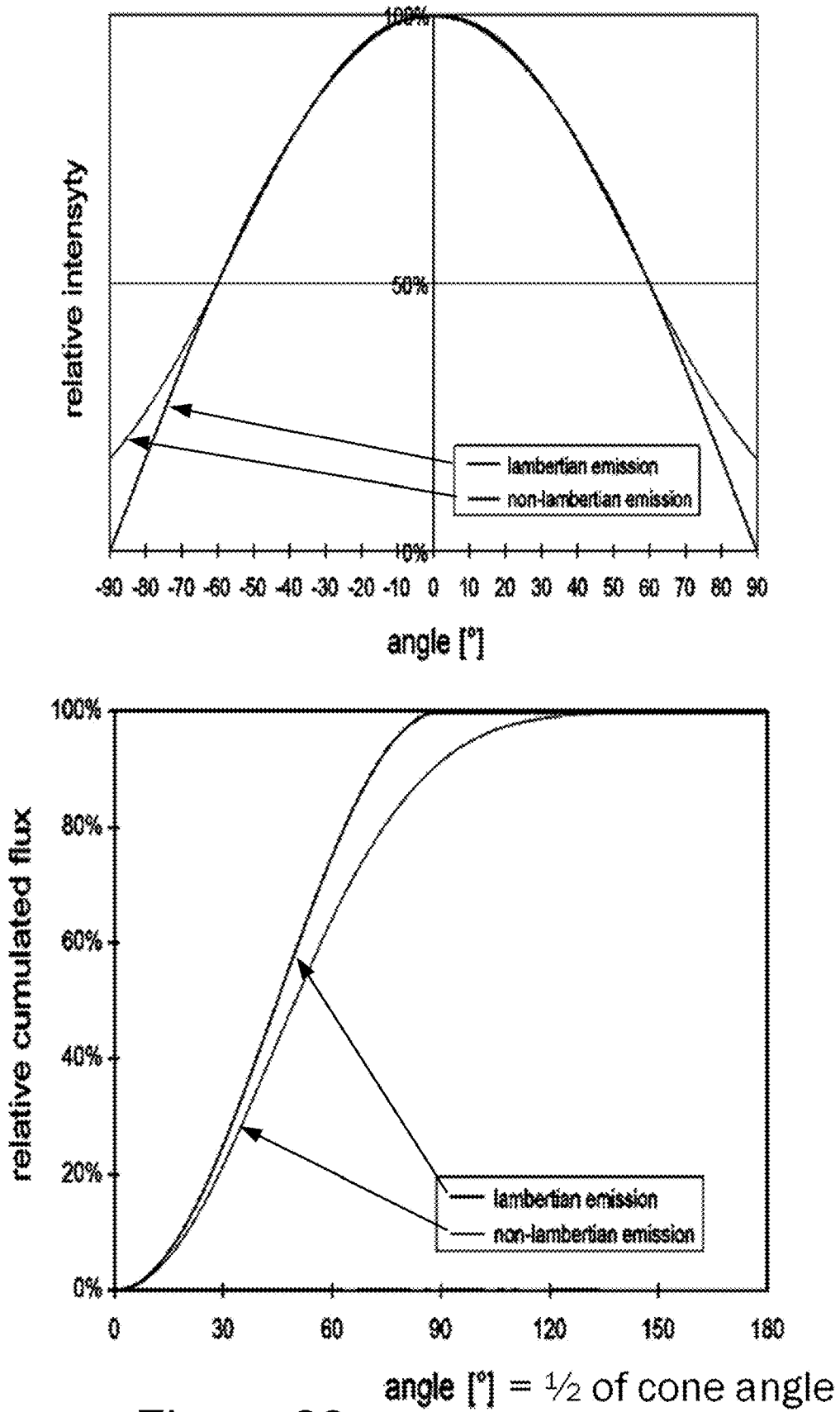
FIG. 28 shows light capture rate for Lambertian emitters according to an embodiment of the present invention.

In some embodiments, each of the laser-based fiber-coupled wide-spectrum light systems described herein includes a wide-spectrum light emitter (such as phosphor-based emitter to convert a laser radiation with a first wavelength to a phosphor emission with a second wavelength) and a fiber configured to couple the emission from the wide-spectrum light emitter with high efficiency. Some assumptions can be laid out to calculate some fundamental features of the light capture requirement for the system. For example, the wide-spectrum light emitter is assumed to be a Lambertian emitter. FIG. 28 shows light capture rate for Lambertian emitters according to an embodiment of the present invention. As shown, a first plot shows relative intensity versus geometric angle of the Lambertian emission comparing with a non-Lambertian emission. A full-width half maximum (FWHM) of the spectrum is at ~120 degrees (−60 deg to 60 deg) for the Lambertian emission. A second plot shows relative cumulated flux versus a half of cone angle for light capture. Apparently, with a FWHM cone angle of 120 deg., 60% of light of the Lambertian emission can be captured. Optionally, all the wide-spectrum emissions out of the phosphor surface in either a reflective mode or transmissive mode in the present disclosure are considered to be substantially Lambertian emission.

Figure 29:
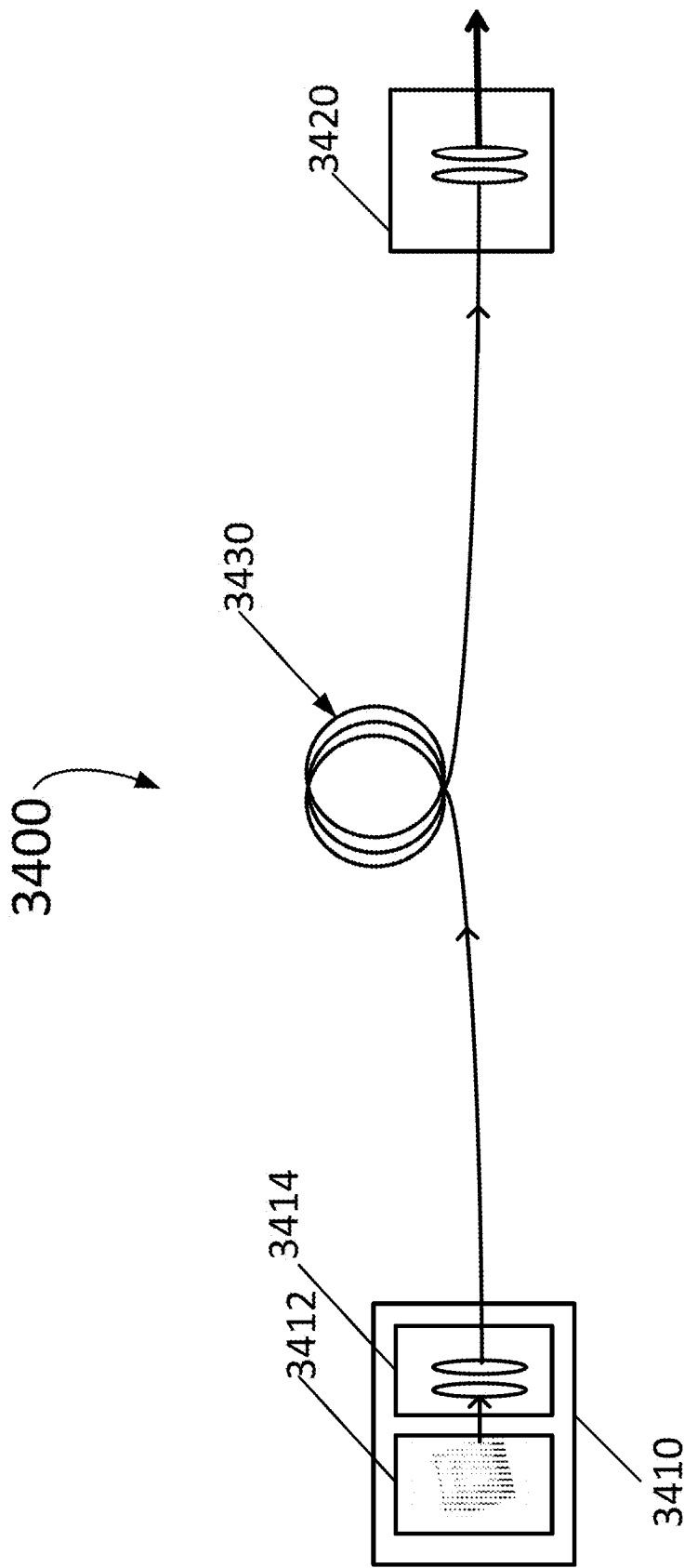
FIG. 29 is a schematic diagram of a fiber-delivered wide-spectrum light for automotive headlight according to an embodiment of the present invention.

In an embodiment, the present disclosure provides a fiber delivered automobile headlight. FIG. 29 shows a schematic functional diagram of the fiber delivered automobile headlight 3400 comprised of a high luminance wide-spectrum light source 3410 that is efficiently coupled into a light guide 3430 that used to deliver the wide-spectrum light to a final headlight module 3420 that collimates the light and shapes it onto the road to achieve the desired light pattern. The wide-spectrum light source 3410 is based on laser device 3412 configured to generate a blue laser outputted from a laser chip containing gallium and nitride material. The blue laser generated by the laser chip is led to a phosphor device 3414 integrated with optical beam collimation and shaping elements to excite a wide-spectrum light emission. Optionally, the wide-spectrum light source 3410 is a laser-based SMD-packaged white light source (LaserLight-SMD offered by Kyocera SLD Laser, Inc), substantially selected from one of multiple SMD-package wide-spectrum light sources described in FIGS. 14 through 24. Optionally, the light guide 3430 is an optical transport fiber. Optionally, the headlight module 3420 is configured to deliver 35% or 50% or more light from source 3410 to the road. In an example, the wide-spectrum light source 3410, based on etendue conservation and lumen budget from source to road and Lambertian emitter assumption of FIG. 28, is characterized by about 1570 lumens (assuming 60% optical efficiency for coupling the wide-spectrum light emission into a fiber), 120 deg FWHM cone angle, about 0.33 mm source diameter for the wide-spectrum light emission. In the example, the transport fiber 3430 applied in the fiber-delivered headlight 3400 is characterized by 942 lumens assuming 4 uncoated surfaces with about 4% loss in headlight module 3420, about 0.39 numerical aperture and cone angle of ~40 deg, and about 1 mm fiber diameter. Additionally, in the example, the headlight module 3420 of the fiber-delivered headlight 3400 is configured to deliver light to the road with 800 lumens output in total efficiency of greater than 35%, +/−5 deg vertical and +/−10 deg horizontal beam divergency, and having 4×4 mm in size. Optionally, each individual element above is modular and can be duplicated for providing either higher lumens or reducing each individual lumen setting wide-spectrum increasing numbers of modules.

In another example, four SMD-packaged wide-spectrum light sources, each providing 400 lumens, can be combined in the wide-spectrum light source 3410 to provide at least 1570 lumens. The transport fiber needs for separate sections of fibers respectively guiding the wide-spectrum light emission to four headlight modules 3420, each outputting 200 lumens, with a combined size of 4×16 mm. In yet another example, each wide-spectrum light source 3410 yields about 0.625 mm diameter for the wide-spectrum light emission. While, the fiber 3430 can be chosen to have 0.50 numerical aperture, cone angle of ~50 deg, and 1.55 mm fiber diameter. In this example, the headlight module 3420 is configured to output light in 800 lumens to the road with total efficiency of greater than 35% and a size as small as ~7.5 mm.

In an embodiment, the design of the fiber delivered automobile headlight 3400 is modular and therefore can produce the required amount of light for low beam and/or high beam in a miniature Headlight Module footprint. An example of a high luminance wide-spectrum light source 3410 is the LaserLight-SMD packaged wide-spectrum light source which contains 1 or more high-power laser diodes (LDs) containing gallium-and-nitrogen-based emitters, producing 500 lumens to thousands of lumens per device. For example, low beams require 600-800 lumens on the road, and typical headlight optics/reflectors have 35% or greater, or 50% or greater optical throughput. High luminance light sources are required for long-range visibility from small optics. For example, based on recent driving speeds and safe stopping distances, a range of 800 meters to 1 km is possible from 200 lumens on the road using an optics layout smaller than 35 mm with source luminance of 1000 cd per mm$^2$. Using higher luminance light sources allows one to achieve longer-range visibility for the same optics size. High luminance is required to produce sharp light gradients and the specific regulated light patterns for automotive lighting. Moreover, using a light guide 3430 such as an optical fiber, extremely sharp light gradients and ultra-safe glare reduction can be generated by reshaping and projecting the decisive light cutoff that exists from core to cladding in the light emission profile. As a result, the fiber delivered automobile headlight 3400 is configured to minimize glare and maximize safety and visibility for the car driver and others including oncoming traffic, pedestrians, animals, and drivers headed in the same direction traffic ahead.

Color uniformity from typical white LEDs are blue LED pumped phosphor sources, and therefore need careful integration with special reflector design, diffuser, and/or device design. Similarly, typical blue laser excited yellow phosphor needs managed with special reflector design. In an embodiment of the present invention, spatially homogenous wide-spectrum light is achieved by mixing of the light in the light guide, such as a multimode fiber. In this case, a diffuser is typically not needed. Moreover, one can avoid costly and time-consuming delays associated with color uniformity tuning redesign of phosphor composition, or of reflector designs.

Laser pumped phosphors used in the laser-based fiber-delivered automobile headlight 3400 are broadband solid-state light sources and therefore featured the same benefits of LEDs, but with higher luminance. Direct emitting lasers such as R-G-B lasers are not safe to deploy onto the road since R-G-B sources leave gaps in the spectrum that would leave common roadside targets such as yellow or orange with insufficient reflection back to the eye. The present design is cost effective since it utilizes a high-luminance wide-spectrum light source with basic macro-optics, a low-cost transport fiber, and low-cost small macro-optics to product a miniature headlight module 3420. Because of the remote nature of the light sources 3410, the wide-spectrum light source 3410 can be mounted onto a pre-existing heat sink with adequate thermal mass that is located anywhere in the vehicle, eliminating the need for heat sink in the headlight.

In the present invention, the laser-based fiber coupled wide-spectrum light system is configured for a lighting application. Such lighting applications include, but are not limited to specialty lighting applications, general lighting applications, mobile machine lighting applications such as automotive lighting, truck lighting, avionics on lighting, drone lighting, marine vehicle lighting, infrastructure lighting application such as bridge lighting, tunnel lighting, down-hole lighting, architectural lighting applications, safety lighting applications, applications for appliance or utility lighting such as in refrigerators, freezers, ovens, or other appliances, in a submerged lighting application such as for lighting spas, lighting for jacuzzis, lighting for swimming pools, or even lighting in natural bodies of water including lakes, oceans, or rivers.

In a preferred embodiment, the present invention comprising a laser-based fiber-coupled wide-spectrum light source is configured in a distributed or central lighting system. In this preferred embodiment one or more laser-based light sources are housed in a first designated location. An electrical power source is coupled to an electrical driver unit configured to supply current and voltage to the laser-based wide-spectrum light source. The supplied power is configured to activate one or more laser diodes comprised in the laser-based light source to generate wide-spectrum light. One or more fibers are optically coupled to the one or more laser-based wide-spectrum light sources. The one or more optical fibers are configured to transport the wide-spectrum light from the first designated location to one or more illumination locations. In some examples, the illumination locations could be configured at short distances from the first designated source location such as less than 5 meters or less 1 meter. In other examples, the illumination locations could be configured at longer distances from the first designated source location such as more than about 5 meters or more than about 50 meters. In other examples the illumination locations could be configured at a very large distance from the first designated source location such as more than about 500 meters.

Figure 30:
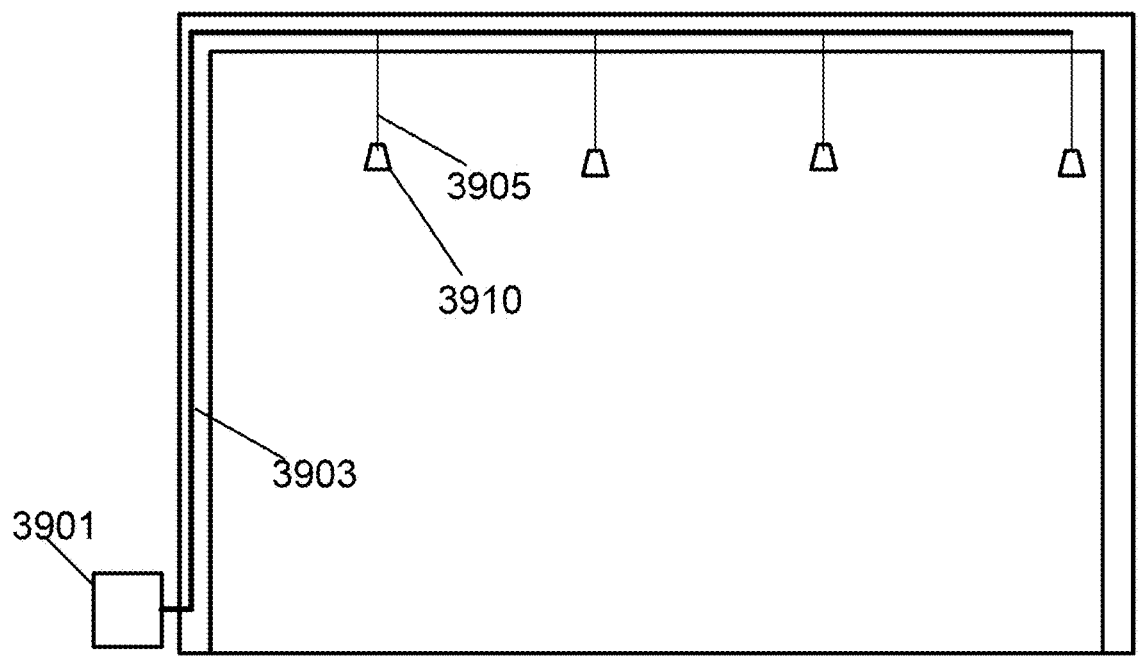
FIG. 30 is a schematic diagram of a laser-based wide-spectrum lighting system according to an embodiment of the present invention.

FIG. 30 presents a schematic diagram of a laser-based wide-spectrum lighting system according to an embodiment of the present invention. As seen in FIG. 30, a laser-based wide-spectrum light source 3901 is located in a first designated source location. One or more optical transport fibers 3903 are optically coupled to the wide-spectrum light source 3901. The wide-spectrum light enters the one or more optical transport fibers 3903. The optical transport fibers 3903 serve as light guide to transport the wide-spectrum light to one or more illumination areas. The total optical coupling efficiency of the wide-spectrum light emission to the one or more fibers could range from about 30% to 50%, 50% to 70%, 70% to 90%, or greater than 90%. As shown in FIG. 30, the wide-spectrum light is transported to a designated illumination space. Optionally, the illumination space is an interior room, which could be located in a home, office, workspace, store, warehouse, or other types spaces where light would be needed. The transport fibers 3903 are routed to different illumination locations within the designated illumination space. The wide-spectrum light transported by the fibers 3903 enters various luminaire members configured to emit the wide-spectrum light in a pre-determined pattern on specific locations within the illumination space. In some configurations there are multiple fibers 3903 coupled to the wide-spectrum light source 3901 wherein each of the fibers 3903 is routed to its own unique illumination location. In other configurations there is one (or more) fiber 3903 coupled to the wide-spectrum light source 3091 wherein the one (or more) fiber is then split into multiple fibers and the multiple fibers are then routed to the individual illumination locations. Optionally, the multiple fibers are scattering or leaky fibers 3905 configured to emit or leak the wide-spectrum light. Optionally, the splitting of the wide-spectrum light from the one (or more) fiber to the multiple fibers could be accomplished with fiber splitters, switches, or mirrors.

Optionally, the luminaire members include one or more passive luminaries 3910. In the example of FIG. 30, passive luminaires 3910 are deployed at the end of the one or more transport fibers to modify the light before the light interacts with the target location. The passive luminaires 3910 function to modify the light by one or more of directing the light, scattering the wide-spectrum light, shaping the wide-spectrum light, reflecting the wide-spectrum light, modify the color temperature or rendering index of the wide-spectrum light, or other effects. In addition to the passive luminaire members 3910 of the wide-spectrum light system according to FIG. 30, scattering fiber or leaky fiber elements 3905 could be included in the wide-spectrum light system.

Optionally, the leaky fibers form line emitting wide-spectrum light sources in the illumination space, which could be in combination with the passive luminaires 3910 or could be standalone and embedded into the architectural design features such as baseboard or crown molding.

There are many advantages to such a central or distributed lighting system. By running passive optical fibers throughout infrastructure such as homes or buildings to deliver light instead of electrical wires the cost and complexity of the lighting system can be reduced and the risk of fire or other hazards would be lower providing a safe environment. Since there are thousands of feet of copper wire within the walls, ceilings, and floors of conventional buildings that could be replaced with lower cost glass or plastic fibers, laser-based wide-spectrum lighting systems provide a tremendous cost saving opportunity. Moreover, since the copper wires powering conventional lighting systems are often charged with high voltage, elimination or reduction of such high voltage lines from the building can reduce the risk of arcing or sparking, and thereby reduce the risk of fires.

Another benefit according to the present invention is an improved styling lighting system. With large amounts of light [200 lumens to 3000 lumens] delivered from a tiny optical fiber [core diameter of 100 µm to 2 mm, or greater such as 3 to 4 mm], the lighting fixtures used to manipulate, shape, and direct the light to the desired target can be drastically smaller than conventional lights based on LEDs or bulb technology, greatly improving the styling and reduce the cost of the lighting system. Additionally, since leaky fibers can be used to create a distributed or line light source that is not efficiently possible with LED, improved light styling can be achieved and light can actually be integrated into the building material such that it is "hidden" without discrete and acute light fixtures, which are often ugly to the human eye.

Energy savings can be realized in a laser-based central lighting system according to the present invention since the light source can be located remote from the illumination area. That is, the light source which generates a substantial amount of heat generation can be spatially isolated from an illumination area to prevent adding any unwanted thermal energy into the illumination area. For example, in a hot weather climate where air conditioners are running continuously to cool indoor environments, it is desirable to remove all heat generating objects and processes from the space. With conventional lighting where the light source is fixed to the location of emission [co-located], the light sources effectively act as heaters and counteract the cooling processes, making the system less efficient. For example, a single light source can dissipate from 1 W to 100 W, so in a situation where each light dissipates 10 W of heat in a large area where 100 or more of these lights would be required, over 1 kW of waste heat would be dissipated in the illumination area. With a fiber delivered laser-based wide-spectrum light source all of the heat generation from the source could be de-coupled from the illumination area, and thereby not contribute to undesired heating. However, in situations where heat was desired in the area of illumination [e.g., cold climate], the heat could be collected from the laser-based wide-spectrum light system and transported to the area via a duct or other means.

In yet an additional benefit of this central lighting or distributed lighting embodiment according to the present invention on fiber delivered laser-based wide-spectrum light, the replacement of a defective or failed laser-based light source or upgrade to an improved source would have reduced complexity compared to that of replacing conventional bulb or LED technology. With conventional sources where the actual light generating source is co-located with the emission area [e.g., in a ceiling] one must access the emission location to replace a failed or defective source, or upgrade their lights to improved or differentiated lights. Since the emission area or location of lighting are often in high areas that are not easily acceptable, it can be very time consuming, expensive and even dangerous to replace such sources. It can take hours or even days to replace the overhead lighting in offices or homes and may require special equipment such as ladders and mechanically powered lifts. In more extreme examples such as street lighting, bridge lighting, or tunnel lighting, the job to replace the light sources can include strong dangers associated with the equipment and the environment, and carry very high costs, which are incurred by the corporations, the private parties, or even by the taxpayers in government or municipal applications. In the present invention wherein the laser-based wide-spectrum light sources are located in an area remote from the emission points, the light sources could be contained in an easily accessed location where source change out could be fast, efficient, safe, and require no specialized equipment that can add to the cost and complexity of light source.

In an embodiment, the wide-spectrum light generated by the laser-based wide-spectrum light source is transported from the first designated source location to one or more illumination locations where the wide-spectrum light is configured to illuminate one or more objects and/or areas. In one example the laser-based wide-spectrum light source is comprised of a surface mount device (SMD) type source wherein one or more laser diodes are co-packaged with one or more wavelength converting elements such as phosphor members. The overall laser-based wide-spectrum light source could be comprised of multiple individual sources such as multiple laser-based wide-spectrum light emitting SMD sources. The multiple sources could be arranged in a common housing with a common power supply configured in arrangements such as arrayed or stack arrangements. In an alternative arrangement the individual sources are configured in separate housing members with separate power supplies. In an embodiment, the design would enable the replacement of the one or more laser-based wide-spectrum light sources when a source failure occurs, a defective source is encountered, or an upgrade or modification is desired.

According to an embodiment, each of the one or more laser-based wide-spectrum light sources could be coupled to one or more transport optical fibers, wherein the transport optical fiber is configured to transport the wide-spectrum light from the first designated source location to one or more illumination areas. As an example, one of the one or more SMD sources could be configured to generate a wide-spectrum light emission with between 50 and 5000 lumens emitting from an emission area on the phosphor of 50 um to about 1 mm, or to about 3 mm, or larger. In another example, the laser-based wide-spectrum light source could be configured with a T0-cannister package.

In another example configuration of the laser-based wide-spectrum lighting system according to the present invention includes one or more laser-based wide-spectrum light sources configured with a laser beam formed from the combination of multiple laser diode chips either by combining the beam from multiple individually packaged laser diodes or by combing the laser beams from the laser chips within a multi-chip laser package configured to combine the output emission beams from the multiple laser chips. In some examples, a combination of packaged laser types are used. The combined laser beams could be collimated using optical members in some embodiments and would be configured to excite a phosphor and generate the wide-spectrum light. The wide-spectrum light emission from the phosphor generated by the combined laser beams is coupled into an optical fiber member wherein the optical fiber member is configured to transport the wide-spectrum light and/or scatter the wide-spectrum light to create a line source. By using multi-chip package or multi-chip configurations the total optical power in the combined laser beam can be >10 W, >30 W, >50 W, 100 W, or greater than 500 W. With such high optical powers, very large wide-spectrum light lumen levels can be generated at one or more phosphors. For example, greater than 1,000 lumens, greater than 2,000 lumens, greater than 5,000 lumens, greater than 10,000 lumens, or greater than 100,000 lumens can be generated. This generated wide-spectrum light at the one or more phosphor members can then be fiber coupled to transport fibers to deliver the wide-spectrum light to one or more desired illumination areas. The one or more transport fibers could be comprised from one or more solid core fibers, one or more fiber bundles, a combination of solid core and fiber bundle type fibers, or other types of fibers. In some embodiments leaky or scattering fibers are included to make a line source.

In some embodiments, the combined laser beams from a multi-chip package or from multiple separate packaged lasers are coupled into an optical fiber wherein the optical fiber is configured to transport the laser light to a remote phosphor to form a remote wide-spectrum light source. By using multi-chip package or multi-chip configurations the total optical power in the combined laser beam can be >10 W, >30 W, >50 W, 100 W, or greater than 500 W. With such high optical powers, very large wide-spectrum light lumen levels can be generated at one or more phosphors. For example, greater than 1,000 lumens, greater than 2,000 lumens, greater than 5,000 lumens, greater than 10,000 lumens, or greater than 100,000 lumens can be generated. This generated wide-spectrum light at the one or more phosphor members can then be fiber coupled to transport fibers to deliver the wide-spectrum light to one or more desired illumination areas. The one or more transport fibers could be comprised from one or more solid core fibers, one or more fiber bundles, a combination of solid core and fiber bundle type fibers, or other types of fibers. In some embodiments leaky or scattering fibers are included to make a line source.

In one specific embodiment, a high lumen emission spot from the phosphor is configured to emit 1000 to 5000 lumens or more lumens of wide-spectrum light from a spot area of about 300 μm to about 3 mm, or larger. One or more plastic or glass optical transport fibers are coupled to the wide-spectrum light emission from the phosphor such that between 5% and 95% of the emitted wide-spectrum light is coupled into the one or more optical fibers. The one or more optical fibers comprising 1 to about 10 fibers, or 10 to about 50 fibers, or 50 to about 1500 fibers. The one or more optical fibers could be comprised of solid core optical fibers with core diameters in the range of about 100 μm to about 2 or about 3 mm, or could be comprised of fiber bundled cores wherein the individual strands comprising the bundle could have diameters from about 25 μm to about 250 μm to comprise a "bundled core" diameter of about 200 μm to about 2 mm, or greater such as 3 to 4 mm. The 1 or more optical transport fibers are then routed from the first designated source location to one or more designated illumination locations where they deliver the wide-spectrum light to target or area.

In another specific embodiment, a low to mid lumen emission spot from the phosphor is configured to emit 50 to 1000 lumens of wide-spectrum light from a spot area of about 50 µm to about 1 mm. One or more plastic or glass optical transport fibers are coupled to the wide-spectrum light emission from the phosphor such that between 5% and 95% of the emitted wide-spectrum light is coupled into the one or more optical fibers. The one or more optical fibers comprising 1 to about 5 fibers, or 5 to about 20 fibers, or 20 to about 40 fibers. The one or more optical fibers could be comprised of solid core optical fibers with core diameters in the range of about 100 µm to about 2 mm or greater, or could be comprised of fiber bundled cores wherein the individual strands comprising the bundle could have diameters from about 25 µm to about 250 µm to comprise a "bundled core" diameter of about 200 µm to about 2 mm or greater such as 3 to 4 mm. The 1 or more optical transport fibers are then routed from the first designated source location to one or more designated illumination locations where they deliver the wide-spectrum light to target or area.

Figure 31:
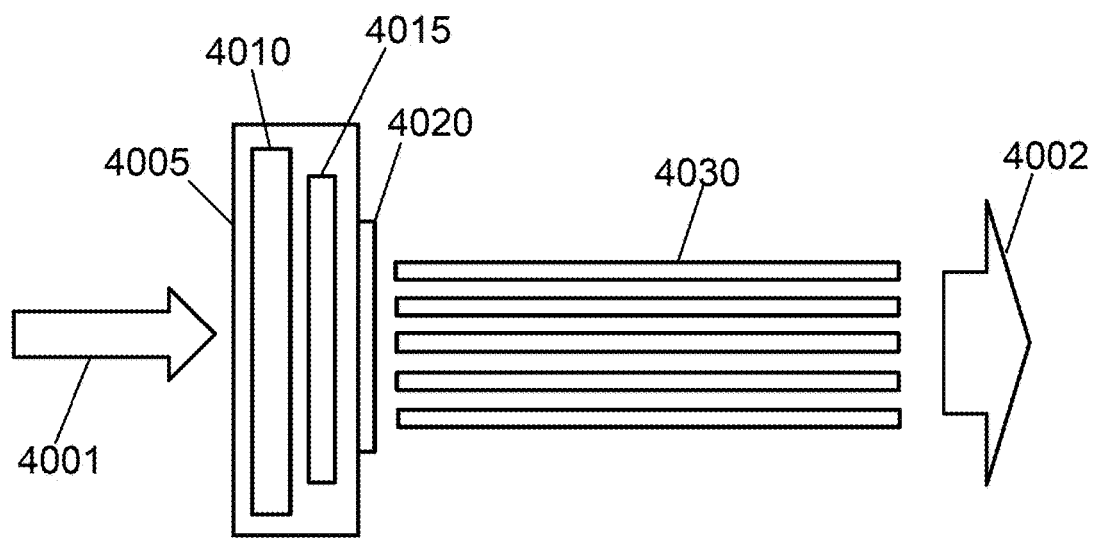
FIG. 31 is a schematic diagram of a laser-based wide-spectrum light source coupled to more-than-one optical fibers according to an embodiment of the present invention.

Several central lighting systems based on laser-based fiber-coupled wide-spectrum light source are disclosed below. FIG. 31 presents a schematic diagram of a laser-based wide-spectrum light source coupled to more than one optical fibers according to an embodiment of the present invention. As shown in the FIG. 31, the laser-based wide-spectrum-light source 4010 is enclosed in a housing member 4005. The wide-spectrum light source 4010 is configured to receive electrical input 4001 to activate wide-spectrum light emission. Optionally, the wide-spectrum light source 4010 includes an electrical driver or circuit board member configured to condition the electrical input 4001. Optionally, the wide-spectrum light emission from the laser-based source 4010 is shaped with optional optical elements 4015 such as collimating lens elements and/or focusing lens elements and is fed into multiple optical fibers 4030 configured to transport the wide-spectrum light 4002. Optionally, connector units 4020 can be included to make for easy detachability of the optical fibers 4030, which would enable replacement of parts or entirety in the housing member 4005 for the light source 4010 or replacement of one or more of the transport optical fibers.

Figure 32:
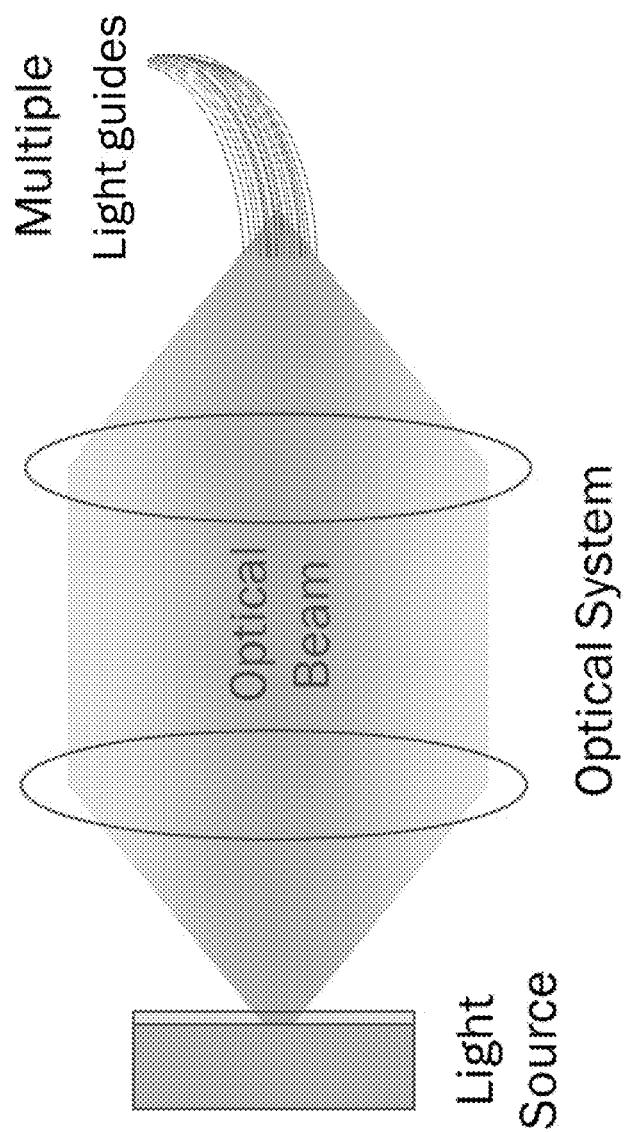
FIG. 32 is a simplified diagram of an exemplary fiber-coupled wide-spectrum light system according to an embodiment of the present invention.

In an embodiment, a wide-spectrum light source may be coupled to one or more transport fibers using one or more optics members. At least one of the optics members may be configured to focus a wide-spectrum light emission onto an input tip of the one or more transport fibers. The one or more transport fibers could be comprised from one or more solid core fibers, one or more fiber bundles, a combination of solid core and fiber bundle type fibers, or other types of fibers. In some embodiments leaky or scattering fibers are included to make a line source. In some embodiments, the one or more transport fibers include multiple optical fibers (e.g., a fiber bundle or light guide array), and the one or more optics members may be configured to image the wide-spectrum light emission onto an input tip of the multiple optical fibers as shown in FIG. 32. Using multiple smaller optical fibers to transport a similar amount of light as a single larger optical fiber can provide a reduced bend radius compared to the single larger optical fiber.

Figure 33:
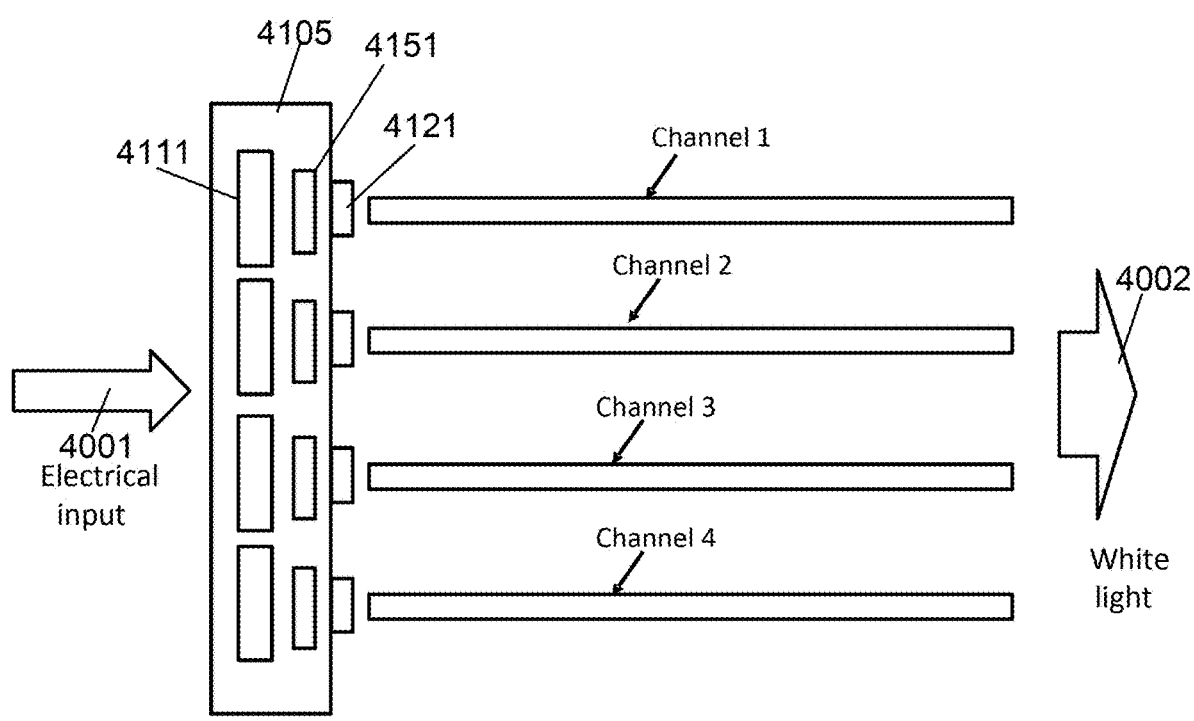
FIG. 33 is a schematic diagram of a laser-based wide-spectrum light source coupled to more than one optical fiber according to another embodiment of the present invention.

FIG. 33 presents a schematic diagram of multiple laser-based wide-spectrum light sources coupled to more than one optical fibers according to another embodiment of the present invention. As shown in the FIG. 33, the multiple laser-based wide-spectrum-light sources 4111 are enclosed in a single housing member 4105. All the wide-spectrum light sources 4111 are configured to receive electrical input 4001 to activate wide-spectrum light emission. Optionally, each of the multiple wide-spectrum light source 4111 includes an electrical driver or circuit board member configured to condition the electrical input 4001. The wide-spectrum light emission from each of the laser-based wide-spectrum light source 4111 is shaped with optional optical elements 4151 such as collimating lens elements and/or focusing lens elements and is fed into a channel (e.g., Channel 1) to transport or output the wide-spectrum light 4002. Optionally, each channel, e.g., Channel 1, includes multiple transport light guides or fibers configured to transport the wide-spectrum light. Optionally, connector units 4121 can be included to make for easy detachability of the optical fibers for each channel to the respective wide-spectrum light source. The connector units 4121 enable replacement of the light source or replacement of the transport fiber elements in each channel.

According to the embodiments of the central lighting or distributed lighting system based on laser-based fiber-coupled wide-spectrum light source, one or more transport fibers in one or more channels could transport the wide-spectrum light from the first designed source area to one or more illumination areas. In one example, the laser-based wide-spectrum light source would provide light through a transport fiber to illuminate a single object or area in a given location or space. In another example, multiple transport fibers are coupled to the one or more wide-spectrum light sources to deliver wide-spectrum light to multiple objects and/or areas within a given area or location such as within a single room. In yet another example, multiple transport fibers are coupled to the one or more wide-spectrum light sources to deliver wide-spectrum light to multiple objects and/or areas within multiple areas or locations such as to different rooms of the same building or house.

In such a "central lighting" system including a laser-based wide-spectrum light source, the illumination locations could include more than one location in a single room or more than one location in more than one room of a structure, and even include indoor and outdoor illumination locations. For example, the laser-based central lighting system could be used to provide illumination to a complete home, a complete office structure, a complete shopping or business building, etc. An important design aspect of the laser-based lighting system is the system efficiency and the related capability to enable tuning the brightness or lumen output independently for each of the different illumination locations. In a simple example, the light output at a given location is controlled by tuning the wide-spectrum light output of the laser-based wide-spectrum light source providing the light to the given location by controlling the electrical input to the source. Although this is a simple approach to control the light output and would be sufficient if the specified laser-based wide-spectrum light source was only providing light to a single illumination location, in configurations wherein one laser-based wide-spectrum light source is coupled into multiple fibers to illuminate multiple locations it does not provide the flexibility to independently control the level of light delivered to each of the multiple locations.

Figure 34:
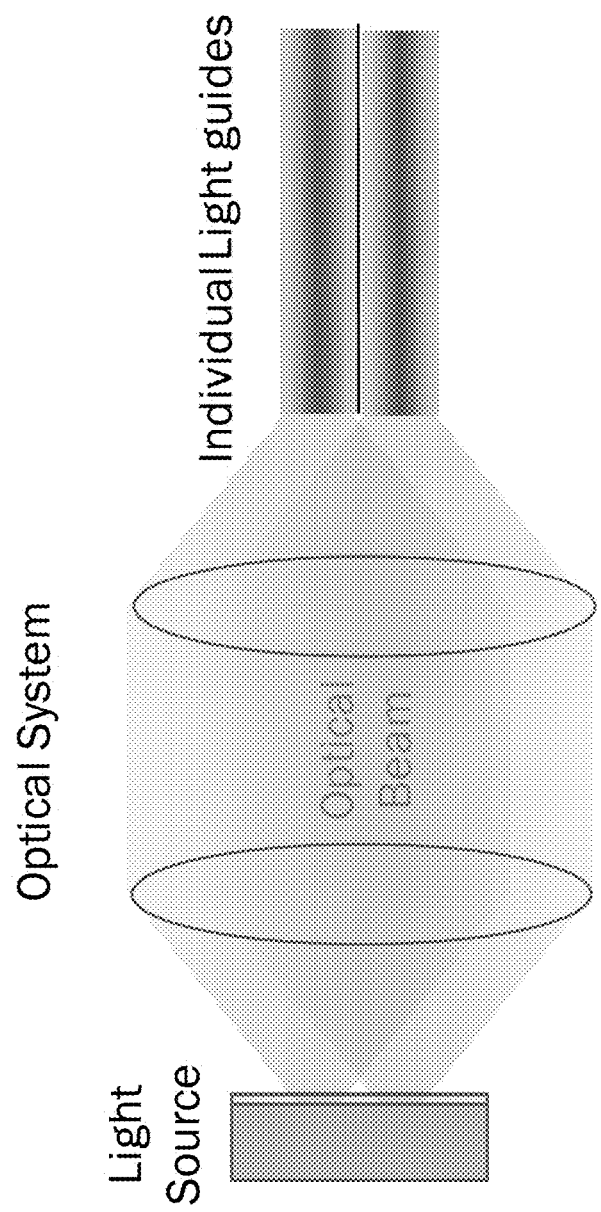
FIG. 34 is a simplified diagram of an exemplary fiber-coupled wide-spectrum light system according to an embodiment of the present invention.

In an embodiment, one or more optics members may be configured to provide discrete spots or beams from a wide-spectrum light source into multiple light guides (e.g., fibers, a fiber bundle, a light guide, light guide array). For example, one or more optics members may be configured to image individual emissions from a wide-spectrum light source onto input ends of individual light guides. In the example shown in FIG. 34, multiple emissions from a wide-spectrum light source are imaged onto the input ends of corresponding individual light guides. One of the optics members may be configured to collimate the emissions and another optics member may be configured to focus the emissions onto the input tips of the light guides. The one or more optics members may be configured so that the discrete spots can be close spatially (e.g., within a few millimeters, within one millimeter, within less than one millimeter), allowing the light guides to be arranged accordingly.

Figures 35A, 35B:
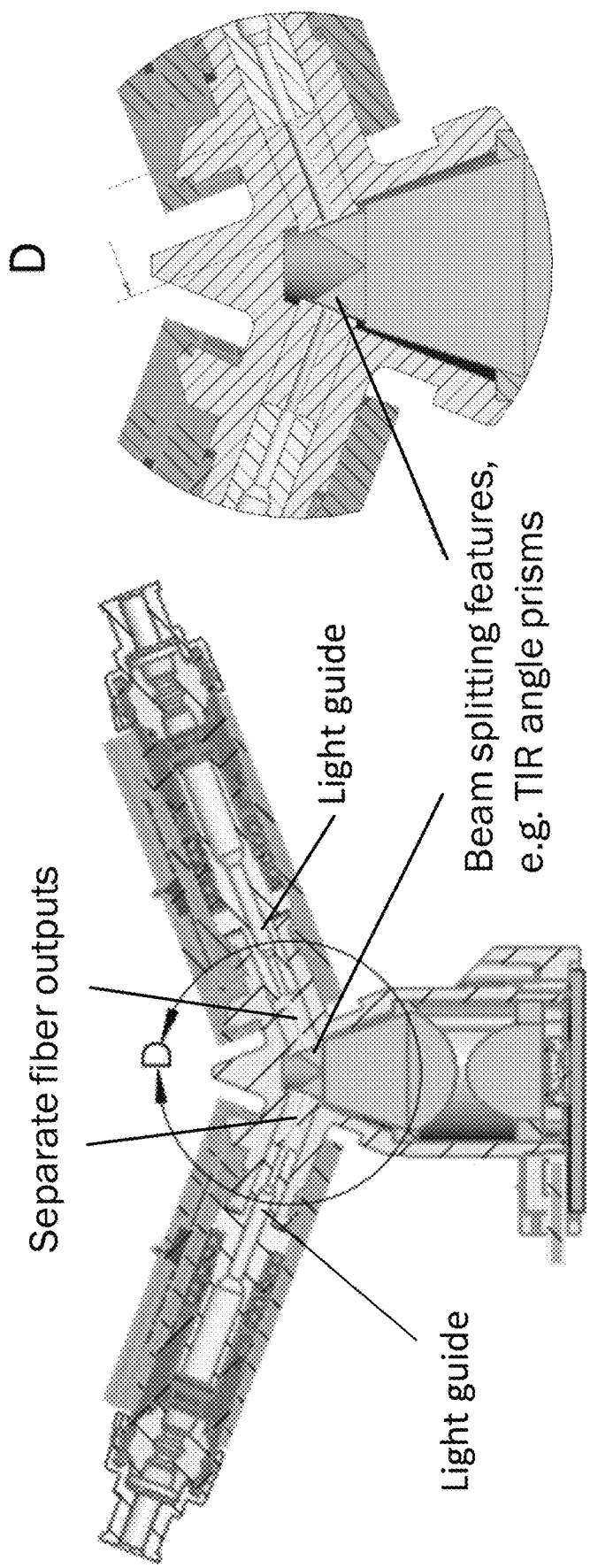
FIG. 35A is a simplified cross-sectional view of an exemplary fiber-coupled wide-spectrum light system according to an embodiment of the present invention.
FIG. 35B is an enlarged view of a portion of FIG. 35A shown in circle D.

In other embodiments, spots or beams from a single wide-spectrum light source may be imaged onto the input ends of more than one light guide. FIG. 35A provides an example where an output from a single source is split by one or more optics members so that individual source spots are imaged onto the input tips of two light guides. FIG. 35B is an enlarged view showing the one or more optics members including one or more mirrors and/or prisms that are used to split an emission from a single wide-spectrum light source. A single light source may be imaged onto the input ends of multiple light guides in other embodiments. As shown in FIGS. 35A-35B, the light source and optical system may be arranged and aligned in a housing that also provides alignment with the multiple light guides.

Figure 36:
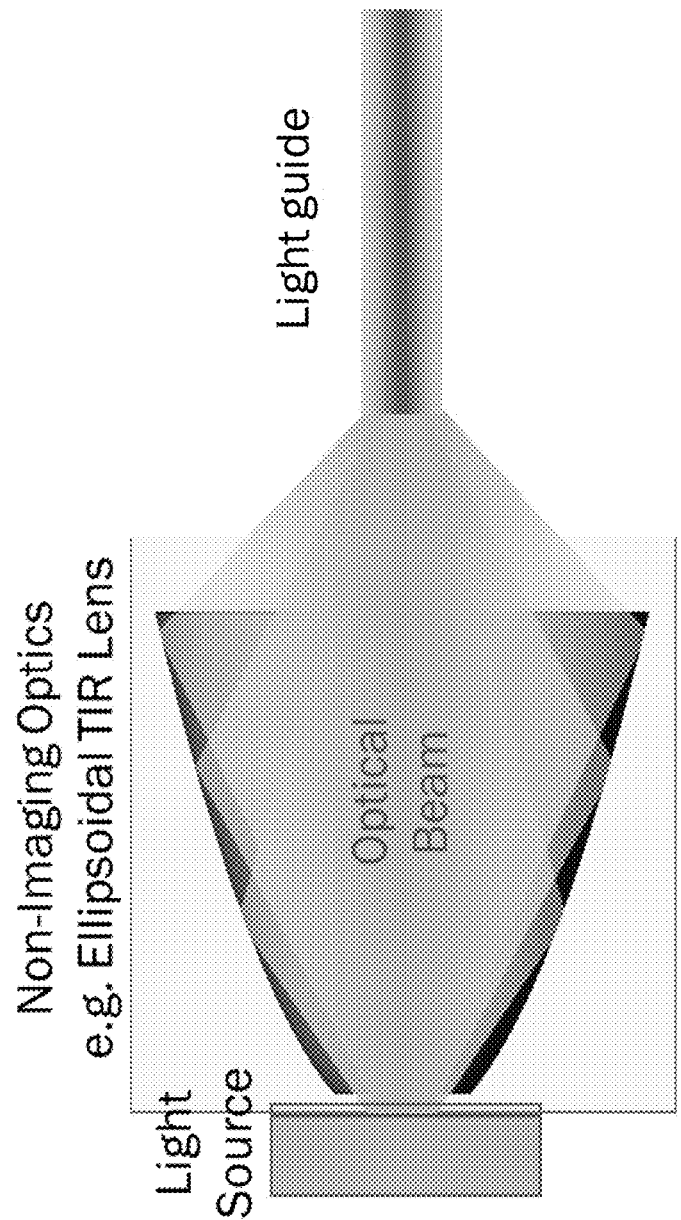
FIG. 36 is a simplified diagram of an exemplary fiber-coupled wide-spectrum light system according to an embodiment of the present invention.

In yet other embodiments, the one or more optics members may include non-imaging optical elements to couple an emission from a light source into a light guide. This is shown in FIG. 36, where non-imaging optical element (e.g., an ellipsoidal total internal reflection (TIR) lens) is used to focus an emission from a light source onto an input tip of a light guide. The light source is positioned near a non-imaging optical element, and the emission from the light source is reflected from the non-imaging optical element and focused onto the input end of the light guide. In an embodiment, the non-imaging optical element may be configured to reflect the emission from the light source a single time as shown in this example rather than reflecting the emission back and forth multiple times.

Figure 37:
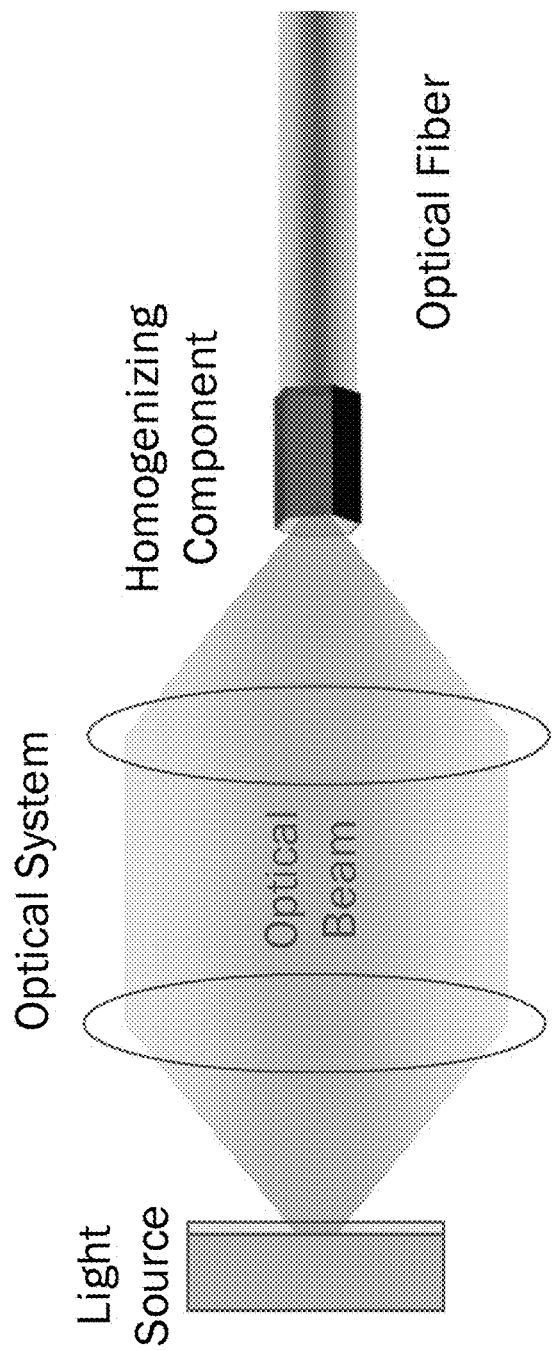
FIG. 37 is a simplified diagram of an exemplary fiber-coupled wide-spectrum light system according to an embodiment of the present invention.

In some of the embodiments described herein, an optical component that is configured to homogenize intensity, color, and/or angular space of an emission may be coupled to an input end of a light guide. An example is shown in FIG. 37. Imaging or non-imaging optics members may be configured to focus a wide-spectrum light emission onto an input of the optical component, and the homogenized emission is emitted from the optical component and into the light guide. Alternatively, the optical component may be disposed at the light source or may be arranged with other optics members to provide homogenization.

Figure 38:
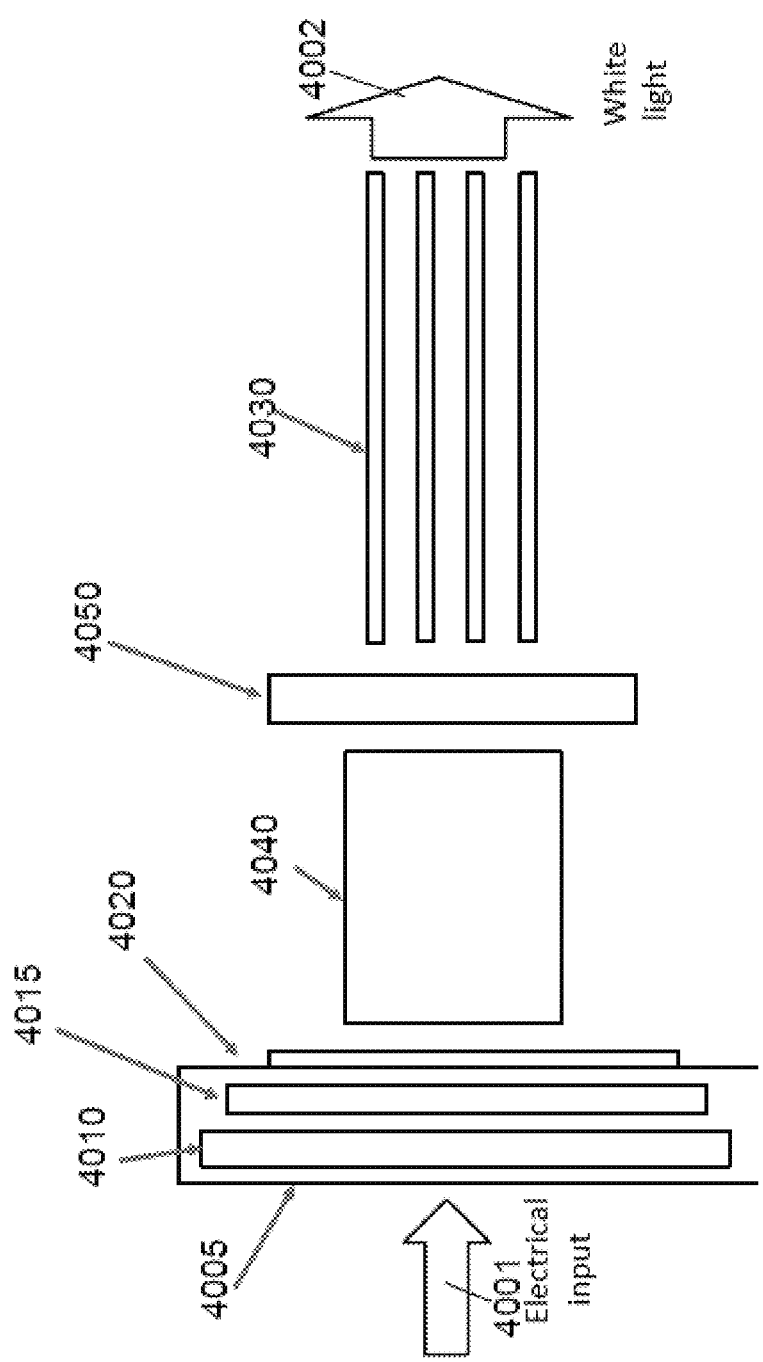
FIG. 38 is a schematic diagram of a laser-based wide-spectrum light system including an optical switch device or module according to an embodiment of the present invention.

In the laser-based wide-spectrum light system according to the present invention, there are several configurations that can provide independent adjustment of the light levels delivered to each of the illumination locations. FIG. 38 presents a schematic diagram of a laser-based wide-spectrum light system including an optical switch device or module according to an embodiment of the present invention. Referring to FIG. 38, the laser-based wide-spectrum light generated from the laser-based wide-spectrum light source 4010 is captured or optically coupled via a coupling optics element 4015 through an optical connector 4020 into a wide-spectrum light supply member 4040. Optionally, the laser-based wide-spectrum light source 4010 is housed by a housing member 4005 and activated by receiving electrical input 4001 as described in the Laser-based wide-spectrum light system in FIG. 31. Optionally, the wide-spectrum light supply member 4040 is comprised of a single medium such as a large diameter fiber, a light guide, or other, or is comprised of a multi-component medium such as a fiber bundle. The wide-spectrum light supply member 4040 delivers the optically coupled wide-spectrum light to an optical switching system 4050. The optical switching system 4050 is configured to direct the supplied wide-spectrum light to one or more output transport fibers 4030. Each of the output transport fibers 4030 delivers the wide-spectrum light 4002 to a designated illumination area. By utilizing the optical switching system, light can be directed only to illumination locations wherein the light is needed.

Optionally, the optical switch system 4050 shown in FIG. 38 is a device that selectively switches optical illumination signals on or off as an optical modulator. In some embodiments, the optical switch system is configured to switch data signals on or off as an data-signal modulator. In some embodiments, the optical switch system 4050 is configured to select signals from the wide-spectrum light supply member 4040 to a designated channel as an optical space switch of router to deliver the illumination to a designated location. Since the switching operation of the optical switch system 4050 can be temporal or spatial, such switching operations are analogous to one-way or two-way switching in electrical circuits. Independent of how the light itself is switched, systems that route light beams to different locations are often referred to as "photonic" switches. In general, optical modulators and routers can be made from each other.

Optionally, the optical switch system 4050 may operate by mechanical means, such as physically shifting an optical fiber to drive one or more alternative fibers, or by electro-optic effects, magneto-optic effects, or other methods such as scanning fiber tip or micro positioners. Optionally, low speed optical switches may be used solely for routing optical illumination to designated illumination sources. In one example of a low speed optical switch, the optical fibers are configured to physically move to route the illumination light from the source to the illumination area. Optionally, high speed optical switches, such as those using electro-optic or magneto-optic effects, may be used to route the optical illumination from the source to the desired illumination area and to perform logic operations.

Optionally, the optical switching system 4050 according to the present invention includes MEMS devices such as scanning micro-mirrors or digital light processing chips (DLP) including arrays of micromirrors that can deflect the laser-based illumination light to the appropriate receiver or designated illumination area. Optionally, the optical switching system 4050 according to the present invention includes piezoelectric beam steering devices involving piezoelectric ceramics function to direct the laser-based illumination light to the appropriate receiver or designated illumination area. Additionally, the optical switching system 4050 according to the present invention includes one based on scanning fiber tip technology, micro-positioners, inkjet methods involving the intersection of two light guides, liquid crystal technology such as liquid crystal on silicon (LCOS), thermal methods, acousto-optic, magneto-optic technology approaches function to direct the laser-based illumination light to the appropriate receiver or designated illumination area.

Optionally, the optical switching system 4050 according to the present invention can be comprised of digital type switches that have only have two positions. The first position corresponds to the light being nominally turned "off" such that minimal amounts of light is coupled into the transport fiber and delivered to the illumination location. The second position corresponds to the light being turned "on" such that the wide-spectrum light is delivered to the designated illumination location. Digital switch configurations could include micro-mirrors, MEMS technology including scanning mirrors and arrays of mirrors, electro-optic valves, etc. In other laser-based wide-spectrum light systems according to the present invention, the switch system 4050 includes analog switches that can provide a dynamic range level of light in between the "off" state and the "on" state. Such analog switches can provide a valve function enabling a light "dimming" function. The capability to dim the light at specific illumination locations is an important function for many lighting applications.

As shown in the FIG. 38, the laser-based wide-spectrum-light source 4010 is enclosed in a housing member 4005. The wide-spectrum light source 4010 is configured to receive electrical input 4001 (including power and control signals) to activate the laser-based wide-spectrum-light source 4010 to produce wide-spectrum light emission. Optionally, the wide-spectrum light source 4010 includes an electrical driver or circuit board member configured to condition the power and electrical input 4001. The wide-spectrum light emission from the laser-based source 4010 is optionally shaped with optional optical elements 4015 such as collimating lens elements and/or focusing lens elements. The wide-spectrum light emitted from the wide-spectrum light source 4010 is coupled to an optional optical supply member 4040 configured to transport the light from the wide-spectrum light source 4010 to the optical switching device or module 4050. The optical supply member 4040 could range in length dimensions from very short lengths of about 1 mm to much longer lengths of 10 meters or longer. The optical supply member 4040 may be configured from a light pipe such as a solid light guide, an optical fiber formed from a glass material or a plastic material or other material, a bundle of optical fibers, or could be configured from a free space design. The optical supply member 4040 is configured to deliver the wide-spectrum light to an optical switching device or module 4050. The optical switching performed by the optical switching device or module 4050 is designed and configured to route the wide-spectrum light to a network of optical transport fibers 4030. The optical transport fibers 4030 distribute and deliver the wide-spectrum light to desired illumination areas. By actuating the optical switching module 4050, the wide-spectrum light can be switched "on" to certain optical fibers directed to locations where the light is needed and switched "off" to the certain other optical fibers directed to locations where the light is not needed. In some examples of the laser-based wide-spectrum lighting system including an optical switching module, a wide-spectrum light supply member 4040 may not be included wherein the wide-spectrum light from the laser-based wide-spectrum light source 4010 is directly coupled into the optical switching module 4050.

Optionally, the optical switching module in FIG. 38 can include MEMS devices such as scanning micro-mirrors, or digital light processing chips (DLP) including arrays of micromirrors that can deflect the laser-based illumination light to the appropriate receiver or designated illumination area. In another configuration according to the present invention, the optical switching module 4050 includes piezoelectric beam steering devices, devices based on one of scanning fiber tip technology, micro positioners, inkjet methods involving the intersection of two light guides, liquid crystal technology such as liquid crystal on silicon (LCOS), thermal methods, acousto-optic, magneto-optic technology and are configured to direct the laser-based illumination light to the appropriate receiver or designated illumination area. In some embodiments, combinations of various switching technologies are included.

Optionally, the switching module 4050 in FIG. 38 includes digital type switches to turn the light "on" and "off" in certain locations. Optionally, the switching module 4050 includes analog type switches that enable control of the amount of light delivered to certain locations to provide a dimming function. Optionally, the switching module 4050 includes a combination of digital type and analog type switches. Digital switch configurations could include micro-mirrors, MEMS technology, electro-optic valves, etc. In other laser-based wide-spectrum light systems, the analog switches employed in the switch module can provide a dynamic range level of light in between the "off" state and the "on" state. Such analog switches can provide a valve function enabling a light "dimming" function. This capability to dim the light at specific illumination locations according to the laser-based wide-spectrum light system is an important function for many lighting applications since different occasions, time of day, occupants' preferences, and other factors demand different light levels at a given location at different times.

In various embodiments according to the present invention, the laser-based wide-spectrum lighting system is configured to provide energy savings compared to the current art. By configuring the central lighting system with optical switches and routers to preferentially direct the light from the source to where the light is desired as described above, along with providing the capability to adjust the light generated at the source level and the associated input power to drive the source, the system operation state can be optimized to minimize the power consumption for a given operating requirement.

In addition to the digital and analog switching capability to enable precise control of the light levels delivered from the laser-based wide-spectrum light source to the desired illumination areas described above, the amount of light output from the one or more wide-spectrum light source modules can be adjusted to provide an added level of control of the wide-spectrum light system's generation and distribution of the light to the illumination locations. By careful consideration of the system's characteristics and the lighting requirements at a given use condition, the optical switches can be adjusted in conjunction with adjusting the input power driving the laser-based source to generate the wide-spectrum light for an optimized system efficiency. By adjusting the power or current delivered to the one or more laser-based wide-spectrum light sources, the amount of input electrical power and output luminous flux generated by the wide-spectrum light source is changed. During times when only a relatively low amount of wide-spectrum light is needed such as when light is only needed in few locations such as during day time or late at night when only 1-3 lights are on in a home, the one or more wide-spectrum light source can be run at relatively low luminous flux output levels, which would require less input power and hence save energy.

For optimum utilization efficiency of the light generated by the laser-based wide-spectrum light source and hence optimum power consumption efficiency, it is necessary that a high fraction of the useful generated light from the source can be directed into the specific transport fibers delivering the light to the desired illumination locations at a given time. In a spatially static system lighting system that could even include an optical switching module, it is an extreme technical challenge to make such efficient use of all generated light.

For purposes to illustrate an example of energy efficiency in a laser-based wide-spectrum lighting system we describe a system comprising a single laser-based wide-spectrum light source feeding ten optical transport fibers routed to ten separate illumination locations. The optical transport fibers are optically coupled to the wide-spectrum light source using a coupling pathway and optical switches functioning to control the light level at each illumination location. In the case that light is desired at all ten illumination locations the wide-spectrum light source is powered to generate the desired level of light at the source and all light switches are in the "on" position for digital type switches or open to the desired level for analog type switches. In this configuration, assuming the fiber coupling architecture is well designed, the laser-based wide-spectrum light system can operate in an optimum energy efficiency condition. However, in the case that light is only desired at two of the ten locations, such a spatially static system the light switches for the 2 transport fibers feeding these two locations would be configured in the "on" position for digital type switches or "open" to the desired level for analog type switches. The light switches for the 8 transport fibers feeding the light to illumination locations where light is not desired would be configured in the "off" position for digital type switches or in the "closed" position for analog type switches. In such a configuration, all of the light directed to the transport fiber locations wherein the optical switches were configured in the "off" or "closed" position would be wasted light. In this case only about two-tenths of the useful light in the system would be delivered to illumination areas, providing only a 20% efficiency of the useful fiber coupled light.

One solution to this efficiency challenge to create a most energy efficient laser-based wide-spectrum light system is to add a spatial modulation capability. By including a spatial modulation feature, the wide-spectrum light supplied from the laser-based wide-spectrum light source can be spatially directed to the select transport fibers delivering light to the locations where light is desired at any given time. That is, in the example scenarios given above including a laser-based wide-spectrum light source feeding into ten optical transport fibers the system could operate at high energy efficiency in both cases. In the first case where light is desired at all ten illumination locations, the spatial modulator would be driven to spatially direct the source light to all ten fiber inputs distributing all of, or most of, the useful light from the source to the ten illumination locations. In the second case where light is only desired at two of the ten illumination locations, the spatial modulator would be driven to spatially direct the source light only to the two fiber inputs transporting the light to the two illumination locations where light is desired. To optimize the energy efficiency of the system in the latter case, the input power to the laser-based light source could be reduced such that the light source only generates about 20% of the light of the first case, assuming that the light required in all locations is about equal. By doing this, the amount of wasted light would be minimized.

The spatial modulation apparatus comprised in the laser-based wide-spectrum lighting system could be configured as part of the optical switching module or device, could be the optical switching module device itself, or could be configured separate from the optical switching module. In some embodiments, the spatial modulation device is included as the switching module since the spatial modulation effect itself can serve to turn transport fibers "on" by directing light into them or turn transport fibers "off" by directing light away from them.

In some embodiments according to the present invention, the spatial modulation may be a "slow" modulation wherein the source light is configurable from one static position where it can operate with one desired supply of light to transport fibers to multiple other static positions where it can operate with other desired supply of light to transport fibers. This system can be viewed as a reconfigurable static system wherein the spatial modulator can change the supply light to predetermined locations to supply light to predetermined transport fibers. This spatial modulation can be accomplished with electro-mechanical mechanisms, piezoelectric mechanisms, micro-electromechanical system (MEMS) mechanisms such as scanning mirrors and/or digital mirror arrays such as DMDs, liquid crystal mechanisms, beam steering mechanisms, acousto-optic mechanisms, and other mechanisms. Many of these mechanisms are in existence today and are deployed as optical switches, modulators, micro-displays, or other technologies in various systems such as in telecommunication systems.

In some embodiments according to the present invention, the spatial modulation may be a "fast" modulation wherein the source light is actively or dynamically scanned across a spatial field comprising the optical input paths to the transport fibers. This "fast" spatial modulation configuration enables the addition of a time domain element to the spatial modulation. With the ability to actively spatial modulate over a spatial area at high speeds the scanning rate and pattern can be designed to provide a higher time averaged amount of light to certain optical transport fiber inputs, a lower time averaged amount of light to certain other optical transport fiber inputs, and even no or a very low amount of time averaged light to certain other transport fiber inputs such that the light level entering each transport fiber can be tuned to the desired level of light associated with the corresponding illumination area. In this spatial modulation embodiment including a fast modulation capability the supply light from the laser-based wide-spectrum light source would be configured such that a majority or large fraction of the usable wide-spectrum light from the source is within the light beam being scanned across the spatial field and available for entry into the transport fibers. Such a scanning configuration coupled with the ability to tune the total light output of the laser-based wide-spectrum light source by controlling the input electrical power would provide a highly efficient wide-spectrum lighting system since the amount of light generated at the source can be tuned to provide only the level of the light needed at the one or more illumination locations to avoid wasting light by illuminating unnecessary areas.

The fast spatial modulation of the laser-based wide-spectrum light according to the present invention can be accomplished in many ways. To name a few, the fast switching can be accomplished with electro-mechanical mechanisms, piezoelectric mechanisms, micro-electromechanical system (MEMS) mechanisms such as scanning mirrors and/or digital mirror arrays such as DMDs, liquid crystal mechanisms, beam steering mechanisms, acousto-optic mechanisms, and other mechanisms.

In one embodiment of the present invention, the fast switching is accomplished with a MEMS technology. According to the present invention, the light from the laser-based wide-spectrum light source is collimated into a beam of wide-spectrum light. The beam of wide-spectrum light is then directed to one or more scanning MEMS mirrors. The scanning MEMS mirrors can then direct the beam of wide-spectrum light toward a spatial field containing the optical pathways to the input of the transport fibers such that when the MEMS mirror is scanning the beam of wide-spectrum light it can direct the light toward any of the optical transport fibers based on a control circuit driving the MEMS so that a predetermined amount of time averaged light can be optically coupled into the desired transport fibers to deliver a select amount of light to select illumination areas. The MEMS mirrors can be selected from a electro-static activated mirror, an electro-magnetic activated mirror, a piezo-activated mirror, and can be operated in a resonant or a non-resonant vector scanning mode. The MEMS mirror could be configured to scan on a single-axis to scan 1D array of transport optical transport fiber input paths, could be configured as a bi-axial scanning mirror to scan 2D arrays of optical fiber input paths, or could be configured with multiple MEMS mirrors such as using 2 single-axis scanning MEMS mirrors, or other configurations.

The scanning rate of a "fast" spatially modulated light may range from the hertz range, to the kilohertz range, to the megahertz range, and even into the gigahertz range. The scanning rate of the spatially modulated light signal would be preferentially be fast enough so that it was not detectable by the human eye. In some spatial modulation approaches, the modulation could be adaptable to a fast scanning or a slow scanning depending on the instantaneous needs of the laser-based wide-spectrum lighting system. For example, by using a non-resonant vector scanning MEMS mirror the supply of wide-spectrum light could be directed to only a static position of the field such that light was only coupled into select transport fibers, but could also scan the entire field with a predetermined pattern to couple light into all of the transport fibers with the desired amount.

In some embodiments of the present invention including a spatial modulation, the wide-spectrum light supply would be modulated in conjunction with the spatial modulation. That is, either by modulating the current to the laser-based wide-spectrum light source or using an external modulator, the wide-spectrum light level can be turned up and down as the spatial modulator scans the supply wide-spectrum light across the spatial field including the optical inputs to the transport fibers. By including an amplitude modulation of the wide-spectrum light supply a further level of energy efficiency can be achieved since the light source can be turned off or substantially off when the spatial position of the supply light is in between transport fiber inputs to eliminate the wasted light that would result when the spatial modulator is moving the source light in-between fiber inputs. Moreover, by modulating the light level another level of selectively tuning the amount of light coupled into the various transport fibers can be achieved. This feature enables the ability to selectively dim and brighten the light levels at the independent illumination positions fed by the transport fibers.

In another example of a laser-based wide-spectrum light system with a low energy consumption, the system is configured with a spatial modulation capability to selectively direct and optically couple the source wide-spectrum light into multiple transport fibers, the capability for amplitude modulation of the laser-based wide-spectrum light source output, and an optional optical switching module comprised of analog switches that can open and close to various levels to enable a range of wide-spectrum light amounts to pass through and be delivered to the desired illumination location. By adjusting the spatial modulation scanning pattern and characteristics [e.g., scanning frequency and repetition rate] along with the amplitude of the light generated by the laser-based wide-spectrum light source and the analog switches within each of the optical pathways to the multiple illumination location, the desired amount of light can be delivered to the illumination locations at an optimized efficiency.

In a specific example of the present embodiment, we outline two use conditions to illustrate how such a system can optimize energy efficiency. In the first scenario, there is a high demand of total light from the central lighting system. An example of a high light demand time could be during the early evening hours just after the sun is set and people are still well awake either working, in their home, or out at shopping or entertainment locations. During this first scenario where there is a high light demand, perhaps every room in the home or building equipped with the central lighting system would need high illumination. In this configuration, the input power to the one or more laser-based wide-spectrum light sources would be turned up to a high level, for example, near a maximum rated level, and the spatial modulator would scan the supply wide-spectrum light generated from the one or more wide-spectrum light sources across the entire field including the optical coupling pathways to the transport fibers to deliver light to all illumination locations. By adjusting some combination of the spatial modulation scanning characteristic, an amplitude modulation pattern on the laser-based wide-spectrum light sources, and the analog switches on each of the transport fibers the precise level of desired light can be delivered to each independent illumination location. In a second scenario an intermediate level of light is desired in the home. An example time for such an intermediate time may be after dinner time and before bed time when many of the lights are not used in the home, there are still a few active rooms in the home, and some rooms where only a low level of light is desired such as a reading light. In this scenario, the spatial scanning characteristic of the spatial modulator and/or the amplitude modulation pattern of the wide-spectrum light source would be modified to eliminate directing light in the spatial field that includes the optical coupling inputs for the transport fibers feeding the illumination locations wherein light is not desired. Moreover, the optical switches to these locations could be turned off to prevent any low levels of light. The adjusted spatial modulation characteristic and/or adjusted wide-spectrum light amplitude modulation pattern would provide input source light to the spatial field that includes the input coupling pathways for the transport fibers feeding the illumination locations wherein desired high and low levels of illumination. The optical switches on each of the transport fiber channels could fine tune the light levels.

Figure 39:
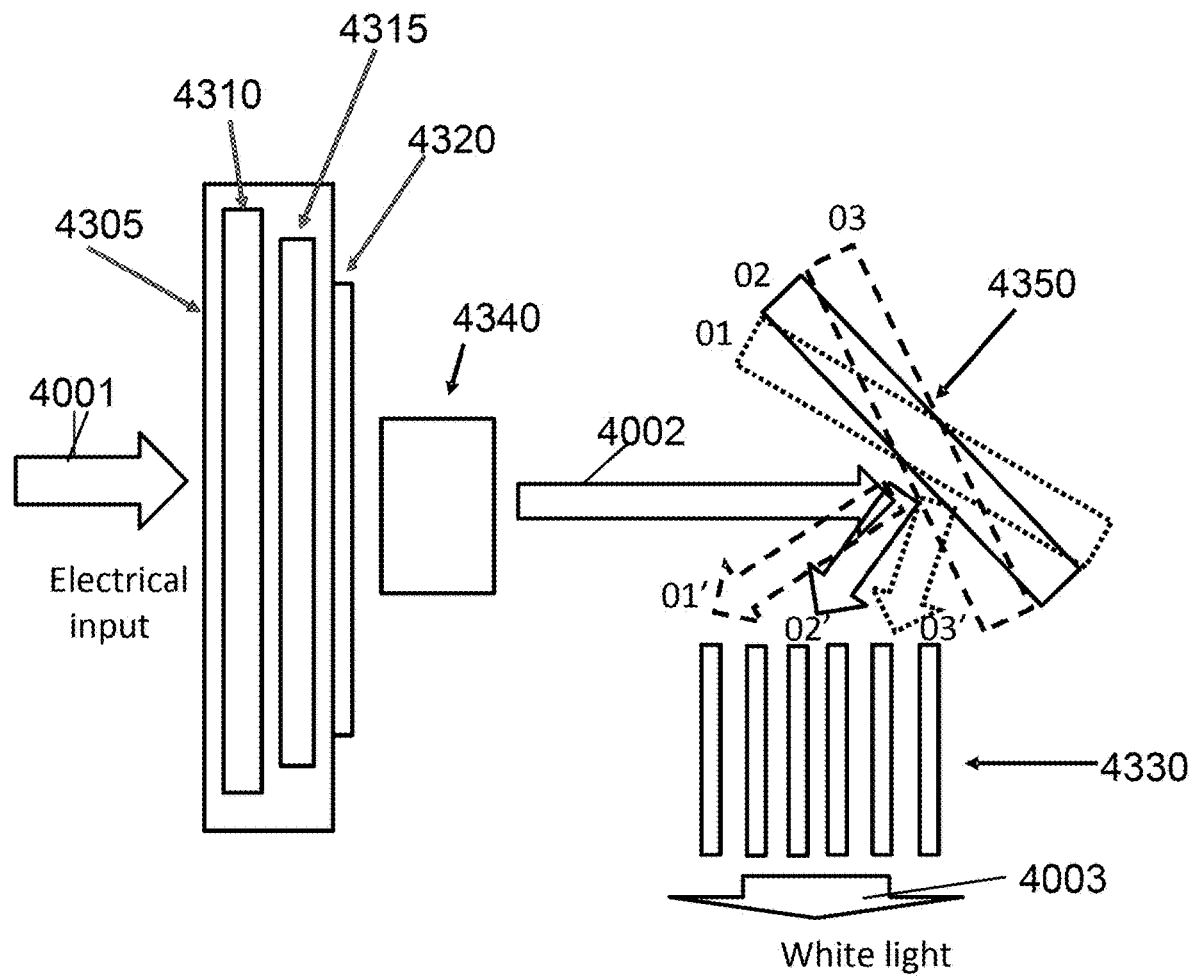
FIG. 39 is a schematic illustration of a laser-based wide-spectrum light system including a fast switching optical switch unit according to a specific embodiment of the present invention.

FIG. 39 presents a schematic illustration of a laser-based wide-spectrum light system including a fast switching optical switch unit according to a specific embodiment of the present invention. As can be seen in the FIG. 39, the laser-based wide-spectrum-light source 4310 is enclosed in a housing member 4305. The wide-spectrum light source 4310 is configured to receive electrical input 4001 (including power and control signals) to activate and produce wide-spectrum light emission. Optionally, the wide-spectrum light source 4310 includes an electrical driver or circuit board member configured to condition the electrical input 4001. The wide-spectrum light emission from the laser-based source 4310 is optionally shaped with optional optical elements 4315 such as collimating lens elements and/or focusing lens elements. The wide-spectrum light emission is coupled to an optional optical supply member 4340 through optical connector unit 4320. The optical supply member 4340 is configured to transport the wide-spectrum light 4002 from the wide-spectrum light source 4310 to the optical switching module 4350. The optical supply member 4340 is configured to be in a length range from very short lengths of about 1 mm to much longer lengths of 10 meters or longer. The optical supply member 4340 may be configured from a light pipe such as a solid light guide, an optical fiber formed from a glass material or a plastic material or other material, a bundle of optical fibers, or could be configured from a free space design. Optionally, the optical supply member 4340 is configured to deliver the wide-spectrum light 4002 to an optical switching module 4350. Optionally, the optical switching module 4350 is a fast optical switching module configured to route the supplied wide-spectrum light 4002 to a network of optical transport fibers 4330. The optical transport fibers 4330 are configured to distribute and deliver the wide-spectrum light 4003 to desired illumination areas.

In the example according to FIG. 39, the fast optical switching module 4350 uses a MEMS mirror to reflect the supplied wide-spectrum light 4002 and direct to the inputs of the optical transport fibers 4330. The optical transport fibers 4330 can be configured in 1-dimensional arrays or 2-dimensional arrays. Optionally, the MEMS mirror can be configured to scan on one axis of the 1D array of optical fibers 4330 or can be configured for bi-axial scanning to feed 2D arrays of optical transport fibers 4330. By actuating the scanning MEMS mirror to various positions, such as 01, 02, 03, the supplied wide-spectrum light 4002 is reflected properly to different directions 01', 02' 03' respectively leading to different inputs of the optical transport fibers 4330. Therefore, different levels of scanning mirror deflection correspond to coupling light to different transport fiber inputs, and hence control the supply of light to the transport fibers 4330. The fast switching of the MEMS scanning mirror combined with the ability to simultaneously modulate the input wide-spectrum light amplitude level by modulating the laser-based wide-spectrum light source 4310, the precise light level to each transport fiber optical input can be precisely controlled. According to this embodiment, the light level at each illumination location can be precisely controlled. In some examples of the laser-based wide-spectrum lighting system including an optical switching module 4350, a wide-spectrum light supply member 4340 may not be included wherein the wide-spectrum light 4002 from the laser-based wide-spectrum light source 4310 is directly coupled into the switching module 4350.

Optionally, the fast switching module included in FIG. 39 can be comprised with MEMS devices, such as scanning micro-mirrors, integrated with digital light processing chips (DLP) including arrays of micromirrors that can deflect the laser-based illumination light to the appropriate receiver or designated illumination area. In some embodiments, multiple scanning mirrors are included. In other embodiments, scanning mirrors are combined with other switching technologies such as mirror arrays such as DMD or DLP technologies. In yet other embodiments, different fast switching technologies are used.

In another example of the optical switching system configurations according to the present invention, the optical switching module according to the present invention, comprises piezoelectric beam steering devices, involving piezoelectric ceramics function to direct the laser-based illumination light to the appropriate receiver or designated illumination area. In additional examples of the optical switching system according to the present invention, scanning fiber tip technology, micro positioners, inkjet methods involving the intersection of two light guides, liquid crystal technology such as liquid crystal on silicon (LCOS), thermal methods, acousto-optic, magneto-optic technology approaches function to direct the laser-based illumination light to the appropriate receiver or designated illumination area. In some embodiments, combinations of various switching technologies are included.

In various embodiments according to the present invention, the laser-based wide-spectrum lighting system is configured for a smart lighting capability. In one example, by equipping the laser-based central lighting system with sensors for feedback to adjust the lighting based on the said sensor feedback a smart lighting system can be realized. In this example, photovoltaic light sensors can be used to turn-lights off in the presence of ambient light or turn them on when it is dark. Additionally, motion sensors IR sensors could be used to detect human presence and only activate the illumination to the area when it is needed. In a further example of a smart lighting system based on laser-based wide-spectrum light, by enabling the laser-based wide-spectrum lighting system to serve as a visible light communication system to transmit data such as LiFi, the laser-based wide-spectrum lighting system according to the present invention can be a smart lighting system.

The present disclosure provides a smart lighting system or a smart lighting apparatus configured with various sensor-based feedback loops integrated with gallium and nitrogen containing laser diodes based on a transferred gallium and nitrogen containing material laser process and method of manufacture and use thereof. Merely by examples, the invention provides remote and integrated smart laser lighting devices and methods, projection display and spatially dynamic lighting devices and methods, LIDAR, LiFi, and visible light communication devices and methods, and various combinations of above in applications of general lighting, commercial lighting and display, automotive lighting and communication, defense and security, industrial processing, and internet communications, and others.

The laser-based wide-spectrum light system according to the present disclosure can include a smart or intelligent lighting function. Such a smart or intelligent function can include features and functions such as sensors for feedback, reaction responses based on sensor feedback or other input, memory storage devices, central processing units and other processors that can execute algorithms, artificial intelligence (AI), connectivity such as on the internet of things (TOT), data transmission such as using a visible light communication (VLC) or LiFi, data receiving such as with photodetectors or other sensors, communication, sensing such as range finding or 3D imaging, LIDAR, temporal or spatial modulation, a dynamic spatial modulation, color tuning capabilities, brightness level and pattern capability, and any combination of these features and functions, including others. Examples are included in U.S. application Ser. No. 15/719,455, filed Sep. 28, 2017, the entire contents of which are incorporated herein by reference in their entirety for all purposes.

In some embodiments, the light source of the laser-based fiber coupled wide-spectrum lighting system is configured for visible light communication or LiFi communication. Optionally, the light source includes a controller comprising a modem and a driver. The modem is configured to receive a data signal. The controller is configured to generate one or more control signals to operate the driver to generate a driving current and a modulation signal based on the data signal. In one configuration, the electrical modulation signal is coupled to the laser diode device in the laser-based wide-spectrum light source to drive the laser according to the signal and generate a corresponding output optical signal from the laser diode. In one example wherein the laser-based wide-spectrum source comprised a gallium and nitrogen containing diode operating in the violet/blue wavelength range of 400-480 nm and a phosphor member serving as a wavelength conversion member, the modulation signal would be primarily carried by the violet/blue direct diode wavelength from the light source to a received member.

Optionally, as used herein, the term "modem" refers to a communication device. The device can also include a variety of other data receiving and transferring devices for wireless, wired, cable, or optical communication links, and any combination thereof. In an example, the device can include a receiver with a transmitter, or a transceiver, with suitable filters and analog front ends. In an example, the device can be coupled to a wireless network such as a meshed network, including Zigbee, Zeewave, and others. In an example, the wireless network can be based upon an 802.11 wireless standard or equivalents. In an example, the wireless device can also interface to telecommunication networks, such as 3G, LTE, 5G, and others. In an example, the device can interface into a physical layer such as Ethernet or others. The device can also interface with an optical communication including a laser coupled to a drive device or an amplifier. Of course, there can be other variations, modifications, and alternatives.

In some embodiments of the laser-based fiber coupled wide-spectrum lighting system according to the present disclosure, the lighting system includes one or more sensors being configured in a feedback loop circuit coupled to the controller. The one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

Optionally, the one or more sensors include one or a combination of multiple of sensors selected from microphone, geophone, motion sensor, radio-frequency identification (RFID) receivers, hydrophone, chemical sensors including a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video cameras, transducer, image sensor, infrared sensor, radar, SONAR, LIDAR.

Optionally, the one or more sensors is configured in the feedback loop circuit to provide a feedback current or voltage to tune a control signal for operating the driver to adjust brightness and color of the directional electromagnetic radiation from the light-emitter in an illumination location correlating to the one or more sensors.

Optionally, the one or more sensors is configured in the feedback loop circuit to provide a feedback current or voltage to tune a control signal for operating the beam steering optical element to adjust a spatial position and pattern illuminated by the beam of the wide-spectrum light.

Optionally, the one or more sensors is configured in the feedback loop circuit to send a feedback current or voltage back to the controller to change the driving current and the modulation signal for changing the data signal to be communicated through at least a fraction of the directional electromagnetic radiation modulated by the modulation signal.

Optionally, the controller further is configured to provide control signals to tune the beam shaper for dynamically modulating the wide-spectrum light based on feedback from the one or more sensors.

Optionally, the controller is a microprocessor disposed in a smart phone, a smart watch, a computerized wearable device, a tablet computer, a laptop computer, a vehicle-built-in computer, a drone.

In another preferred embodiment, the present invention comprising a laser-based fiber-coupled wide-spectrum light source is configured in an architectural lighting apparatus. Optionally, the lighting apparatus is associated with the distributed or central lighting system according to the present disclosure. In one example, the architectural lighting apparatus includes a passive luminaire. The passive luminaire is configured to shape the wide-spectrum light, pattern the wide-spectrum light, or provide a desired lighting effect. The passive luminaire may include features and designs for scattering the wide-spectrum light, reflecting the wide-spectrum light, waveguiding the wide-spectrum light, distributing the wide-spectrum light, modifying the color temperature of the wide-spectrum light, modifying the color rendering characteristic of the wide-spectrum light, creating distribution patterns with varied color, brightness, or other characteristic, other effects, or a combination.

In an embodiment, a lighting apparatus is configured with a laser driven phosphor high luminance light source coupled to a fiber optic cable. Optionally, the fiber optic cable is disposed at the top end of the apparatus. The lighting apparatus at this configuration and is functionality is called the active assembly or light engine. The light travels downward along the length of the fiber optic cable and emerges at a bottom end of the cable where an optical assembly is coupled. This optical assembly at the bottom end is called the passive assembly. The entire length of the lighting apparatus is intended to be hung from an architectural element and extends downward by gravity. Optionally, the overall fixture is called a pendant fixture.

In one example of an active assembly, the laser and phosphor are arranged within a surface mounted device (SMD) component that is mounted on a printed electric circuit board so that electric power may be supplied from outside to the device. The SMD optical window is arranged close to optical lenses that collect the maximum practical amount of light and direct the light into the fiber optic cable top end. Since the light source is very small, the optical assembly and casing may also be quite small on the order of 3 cm diameter or less.

Since the laser driven phosphor high luminance light source is very small, the fiber optic cable may also have a small diameter, 1 mm or less, while still transporting a large fraction of the total light from the source. Alternatively, a larger fiber optic cable may collect the light and then be split into two or more cables that all transport their portion of the light. In this way, one light engine may potentially provide light to multiple fiber optic cables for different pendant fixtures. Optionally, the fiber optic cable may be made of glass or transparent plastic like acrylic (PMMA) or polycarbonate. The fiber optic cable may be of any length where in lighting applications the length will typically be from the ceiling or beam to a work surface or one to ten meters. The pendant fixtures may also be applied outdoors from a building element, truss or pole. Optionally, the emission of light may be scattered by inclusions within a transparent fiber so that it exits the cylindrical surface of the fiber. In this way the fiber appears to glow in whole or in part for a decorative or lighting effect. Optionally, the fiber optic cable may also solely transport the light to the bottom end and may also be jacketed or coated so as to appear dark or any other color. While gravity alone will lead the cable to be straight and pointed downward, additional frames and structures may be applied in order to give the fiber optic cable a curve, form or shape where the bottom or distal end may still point downward or any other direction.

Optionally, the bottom end of the fiber optic cable may be fitted with a connector with screw threads or bayonet mount or any other type of connection mechanism whereby an optical element may be applied. One or more optical elements and passive assembly may consist of a lens and housing so that the light is directed toward the work surface. Alternatively, the optical elements may scatter the light sideways with lenses or decorative elements or a combination of these. Since these optical elements collect light from a small diameter fiber optic cable, the passive assembly may be configured to be a very small size, 3 cm or less, while still directing a large fraction of the light emitted or also creating a straight narrow collimated beam in the directional lighting example. Alternatively, the passive assembly may be made to appear like a conventional lighting fixture or light bulb like a track head, MR-16 lamp, candelabra decorative lamp, utility or rough service lamp, chandelier or conventional incandescent light bulb. Unlike these conventional lamps though, the interior of the passive assembly does not contain any electrical parts that can fail or generate heat.

In another embodiment, the active assembly may be positioned as a light source or light engine for a decorative lighting fixture that is suspended from the ceiling of a structure such as a chandelier. A chandelier has numerous points of emissive light, often more than ten. With conventional lighting, each point of light in the assembly employs an individual electrical lighting lamp like for example an incandescent or LED candelabra decorative lamp. Over the operating period of the chandelier, any of the lamps may fail and thereby disturb the aesthetic whole of the chandelier. Replacing the lamp results in operating costs and inability to utilize the space since chandeliers are often mounted at great height. Replacing lamps at great height requires equipment, time and staff that result in great expense.

Optionally, the light engine is coupled to a fiber optic cable that transports the light to the chandelier. Optionally, the fiber optic cable may be split into multiple fiber optic cables that lead to the lighting endpoints of the chandelier. At each of these lighting endpoints, the fiber optic cable delivers the light into an optical element that distributes the light according to the design of the chandelier. In order to duplicate the effect of a candelabra lamp, the optic element at the endpoint of the chandelier optionally scatters the light in a wide-angle pattern.

The benefits of this chandelier design include ease of service and maintenance. The single remote source may be located in a convenient area where a repair or replacement may be accomplished with little disturbance to the lighting area that may be at great height. The lighting effect will be more uniform since there is a single source instead of multiple sources operating independently with different characteristics. Since the laser-based wide-spectrum light source size is made much smaller than other light sources, the fiber optic cable and other fixture components may be much smaller, finer and less visible in order to create a better aesthetic effect.

Figure 40:
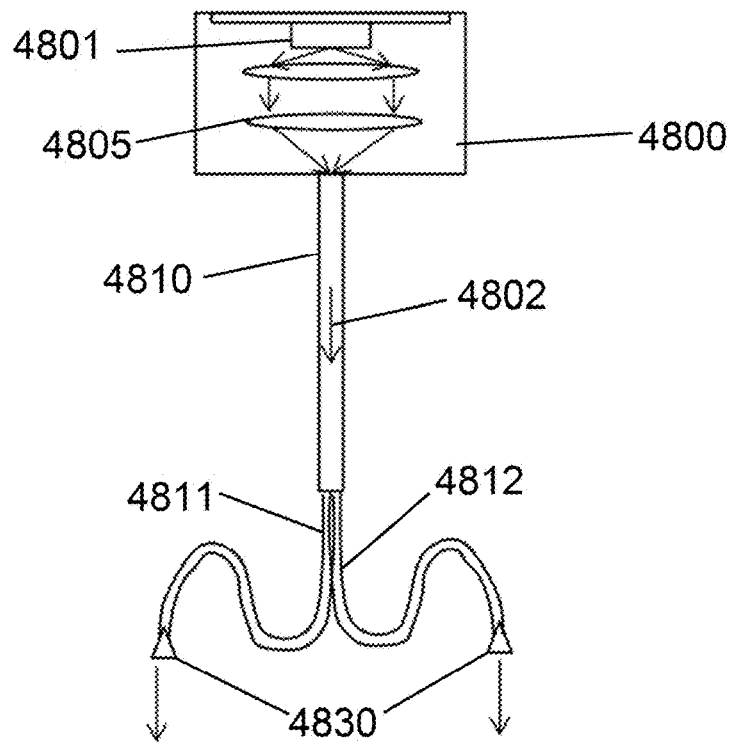
FIG. 40 is a schematic diagram of a passive decorative luminaire according to an embodiment of the present invention.

FIG. 40 presents a schematic diagram of a passive decorative luminaire according to an embodiment of the present invention. As shown in the FIG. 40, the wide-spectrum light is generated within a laser-based wide-spectrum light source 4800 such as a laser diode combined with a wavelength converting phosphor member in a package such as a surface mount device package. The wide-spectrum light 4802 is then coupled into a supply light guide 4810 such as a fiber optic cable as depicted in FIG. 40. The wide-spectrum light 4802 in the supply light guide 4810 is then split into 2 or more channels 4811 and 4812 of wide-spectrum light. The two or more channels are then routed to multiple lighting endpoints 4830 to emit the wide-spectrum light in this decorative lighting system. In this application, the multiple lighting endpoints can also be comprised of line sources such as scattering fibers, discrete emission points, or some combination of the two.

One of the significant advantages of wide-spectrum light generated by illuminating phosphors with a blue solid-state laser is the high luminance. This high luminance enables efficient coupling of wide-spectrum light to optical fibers or small optical elements. However, the high luminance of these wide-spectrum light sources generate significant heat in a small volume because of stokes losses and other inefficiencies in phosphors.

The common working temperature limitations of down-conversion materials (typically <250° C.) requires approaches to either limit the concentration of down-conversion rate or effectively spread the heat.

Several strategies can be employed to efficiently spread heat, including a combination of choice of down-conversion material, concentration of down-conversion material in a matrix, geometry of a down-conversion material and matrix combination, matrix thermal conductivity properties, and engineering thermal pathways from down-conversion and matrix.

A common approach is embedding down-conversion material in a high thermal conductivity matrix that is optically transparent (e.g. $Al_2O_3$). However common manufacturing techniques for $Al_2O_3$ requires high-temperature sintering which limits the available choices of down-conversion materials to ones with melting points close-to or higher than $Al_2O_3$. Commonly used down-conversion and matrix combination for laser-based lighting sources are yttrium aluminum garnet doped with cerium (YAG:$Ce^{3+}$) in $Al_2O_3$. However commonly used red down-converting materials (e.g. $Eu^{2+}$ doped nitrides) have much lower melting points and are not compatible with sintering process for $Al_2O_3$.

Figure 41:
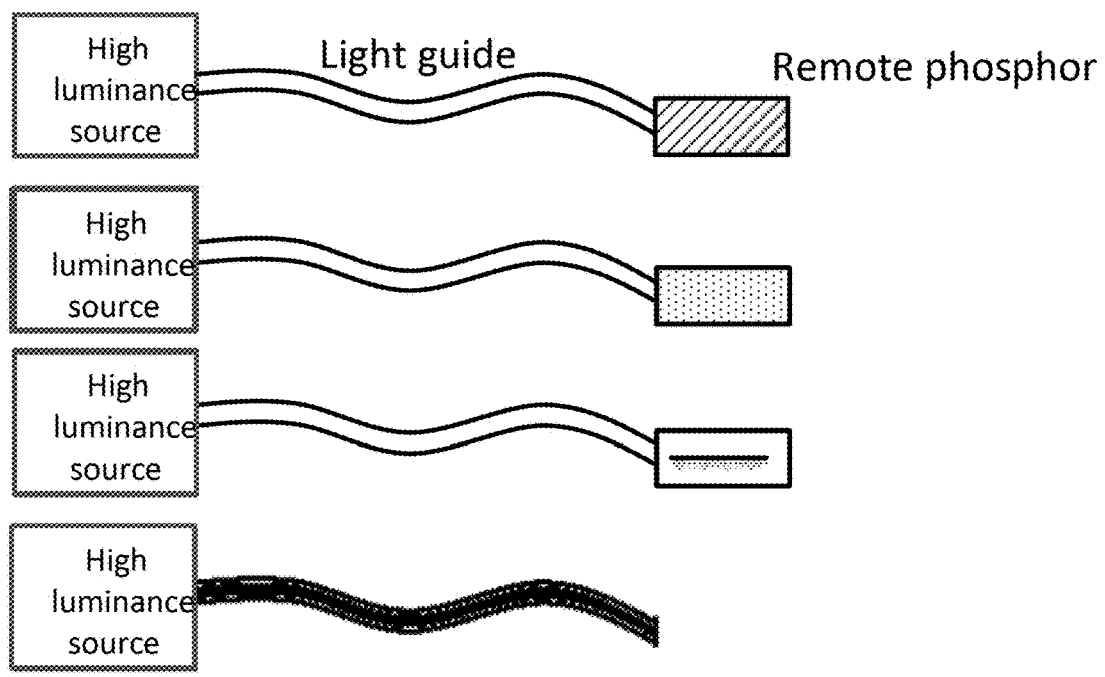
FIG. 41 is a schematic diagram of some exemplary high luminance sources that are coupled to a light guide and/or a remote phosphor according to some embodiments of the present invention.

An alternative strategy is to manage heat and materials compatibility is to limit the down-conversion rate of one or more colors from the wide-spectrum or off-white source. This can be achieved for example by utilizing a blue-to-green color light source that is optically coupled to a fiber or other designated optical elements. These optical elements can come in the form of a remote phosphor that is a solid element, or one with varying phosphor concentration gradients, or a fiber or optical guide that contains phosphors. This can be thought of as a system with a high luminance source that is coupled to a light guide and a remote phosphor, some examples are shown in FIG. 41. This allows for the high luminance source to use a phosphor and composite combination that can effectively dissipate heat. The high luminance source is effectively coupled to optical elements. This also allows the use of other phosphors that have thermal, optical, or mechanical features that prevent them from being incorporated into the high luminance area of the system. One optical limitation that is overcome with this type of system is the use of low blue-light absorption cross-section materials (e.g. $Eu^{3+}$ phosphors) where the volume or concentration of phosphor is impractical for confined systems.

Figure 42:
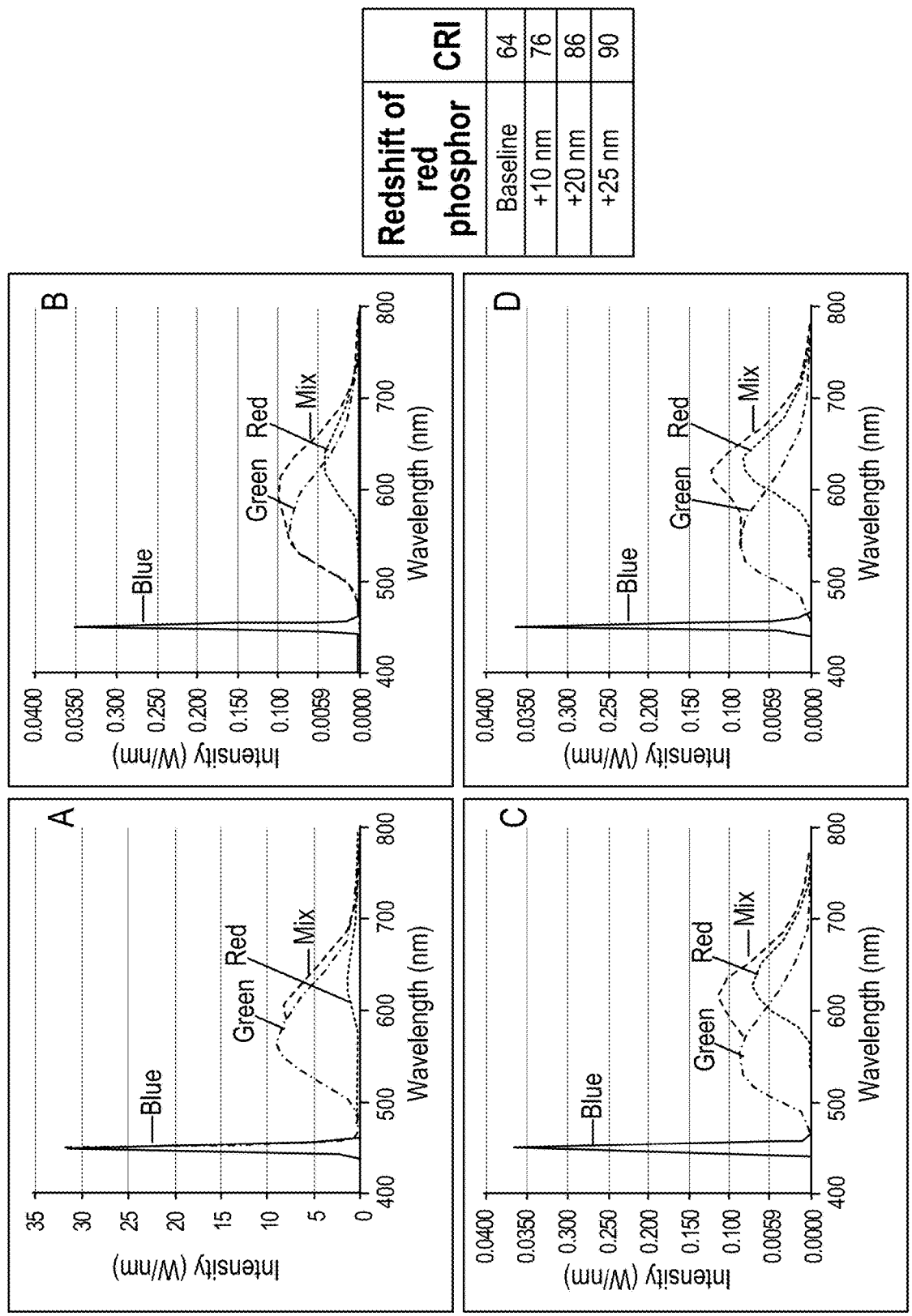
FIG. 42 shows simulation results indicating that CRI value of the light source can be adjusted by wavelength red shift of red phosphor according to some embodiments of the present invention.

The addition of a red phosphor to a blue-shifted yellow light source can enable warmer wide-spectrum (i.e. lower correlated color temperature—CCT) and higher CRI sources. By adjusting the amount and wavelength of red-down-conversion the effective CRI of the source can be adjusted. For example, as shown in FIG. 42, simulation results indicate that the CRI value can be adjusted from 65 to 90 by adjusting wavelength red shift of the red phosphor from a baseline up to +25 nm.

Figure 43:
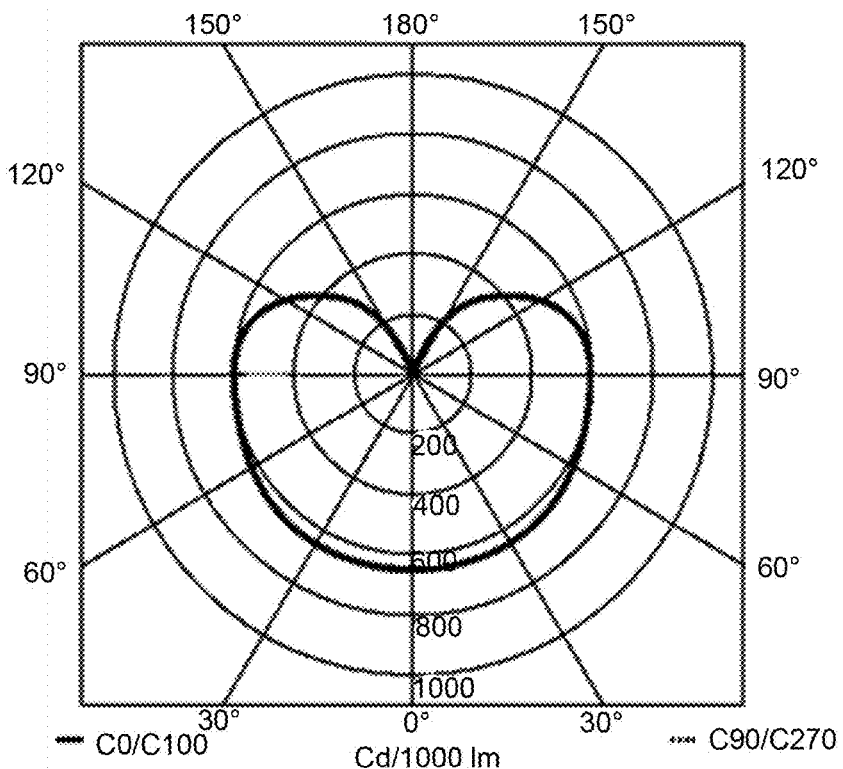
FIG. 43 shows examples of luminous intensity distribution curves emitted by a directional line light source according to an embodiment of the present invention.
Figure 43:
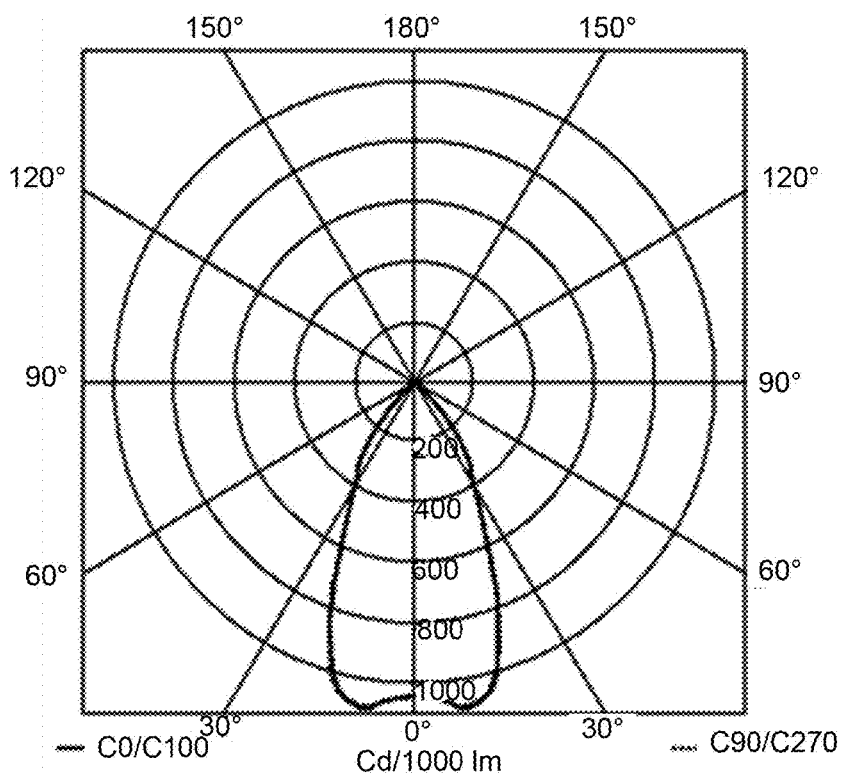

In another preferred embodiment, the laser-based fiber-coupled wide-spectrum light source of the present disclosure is configured with a leaky fiber in an architectural lighting component or system to provide a line source of wide-spectrum light. In some embodiments, the leaky fiber emitting wide-spectrum light as a line source is configured to emit wide-spectrum light in a uniform pattern around the radial axis of the fiber. In other embodiments, the leaky fiber emitting wide-spectrum light as a line source is configured with an optional optical element to emit wide-spectrum light in a directional pattern from a predetermined portion of the radial axis. The optical fiber, along with the optional optic element, will be referred to as a 'directional line source'. In one embodiment, the optical fiber is equipped with light extraction features that extract light along the length of the fiber. Optionally, the light extraction features are designed according to one of these two ways, or a combination of the two:

1. To extract light in a radially non-symmetric pattern
2. To extract light in a radially symmetric pattern, and an external optic element is configured outside or is attached to the fiber, such that the fiber and optic element together produce a radially non-symmetric pattern FIG. 43 presents examples of luminous intensity distribution curves by an optical fiber with optional external optical element according to some embodiments of the present disclosure. The optical fiber can be modified to achieve such a directional/non-radial-uniform or asymmetric mission pattern in various ways. In some examples, the optical fiber can be shaped or roughened. In other examples, the optical fiber cladding can be selectively removed or patterned to preferentially emit light from a pre-determined surface or side of the fiber. In other examples, the optical fiber can be embedded with particles, voids, or other objects to induce a selective scattering.

In all of the side pumped and transmissive and reflective embodiments of this invention the additional features and designs can be included. For example, shaping of the excitation laser beam for optimizing the beam spot characteristics on the phosphor can be achieved by careful design considerations of the laser beam incident angle to the phosphor or with using integrated optics such as free space optics like collimating lens. Safety features can be included such as passive features like physical design considerations and beam dumps and/or active features such as photodetectors or thermistors that can be used in a closed loop to turn the laser off when a signal is indicated. Moreover, optical elements can be included to manipulate the generated wide-spectrum light. In some embodiments, reflectors such as parabolic reflectors or lenses such as collimating lenses are used to collimate the wide-spectrum light or create a spot light that could be applicable in an automobile headlight, flashlight, spotlight, or other lights.

In one embodiment, the present invention provides a laser-based fiber-coupled wide-spectrum light system. The system has a pre-packaged laser-based wide-spectrum light module mounted on a support member and at least one gallium and nitrogen containing laser diode devices integrated with a phosphor material on the support member. The laser diode device, driven by a driver, is capable of providing an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In a preferred embodiment the phosphor material can provide a yellowish phosphor emission in the 560 nm to 580 nm range such that when mixed with the blue emission of the laser diode a wide-spectrum light is produced. In other embodiments, phosphors with red, green, yellow, and even blue colored emission can be used in combination with the laser diode excitation source to produce a wide-spectrum light emission with color mixing in different brightness. The laser-based wide-spectrum light module is configured a free space with a non-guided laser beam characteristic transmitting the emission of the laser beam from the laser diode device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In other embodiments free space optics such as collimating lenses can be used to shape the beam prior to incidence on the phosphor. The beam can be characterized by a polarization purity of greater than 60% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 10 W. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The wide-spectrum light apparatus also has an electrical input interface configured to couple electrical input power to the laser diode device to generate the laser beam and excite the phosphor material. The wide-spectrum light source configured to produce a luminous flux of greater than 1 lumen, 10 lumens, 100 lumens, 250 lumens, 500 lumens, 1000 lumens, 3000 lumens, or 10000 lumens. The support member is configured to transport thermal energy from the at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

In one embodiment, a laser driver is provided in the pre-packaged laser-based wide-spectrum light module. Among other things, the laser driver is adapted to adjust the amount of power to be provided to the laser diode. For example, the laser driver generates a drive current based one or more pixels from the one or more signals such as frames of images, the drive currents being adapted to drive a laser diode. In a specific embodiment, the laser driver is configured to generate pulse-modulated signal at a frequency range of about 50 to 300 MHz. The driver may provide temporal modulation for applications related to communication such as LiFi free-space light communication, and/or data communications using optic fiber. Alternatively, the driver may provide temporal modulation for applications related to LiDAR remote sensing to measure distance, generate 3D images, or other enhanced 2D imaging techniques.

In certain embodiments, the pre-packaged laser-based wide-spectrum light module includes an electrostatic discharge (ESD) protection element. For example, an ESD protection element would be used to protect the wide-spectrum light module from damage that could occur with a sudden flow of current resulting from a build-up of charge. In one example, a transient voltage suppression (TVS) element is employed. In one example, a temperature sensor such as a thermistor is disposed for monitor laser device temperature. In one example, one or more photodetectors are installed for monitor optical power for safely alarming.

In certain embodiments, the pre-packaged laser-based wide-spectrum light module comprises a heat sink thermally coupled to the common support member. In one example the heat sink has fins or a measure for increased surface area.

In certain embodiments, the pre-packaged laser-based wide-spectrum light module comprises a heat spreader coupled between the common support member and the heat sink.

In certain embodiments, the pre-packaged laser-based wide-spectrum light module comprises an optical coupler coupled with one or more optical fibers.

In certain embodiments of the pre-packaged laser-based wide-spectrum light module, the laser beam emitted from the laser device therein is geometrically configured to optimize an interaction with a phosphor material.

In certain embodiments of the pre-packaged laser-based wide-spectrum light module, a package is hermetically sealed.

In certain embodiments of the pre-packaged laser-based wide-spectrum light module, the package comprises one selected from a flat package(s), surface mount packages such as SMDs, TO9 Can, TO56 Can, TO-5 can, TO-46 can, CS-Mount, G-Mount, C-Mount, micro-channel cooled package(s), and others.

In certain embodiments of the pre-packaged laser-based wide-spectrum light module, the emitted wide-spectrum light is collimated using a lens.

In certain embodiments of the laser-based fiber-coupled wide-spectrum light module, the light guide device is coupled to the pre-packaged wide-spectrum light module via a collimation lens to capture the wide-spectrum light emission in a FWHM cone angle of at least 120 degrees with 20%, 40%, 60%, or 80% coupling efficiency.

In certain embodiments of the laser-based fiber-coupled wide-spectrum light module, the light guide device includes an optical fiber of an arbitrary length, including a single mode fiber (SMF) or a multi-mode fiber (MMF), with core diameters ranging from about 1 µm to 10 µm, about 10 µm to 50 µm, about 50 µm to 150 µm, about 150 µm to 500 µm, about 500 µm to 1 mm, or greater than 1 mm. The optical fiber is aligned with a collimation optics member to receive the collimated wide-spectrum light emission with a numerical aperture about 0.05 to 0.7 in a cone angle ranging from 5 deg to 50 deg.

In certain embodiments of the laser-based fiber-coupled wide-spectrum light module, the light guide device includes a leaky fiber of a certain length for distributing side-scattered light through the length.

In certain embodiments of the laser-based fiber-coupled wide-spectrum light module, the light guide device includes a lensed fiber of a certain length, the lensed fiber being directly coupled with the pre-packaged wide-spectrum light module without extra collimation lens.

In certain embodiments of the laser-based fiber-coupled wide-spectrum light module, the light guide device includes a planar light guide formed on glass, semiconductor wafer, or other flat panel substrate.

In a specific embodiment, the present invention provides a laser-based fiber-delivered wide-spectrum light source. The laser-based wide-spectrum light source includes at least one gallium and nitrogen containing laser diode and a wavelength conversion member such as a phosphor. The laser generates a first wavelength in the range of 385 nm to 495 nm and wavelength conversion member generates a second wavelength that is longer than the first wavelength. The laser beam emission generates a spot on the phosphor member to induce a phosphor-excited emission which comprises emission with a mix of the first wavelength and the second wavelength to produce a wide-spectrum light emission. The wide-spectrum light emission from the phosphor member comprises and emission pattern such as a Lambertian emission pattern.

In one embodiment, the wide-spectrum light emission from the laser-based wide-spectrum light source is directly coupled into a first end of an optical fiber member. The optical fiber member may be comprised of glass fiber, a plastic optical fiber (POF), a hollow fiber, or an alternative type of multi-mode or single mode fiber member or light guide member. The first end of the fiber may be comprised of a flat surface or could be comprised of a shaped or lensed surface to improve the input coupling efficiency of the wide-spectrum light into the fiber. The first end of the fiber member may be coated with an anti-reflective coating or a reflection modification coating to increase the coupling efficiency of the wide-spectrum light into the fiber member. The fiber or light guide member controls the light based on step index or gradual index changes in the light guide, refractive diffractive sections or elements, holographic sections or elements, polarization sensitive sections or elements, and/or reflective sections or elements. The fiber or light guide is characterized by a core light guide diameter and a numerical aperture (NA). The diameter ranges from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%. The fiber may transport the light to the end, or directional side scattering fiber to provide preferential illumination in a particular angle, or both. The fiber may include a coating or doping or phosphor integrated inside or on a surface to modify color of emission through or from fiber. The fiber may be a detachable fiber and may include a connector such as an SMA, FC and/or alternative optical connectors. The fiber may include a moveable tip mechanism on the entry or exit portion for scanning fiber input or output, where the fiber tip is moved to generate changes in the in coupling amount or color or other properties of the light, or on the output side, to produce a motion of light, or when time averaged, to generate a pattern of light. The leaky fiber could be a bundled leaky fiber. For example, the leak fiber could be a bundle of 3 or more, or 19 or more fibers with diameters in the 20 µm to 200 µm range with a total core diameter of 0.4 mm to 4 mm. The bundled fibers could be comprised from glass fibers or plastic fibers.

In a preferred embodiment, the wide-spectrum light emission from the laser-based wide-spectrum light source is directed through a collimating lens to reduce the divergence of the wide-spectrum light. For example, the divergence could be reduced from 180 degrees full angle or 120 degrees full width half maximum, as collected from the Lambertian emission to less than 12 degrees, less than 5 degrees, less than 2 degrees, or less than 1 degree. The lenses may include reflective surfaces, step index or gradual gradient index changes in the material, refractive sections or elements, diffractive sections or elements, holographic sections or elements, polarization sensitive sections or elements, and/or reflective sections or elements including total internal reflective elements. The lens may include combination of diffractive lensing and or reflection sections, such as a total internal reflection (TIR) optic. Lens diameter ranges from 1 um to 10 µm, 10 µm to 100 µm, 100 µm to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%.

The first end of the fiber may be comprised of a flat surface or could be comprised of a shaped or lensed surface to improve the input coupling efficiency of the wide-spectrum light into the fiber. The first end of the fiber member may be coated with an anti-reflective coating or a reflection modification coating to increase the coupling efficiency of the wide-spectrum light into the fiber member. The optical fiber member may be comprised of glass fiber, a plastic optical fiber (POF), or an alternative type of fiber member. The first end of the fiber may be comprised of a flat surface or could be comprised of a shaped or lensed surface to improve the input coupling efficiency of the wide-spectrum light into the fiber. The fiber is characterized by a core light guide diameter and a numerical aperture (NA). The diameter ranges from 1 µm to 10 µm, 10 µm to 100 µm, 100 µm to 1 mm, 1 mm to 10 mm, or 10 mm to 100 mm. The NA could range from 0.05 to 0.1, 0.1 to 0.2, 0.2 to 0.3, and 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%. The fiber may transport the light to the end, or directional side scattering fiber to provide preferential illumination in a particular angle, or both. The fiber may include a coating or doping or phosphor integrated inside or on a surface to modify color of emission through or from fiber. The fiber may be a detachable fiber and may include a connector such as an SMA, FC and/or alternative optical connectors. The fiber may include a moveable tip mechanism on the entry or exit portion for scanning fiber input or output, where the fiber tip is moved to generate changes in the in coupling amount or color or other properties of the light, or on the output side, to produce a motion of light, or when time averaged, to generate a pattern of light.

Additionally, a beam shaping optic can be included to shape the beam of wide-spectrum light into a predetermined pattern. In one example, the beam is shaped into the required pattern for an automotive standard high beam shape or low beam shape. The beam shaping element may be a lens or combination of lenses. The lens may include reflective surfaces, step index or gradual gradient index changes in the material, refractive sections or elements, diffractive sections or elements, holographic sections or elements, polarization sensitive sections or elements, and/or reflective sections or elements including total internal reflective elements. The lens may include combination of diffractive lensing and or reflection sections, such as a total internal reflection optic, e.g., TIR optic. A beam shaping diffusers may also be used, such as a holographic diffuser. Lens and or diffuser diameter ranges from 1 µm to 10 µm, 10 µm to 100 µm, 100 µm to 1 mm, 1 mm to 10 mm, or 10 mm to 100 mm. Lens shape may be non-circular, such as rectangular or oval or with an alternative shape, with one of the dimensions being from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%. The leaky fiber could be a bundled leaky fiber. For example, the leak fiber could be a bundle of 3 or more, or 19 or more fibers with diameters in the 20 µm to 200 µm range with a total core diameter of 0.4 mm to 4 mm. The bundled fibers could be comprised from glass fibers or plastic fibers.

In another embodiment, the optical fiber member is intentionally designed to be leaky such that the wide-spectrum light exits the fiber along its axis to produce a distributed wide-spectrum light source. The fiber design can include air bubbles, voids, composite materials, or other designs to introduce perturbations in the index of refraction along the axis of the light guide to promote scattering of the wide-spectrum light.

In yet another preferred embodiment, the fiber can be designed allow light to leak out of the core light guide region and into the cladding region. In some embodiments, the leaky fiber is designed to leak the wide-spectrum light from only certain directions from the fibers circumference. For example, the fiber may directionally leak and emit light from 180 degrees of the fibers 360 degrees circumference. In other examples, the fiber may leak and emit light from 90 degrees of the fibers 360 degrees circumference.

The leaky fiber embodiment of the fiber coupled wide-spectrum light invention described can fine use in many applications. One such example application using the leaky fiber as distributed light source included as day time running lights in an automobile headlight module. Additionally, the distributed light sources could be used in automotive interior lighting and tail lighting. In another application the source is used as distributed lighting for tunnels, streets, underwater lighting, office and residential lighting, industrial lighting, and other types of lighting. In another application the leaky fiber could be included in a light bulb as a filament. The leaky fiber could be a bundled leaky fiber. For example, the leak fiber could be single or a bundle of 2 or more, or 19 or more fibers with diameters in the 20 µm to 200 µm range with a total core diameter of 0.4 mm to 4 mm. The fiber or bundled fibers could be made of glass fibers or plastic.

Optionally, the light source may be configured with a single fiber output with collimating optic and beam pattern generator. Optionally, the light source may be configured with multiple fiber outputs, each with collimating optic and beam pattern generator. Optionally, multiple light sources may be configured to single fiber output with collimating optic and beam pattern generator. Optionally, multiple light sources may be configured to multiple fiber bundle output with collimating optic and beam pattern generator. Optionally, multiple light sources may be configured to multiple fiber bundle output, each with collimating optic and beam pattern generator. Optionally, multiple light sources with different color properties may be configured to one or more fibers to generate different color properties of emission.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A laser-based fiber-coupled wide-spectrum light system comprising:
   a wide-spectrum light source module located at a source position, comprising:
      a plurality of laser devices each comprising a gallium and nitrogen containing material and configured as an excitation source, each of the laser devices comprising an output facet configured to output a laser electromagnetic radiation with a first wavelength ranging from 385 nm to 495 nm;
      a plurality of phosphor members each corresponding to one of the plurality of laser devices, each of the phosphor members configured as a wavelength converter and an emitter and disposed to allow a primary surface to receive the laser electromagnetic radiation from the corresponding one of the plurality of laser devices;
      an angle of incidence configured between the laser electromagnetic radiation from each of the laser devices and the primary surface of the corresponding one of the plurality of phosphor members, each of the phosphor members configured to convert at least a fraction of the laser electromagnetic radiation with the first wavelength to a phosphor emission with a second wavelength that is longer than the first wavelength;
      a light-emission mode characterizing the plurality of phosphor members with a plurality of wide-spectrum emissions each generated from at least an interaction of the laser electromagnetic radiation from one of the plurality of laser devices with the phosphor emission from the corresponding one of the plurality of phosphor members, the plurality of wide-spectrum emissions each comprising of a mixture of wavelengths characterized by at least the second wavelength;
   an optics member comprising a collimating optics member and a focusing optics member, the optics member configured to receive the plurality of wide-spectrum emissions and focus each of the wide-spectrum emissions, wherein adjacent ones of the plurality of wide-spectrum emissions overlap spatially in the collimating optics member and in the focusing optics member; and
   multiple fibers each configured to have a first end to couple with one of the plurality of wide-spectrum emissions focused by the optics member and to output the respective wide-spectrum emission to a second end.

2. The laser-based fiber-coupled wide-spectrum light system of claim 1, wherein the wide-spectrum light source module comprises a surface-mount device (SMD) type package.

3. The laser-based fiber-coupled wide-spectrum light system of claim 1, wherein the wide-spectrum light source module comprises a package selected from a flat package, TO9 Can, TO56 Can, TO-5 can, TO-46 can, CS-Mount, G-Mount, C-Mount, and micro-channel cooled package.

4. The laser-based fiber-coupled wide-spectrum light system of claim 1, wherein the wide-spectrum light source module is configured to generate the plurality of wide-spectrum emissions each having a luminous flux of about 100 lumens or greater.

5. The laser-based fiber-coupled wide-spectrum light system of claim 1, wherein the multiple fibers comprise a glass fiber or a plastic fiber with core diameter of about 100 um to about 2 mm or greater, and wherein the fiber core can be configured from a solid core fiber, a fiber bundle core, or a combination of solid core and fiber bundle type fibers.

6. The laser-based fiber-coupled wide-spectrum light system of claim 1, wherein the multiple fibers comprise leaky fibers coupled to respective second ends of the multiple fibers to deliver the wide-spectrum emissions.

* * * * *